US009825231B2

(12) United States Patent
Kim et al.

(10) Patent No.: US 9,825,231 B2
(45) Date of Patent: Nov. 21, 2017

(54) CONDENSED CYCLIC COMPOUND AND ORGANIC LIGHT-EMITTING DEVICE INCLUDING THE SAME

(71) Applicant: SAMSUNG DISPLAY CO., LTD., Yongin, Gyeonggi-Do (KR)

(72) Inventors: Kwang-Hyun Kim, Yongin (KR); Seok-Hwan Hwang, Yongin (KR); Young-Kook Kim, Yongin (KR); Jun-Ha Park, Yongin (KR); Hye-Jin Jung, Yongin (KR); Eun-Young Lee, Yongin (KR); Jong-Woo Kim, Yongin (KR); Jin-O Lim, Yongin (KR); Sang-Hyun Han, Yongin (KR); Eun-Jae Jeong, Yongin (KR); Soo-Yon Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 470 days.

(21) Appl. No.: 14/294,376

(22) Filed: Jun. 3, 2014

(65) Prior Publication Data

US 2015/0069347 A1 Mar. 12, 2015

(30) Foreign Application Priority Data

Sep. 6, 2013 (KR) ........................ 10-2013-0107509

(51) Int. Cl.
*H01L 51/50* (2006.01)
*H01L 51/00* (2006.01)

(52) U.S. Cl.
CPC ...... *H01L 51/0054* (2013.01); *H01L 51/0058* (2013.01); *H01L 51/0067* (2013.01);
(Continued)

(58) Field of Classification Search
None
See application file for complete search history.

(56) References Cited

U.S. PATENT DOCUMENTS 5,645,948 A 7/1997 Shi et al.
6,465,115 B2 10/2002 Shi et al.
(Continued)

FOREIGN PATENT DOCUMENTS

JP 10-017860 A 1/1998
JP 11-087067 A 3/1999
(Continued)

OTHER PUBLICATIONS

Chihaya Adachi, et al. "Confinement of charge carriers and molecular excitons within 5-nm-thick emitter layer in organic electroluminescent devices with a double heterostructure", Appl Phys. Lett. 57, 531 1990.

(Continued)

*Primary Examiner* — Gregory Clark
(74) *Attorney, Agent, or Firm* — Lee & Morse, P.C.

(57) ABSTRACT

A condensed cyclic compound and an organic light—emitting device including the same, the condensed cyclic compound being represented by Formula 1:
(Continued)

<Formula 1>

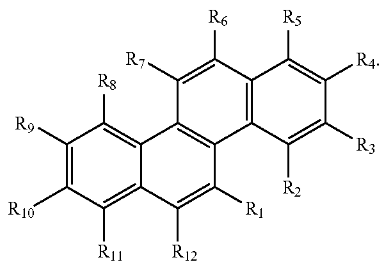

20 Claims, 1 Drawing Sheet

(52) U.S. Cl.
CPC ...... *H01L 51/0072* (2013.01); *H01L 51/0073* (2013.01); *H01L 51/0074* (2013.01); *H01L 51/5072* (2013.01)

(56) References Cited

U.S. PATENT DOCUMENTS

| | | | | |
|---|---|---|---|---|
| 6,596,415 | B2 | 7/2003 | Shi et al. | |
| 2003/0165715 | A1 | 9/2003 | Yoon et al. | |
| 2005/0221124 | A1* | 10/2005 | Hwang | C07F 9/5728 428/690 |
| 2010/0320451 | A1 | 12/2010 | Kawamura | |
| 2011/0227053 | A1* | 9/2011 | Bae | C07C 15/38 257/40 |
| 2012/0256172 | A1 | 10/2012 | Ito et al. | |

FOREIGN PATENT DOCUMENTS

| | | | |
|---|---|---|---|
| JP | 2010-195708 | A | 9/2010 |
| KR | 10-0691543 | B1 | 3/2007 |
| KR | 10-2010-0056398 | A | 5/2010 |
| KR | 10-2010-0088612 | A | 8/2010 |
| KR | 10-2012-0051598 | A | 5/2012 |
| KR | 10-2012-0065214 | A | 6/2012 |
| KR | 10-2012-0104087 | A | 9/2012 |

OTHER PUBLICATIONS

Youichi Sakamoto, et al., “Synthesis, Characterization, and Electron-Transport Property of Perfluorinated Phenylene Dendrimers”, J. Am. Chem. Soc. 2000, 122, 1832-1833.

Shigehiro Yamaguchi, et al., “Diphenylamino-Substituted 2,5-Diarylsiloles for Single-Layer Organic Electroluminescent Devices”,Chemistry Letters 2001, p. 98-99.

Nicholas Johansson, et al., “Solid-State Amplified Spontaneous Emission in Some Spiro-Type Molecules: A New Concept for the Design of Solid-State Lasing Moleculdes”, Advanced Materials, Communications, Mar. 6, 1998.

Y.T. Tao, et al.; “Sharp green electroluminescence from 1H-pyrazolo[3,4-b]quinolone-based light-emitting diodes”; Appl. Phys. Lett. 77,1575, 2000.

C.W. Tang, et al.; “Organic electroluminescent diodes”, Appl. Phys. Lett 51, 913 (1987).

* cited by examiner

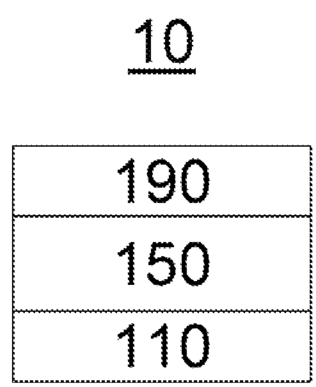
10
190
150
110

CONDENSED CYCLIC COMPOUND AND ORGANIC LIGHT-EMITTING DEVICE INCLUDING THE SAME

CROSS-REFERENCE TO RELATED APPLICATION

Korean Patent Application No. 10-2013-0107509, filed on Sep. 6, 2013, in the Korean Intellectual Property Office, and entitled: "Condensed Cyclic Compound and Organic Light-Emitting Device Including The Same," is incorporated by reference herein in its entirety.

BACKGROUND

1. Field

Embodiments relate to a condensed cyclic compound and an organic light-emitting device including the same.

2. Description of the Related Art

Organic light emitting devices are self-emission devices that have wide viewing angles, a high contrast ratio, short response times, and excellent brighter, driving voltage, and response speed characteristics, and produce full-color images.

An organic light-emitting device may include a first electrode on a substrate, and a hole transport region, an emission layer, an electron transport region, and a second electrode, which may be sequentially disposed on the first electrode. Holes provided from the first electrode may move toward the emission layer through the hole transport region, and electrons provided from the second electrode may move toward the emission layer through the electron transport region. Carriers, e.g., holes and electrons, may be recombined in the emission layer to produce excitons. These excitons may change from an excited state to a ground state, thereby generating light.

SUMMARY

Embodiments are directed to a condensed cyclic compound and an organic light-emitting device including the same.

One or more embodiments related to a condensed cyclic compound and an organ light-emitting device including the same.

An embodiment provides a condensed cyclic compound represented by Formula 1:

<Formula 1>

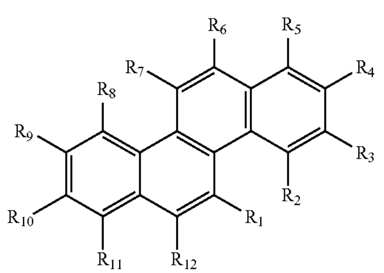

-continued

<Formula 2>

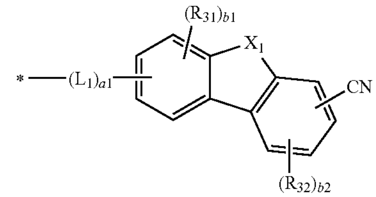

wherein Formulae 1 and 2, $X_1$ is $N(R_{21})$, O, or S;

$L_1$ is selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, a substituted or unsubstituted $C_2$-$C_{60}$ heteroarylene group, a substituted or unsubstituted divalent non-aromatic condensed polycyclic group, and a substituted or unsubstituted divalent non-aromatic hetero-condensed polycyclic group;

a1 is selected from 0, 1, 2, and 3;

$R_1$ to $R_{12}$ are each independently selected from a group represented by Formula 2, a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic hetero-condensed polycyclic group (here, the group of Formula 2 is excluded or different from "the substituted monovalent non-aromatic hetero-condensed polycyclic group"), —$N(Q_1)(Q_2)$, —$Si(Q_3)(Q_4)(Q_5)$, and —$B(Q_6)(Q_7)$;

at least one of $R_1$ to $R_{12}$ is represented by Formula 2 above;

b1 and b2 are each independently selected from 0, 1, 2, and 3;

at least one substituent of the substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted divalent non-aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_2$-$C_{60}$ heteroaryl group, the substituted monovalent non-aromatic condensed polycyclic group, and the substituted monovalent non-aromatic hetero-condensed polycyclic group may be selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group,—$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocyclocalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic hetero-condensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocyclocalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$; and $R_{21}$, $R_{31}$, $R_{32}$, $Q_1$ to $Q_7$, $Q_{11}$ to $Q_{17}$, $Q_{21}$ to $Q_{27}$, and $Q_{31}$ to $Q_{37}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_2$-$C_{60}$ heteroaryl group, a monovalent non-aromatic condensed polycyclic group, a monovalent non-aromatic hetero-condensed polycyclic group.

Another embodiment provides an organic light-emitting device including: a first electrode; a second electrode facing the first electrode; and an organic layer that is disposed between the first and second electrodes and includes an emission layer, wherein the organic layer includes at least one condensed cyclic compound described above.

BRIEF DESCRIPTION OF THE DRAWING

Features will be apparent to those of skill in the art by describing in detail exemplary embodiments with reference to the attached drawing in which:

FIG. 1 illustrates a schematic view of a structure of an organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Expressions such as "at least one of," when preceding a list of elements, modify the entire list of elements and do not modify the individual elements of the list.

A condensed cyclic compound according to an embodiment may be represented by Formula 1 below. At least one of $R_1$ to $R_{12}$ in Formula 1 may be a group represented by Formula 2 below.

<Formula 1>

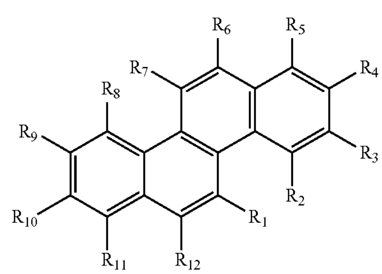

<Formula 2>

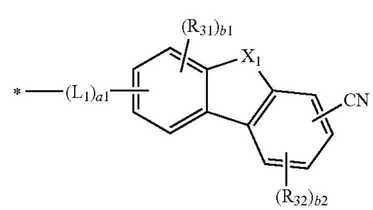

In Formulae 1 and 2, $X_1$ may be $N(R_{21})$, O, or S. $R_{21}$ may be understood by referring to a detailed description thereof provided below. * may represent a binding site, e.g., to Formula 1.

According to an embodiment, each $L_1$ in Formula 2 may be independently selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenyene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenyylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indazenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenyylene group, a benzocarbazolylene group, a dibenzocarbazolylene group, a thiadiazolylene group, an imidazopyridinylene group, and an imidazopyrimidinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a cyclopentyl group a cyclohexyl group, a cyclopeptyl group, a cyclopentanyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group a dibenzothiophenyl group, a benzocarbazolyl group, a dibenzocarbazolyl group, a thiadiazolyl group, an imidazolpyridinyl group, and an imidazopyrimidinyl group, but is not limited thereto.

According to another embodiment, each $L_1$ in Formula 2 may be independently represented by one of Formulae 3-1 to 3-32 below, in which * and *' represent binding sites.

Formula 3-1

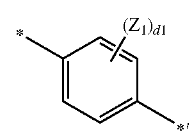

Formula 3-2

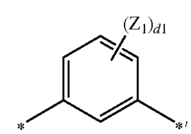

Formula 3-3

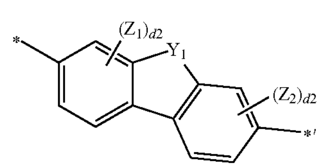

Formula 3-4

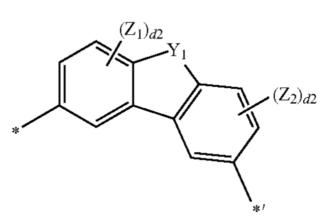

-continued
Formula 3-5
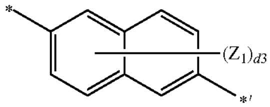
Formula 3-6
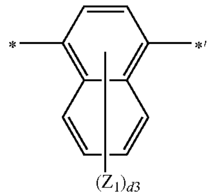
Formula 3-7
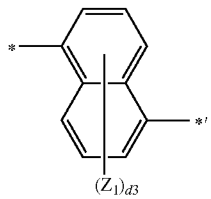
Formula 3-8
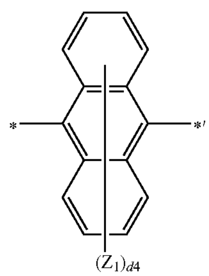
Formula 3-9
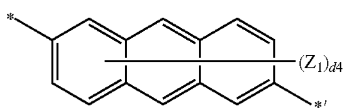
Formula 3-10
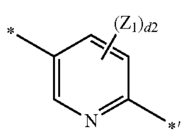
Formula 3-11
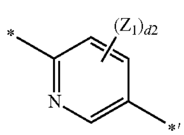
Formula 3-12
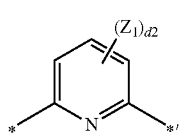
Formula 3-13
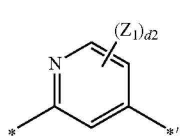
-continued
Formula 3-14
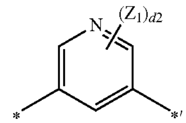
Formula 3-15
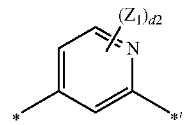
Formula 3-16
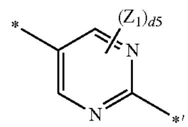
Formula 3-17
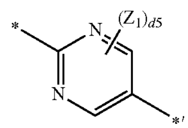
Formula 3-18
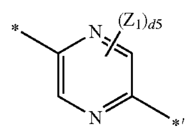
Formula 3-19
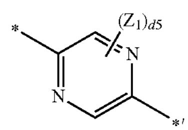
Formula 3-20
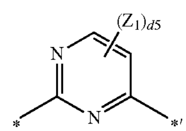
Formula 3-21
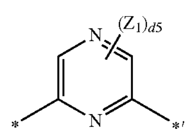
Formula 3-22
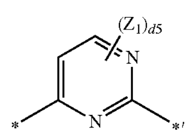
Formula 3-23
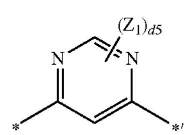
Formula 3-24
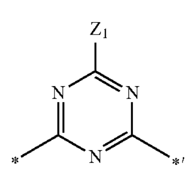

-continued

Formula 3-25

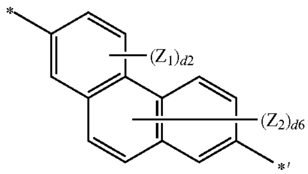

Formula 3-26

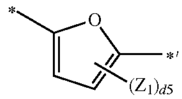

Formula 3-27

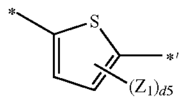

Formula 3-28

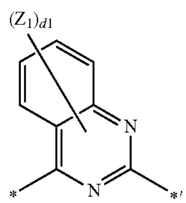

Formula 3-29

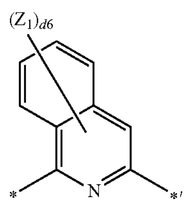

Formula 3-30

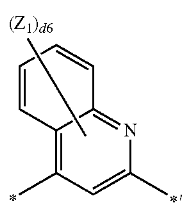

Formula 3-31

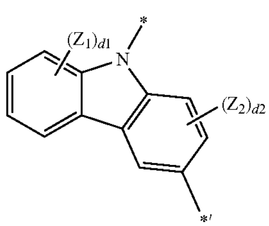

Formula 3-32

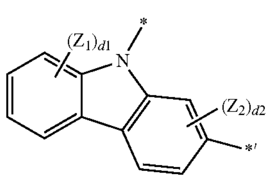

In Formulae 3-1 to 3-32, $Y_1$ may be O, S, $C(Z_3)(Z_4)$, $N(Z_5)$, or $Si(Z_6)(Z_7)$;

$Z_1$ to $Z_7$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

d1 may be selected from an integer of 1 to 4;

d2 may be selected from an integer of 1 to 3;

d3 may be selected from an integer of 1 to 6;

d4 may be selected from an integer of 1 to 8;

d5 may be selected from 1 or 2; and d6 may be selected from an integer of 1 to 5.

According to another embodiment, each $L_1$ in Formula 2 may be independently represented by one of Formulae 4-1 to 4-23 below, in which * and *' represent binding sites.

Formula 4-1

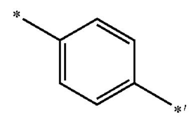

Formula 4-2

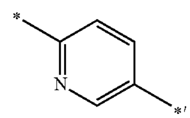

Formula 4-3

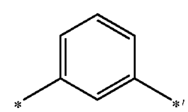

Formula 4-4

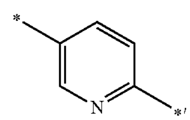

Formula 4-5

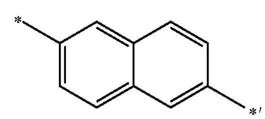

Formula 4-6

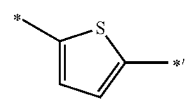

Formula 4-7

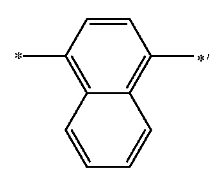

Formula 4-8

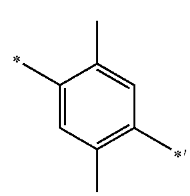

Formula 4-9

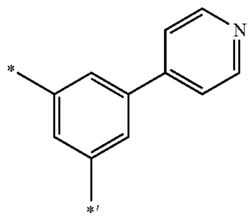

Formula 4-10

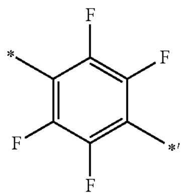

Formula 4-11

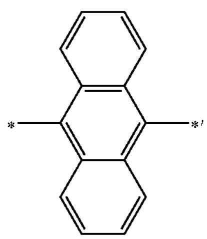

Formula 4-12

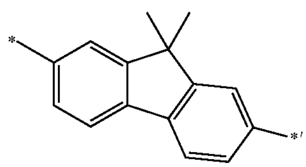

Formula 4-13

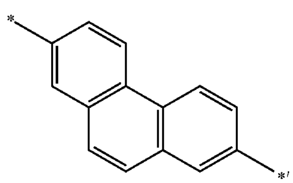

Formula 4-14

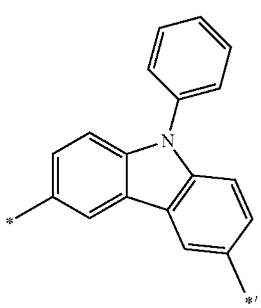

Formula 4-15

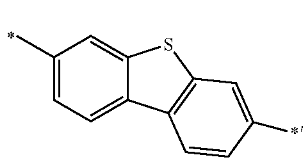

Formula 4-16

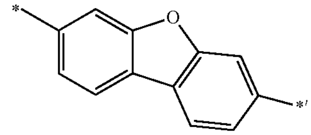

Formula 4-17

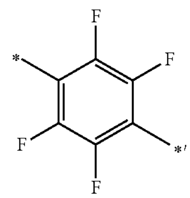

Formula 4-18

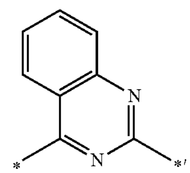

Formula 4-19

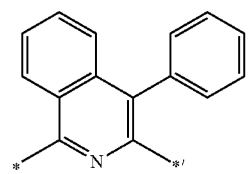

Formula 4-20

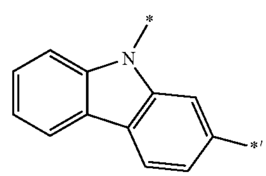

Formula 4-21

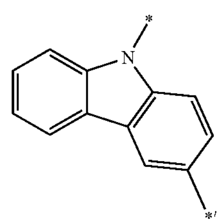

Formula 4-22

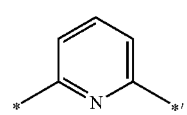

Formula 4-23

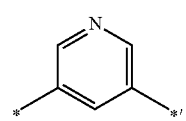

a1 in Formula 1 may be selected from 0, 1, 2, and 3. For example, a1 in Formula 1 may be 0 or 1. When a1 in Formula 1 is 0, $-(L_1)_{a1}$ is a single bond. When a1 is 2 or more, a plurality of $L_1$s may be identical to or different from each other.

According to another embodiment, $X_1$ may be $N(R_{21})$, and $R_{21}$ may be selected from:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group a dibenzothiophenyl group, a benzocarbazolyl group, a dibenzocarbazolyl group, a thiadiazolyl group, an imidazolpyridinyl group, and an imidazopyrimidinyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group a dibenzothiophenyl group, a benzocarbazolyl group, a dibenzocarbazolyl group, a thiadiazolyl group, an imidazolpyridinyl group, and an imidazopyrimidinyl group, each substituted with at least one selected from a deuterium, -F, -Cl, -Br, -I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a cyclopentyl group a cyclohexyl group, a cyclopeptyl group, a cyclopentanyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group a dibenzothiophenyl group, a benzocarbazolyl group, a dibenzocarbazolyl group, a thiadiazolyl group, an imidazolpyridinyl group, and an imidazopyrimidinyl group, but is not limited thereto.

According to another embodiment, $X_1$ may be $N(R_{21})$, and $R_{21}$ may be selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, -F, -Cl, -Br, -I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

According to another embodiment, $R_1$ to $R_6$ in Formulae 1 and 2 may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

In an implementation, $R_1$ to $R_{12}$ in Formula 1 may each be each independently selected from:

a group represented by Formula 2, a hydrogen a deuterium, —F, —Cl, —Br, —I, a a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and $Si(Q_3)(Q_4)(Q_5)$ (in which, $Q_3$ to $Q_5$ are each independently selected from a $C_1$-$C_{20}$ alkyl group, a $C_1$-$C_{20}$ alkoxy group, a phenyl group, and a naphthyl group); and at least one of $R_1$ to $R_{12}$ may be a group represented by Formula 2.

According to another embodiment, $R_{12}$ in Formula 1 may be a group represented by Formula 2, but is not limited thereto.

In an implementation, regarding Formulae 1 and 2, $R_{21}$ may be selected from Formulae 5-1 to 5-35 below, in which * represents a binding site;

$R_1$ to $R_{12}$ may be each independently selected from a group represented by Formula 2, a hydrogen, deuterium, -F, -Cl, -Br, -I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, and a group represented by Formulae 5-1 to 5-35 below, in which at least one of $R_1$ to $R_{12}$ may be represented by Formula 2.

$R_{31}$ and $R_{32}$ may be each independently selected from a hydrogen, a deuterium, -F, -Cl, -Br, -I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, and a group represented by Formula 5-1 to 5-35 below, but are not limited thereto.

Formula 5-1

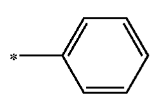

Formula 5-2

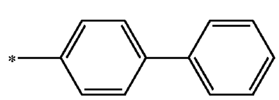

Formula 5-3

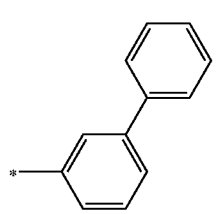

-continued

Formula 5-4

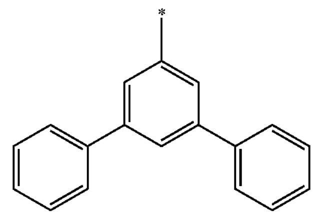

Formula 5-5

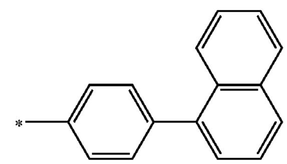

Formula 5-6

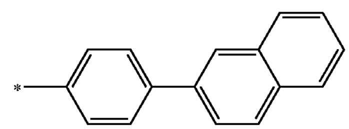

Formula 5-7

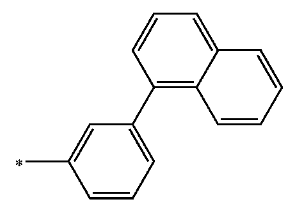

Formula 5-8

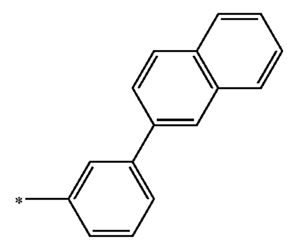

Formula 5-9

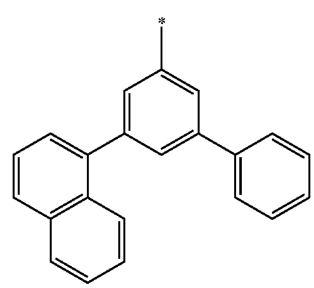

Formula 5-10

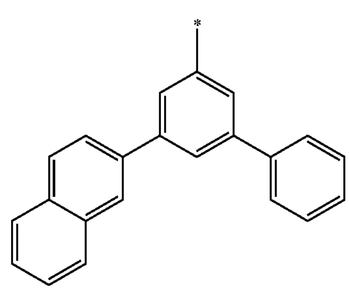

-continued
Formula 5-11
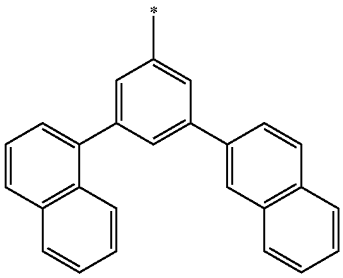
Formula 5-12
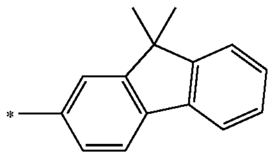
Formula 5-13
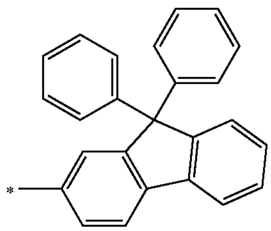
Formula 5-14
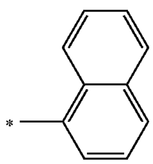
Formula 5-15
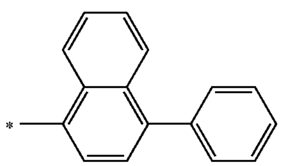
Formula 5-16
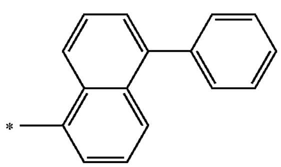
Formula 5-17
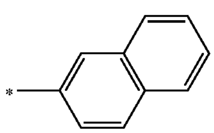
Formula 5-18
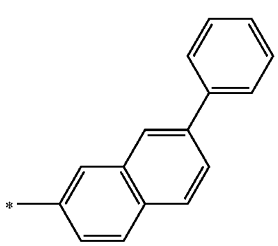
-continued
Formula 5-19
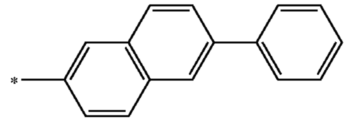
Formula 5-20
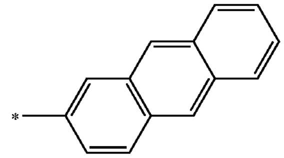
Formula 5-21
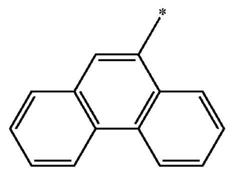
Formula 5-22
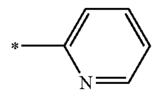
Formula 5-23
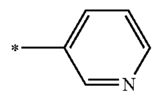
Formula 5-24
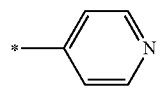
Formula 5-25
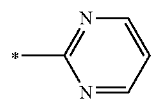
Formula 5-26
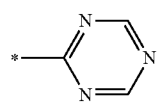
Formula 5-27
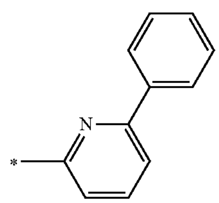
Formula 5-28
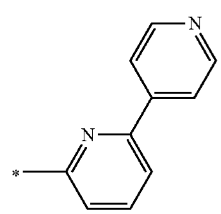
Formula 5-29
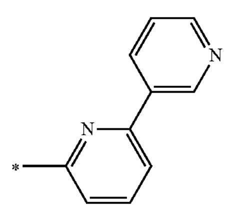

-continued

Formula 5-30

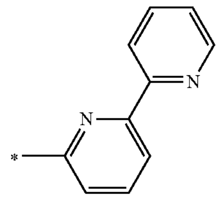

Formula 5-31

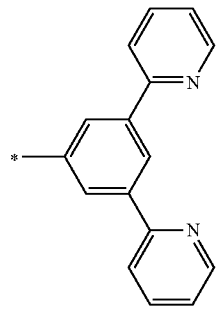

Formula 5-32

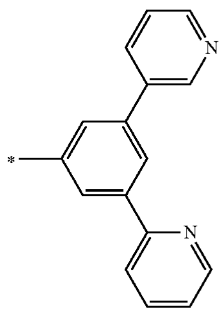

Formula 5-33

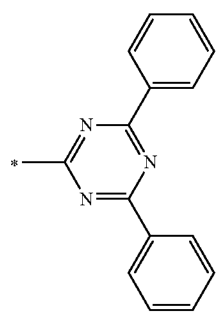

Formula 5-34

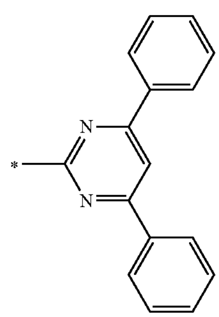

Formula 5-35

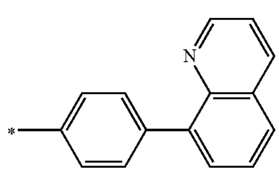

In an implementation, b1 in Formulae 1 and 2 may be selected from 0, 1, 2, and 3. For example, b1 may be 0, 1, or 2. when b1 is 2 or more, a plurality of $R_{31}$s may be identical to or different from each other. b2 may be understood by referring to the description provided in connection with b1. For example, b2 may be defined the same was as b1.

In an implementation, the condensed cyclic compound represented by Formula 1 may be represented by one of Formulae 1-1 to 1-12 below.

<Formula 1-1>

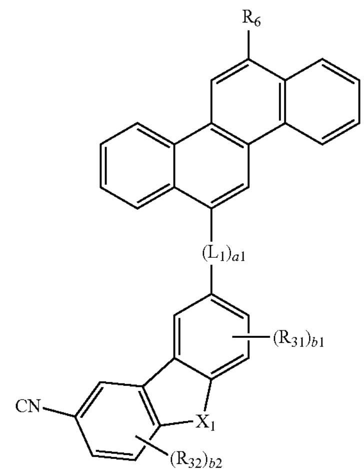

<Formula 1-2>

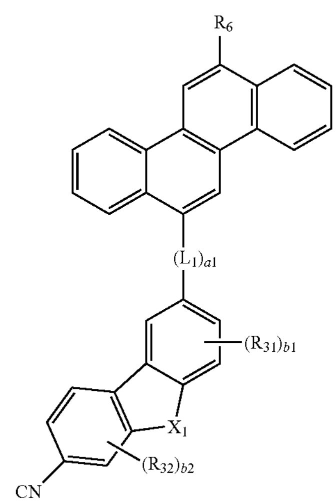

-continued
<Formula 1-3>
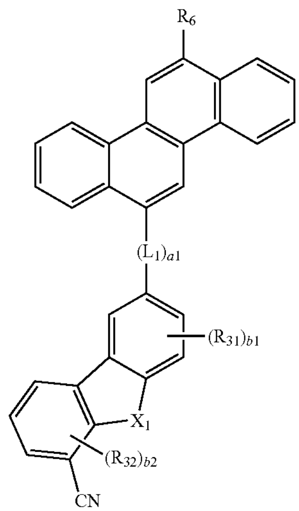
<Formula 1-4>
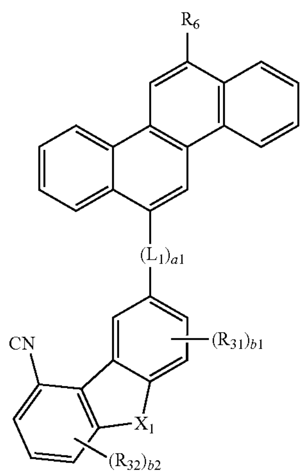
<Formula 1-5>
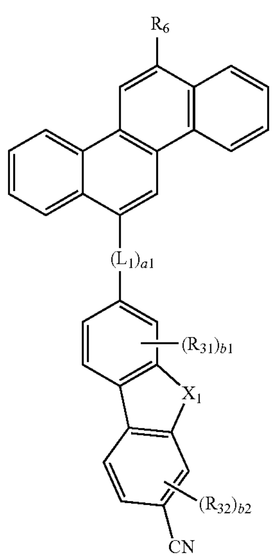
-continued
<Formula 1-6>
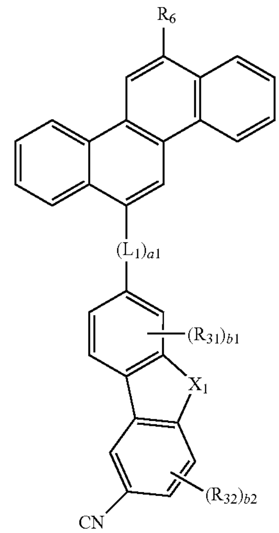
<Formula 1-7>
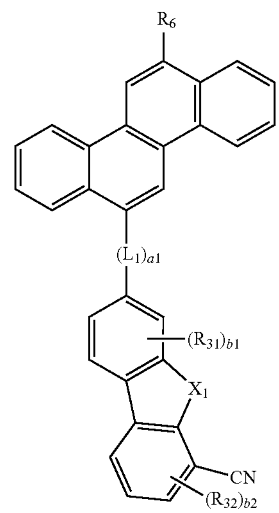
<Formula 1-8>
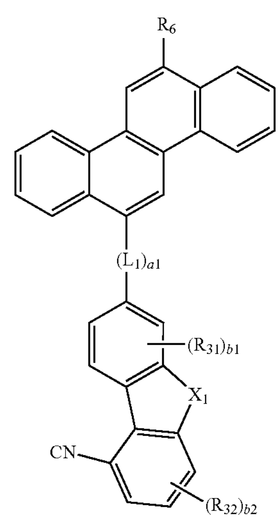

-continued

<Formula 1-9>

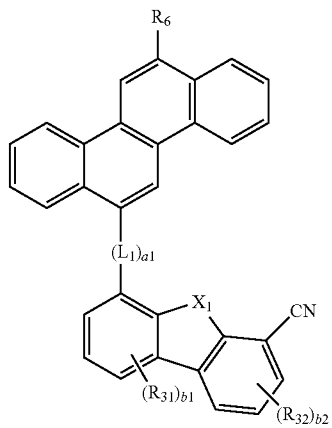

<Formula 1-10>

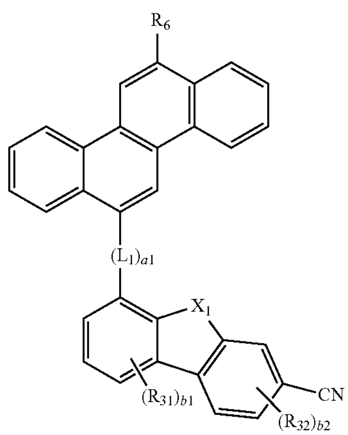

<Formula 1-11>

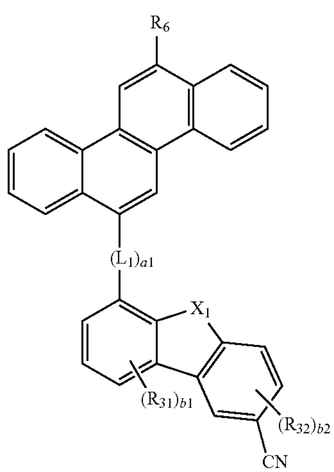

-continued

<Formula 1-12>

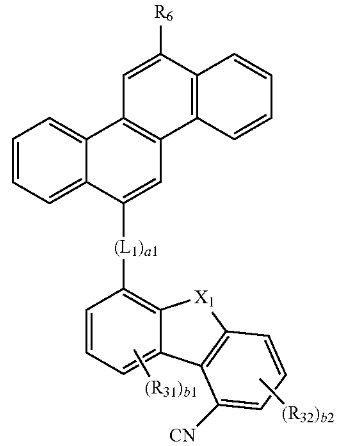

$X_1$, $L_1$, a1, $R_6$, $R_{31}$, $R_{32}$, and b1 and b2 in Formulae 1-1 to 1-12 may be understood by referring to the corresponding description provided herein. For example, $X_1$, $L_1$, a1, $R_6$, $R_{31}$, $R_{32}$, and b1 and b2 in Formulae 1-1 to 1-12 may be the same as those defined with respect to Formula 1.

In an implementation, the condensed cyclic compound may be represented by one of Formulae 1-1 to 1-12, $L_1$ in Formulae 1-1 to 1-12 may be represented by one of Formulae 4-1 to 4-23 above; a1 may be 0 or 1; $x_1$ may be $N(R_{21})$, O, or S; $R_{21}$ may be selected from Formulae 5-1 to 5-35 above; $R_6$, $R_{31}$, and $R_{32}$ may be each independently selected from a hydrogen, a deuterium, -F, -Cl, -Br, -I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, and Formulae 5-1 to 5-35 above; and b1 and b2 may be each independently 0, 1, or 2, but they are not limited thereto.

In an implementation, the condensed cyclic compound represented by Formula 1 may be represented by one of Formulae 1-1, 1-5, 1-6, and 1-9.

In an implementation, the condensed cyclic compound represented by Formula 1 may be one of Compounds 1 to 116 below, but is not limited thereto.

1

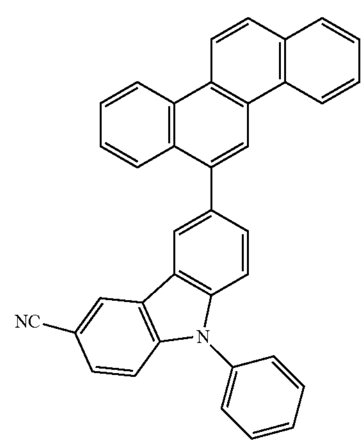

-continued
2
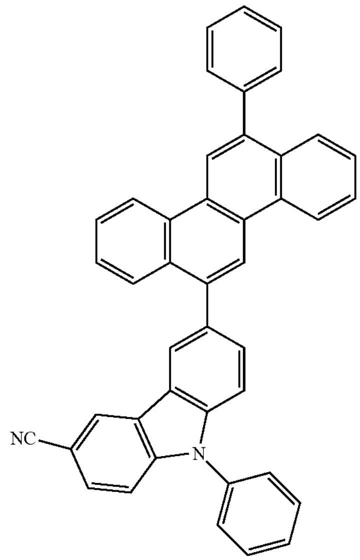
3
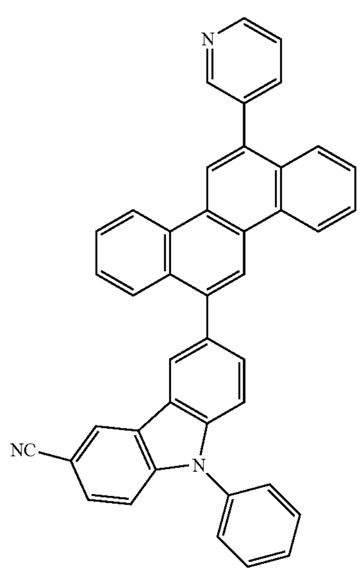
-continued
4
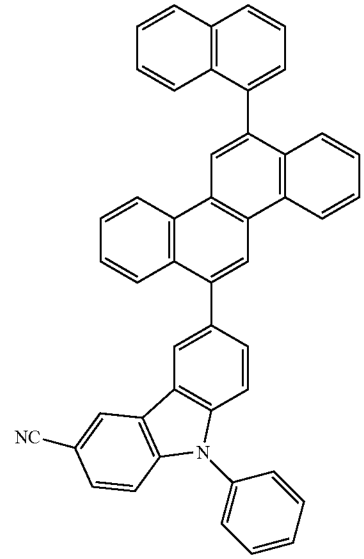
5
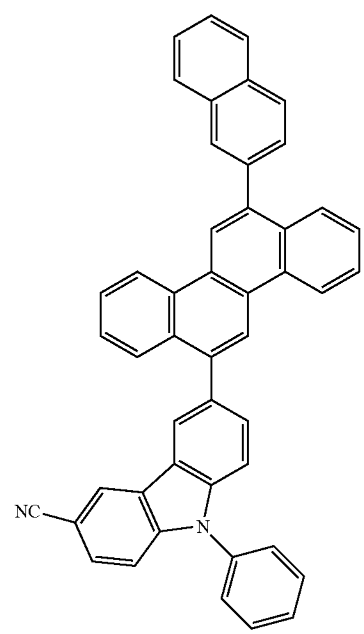

-continued
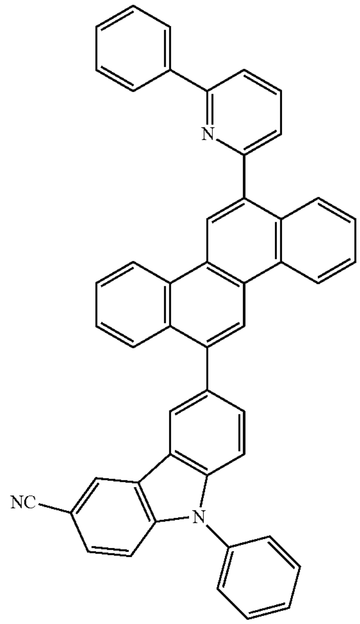
6
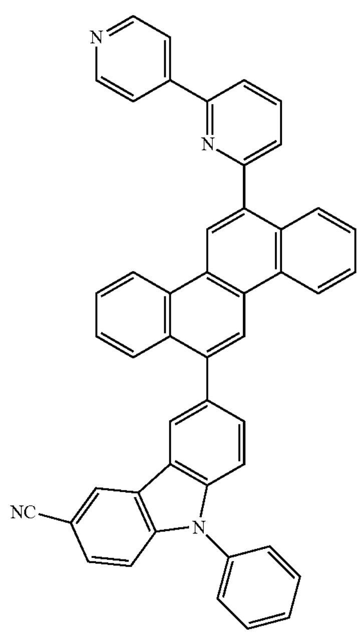
7
-continued
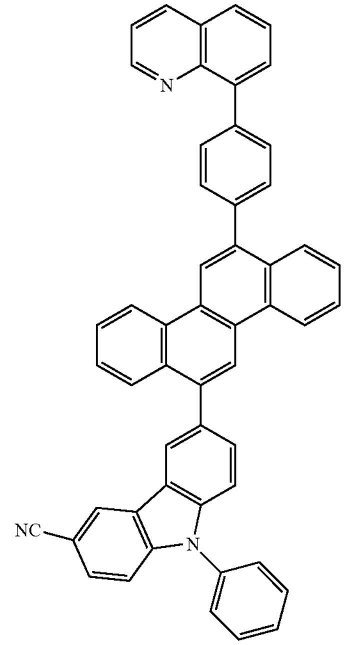
8
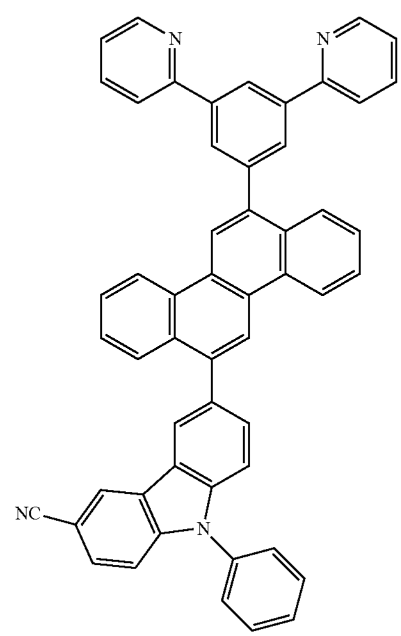
9

-continued
10
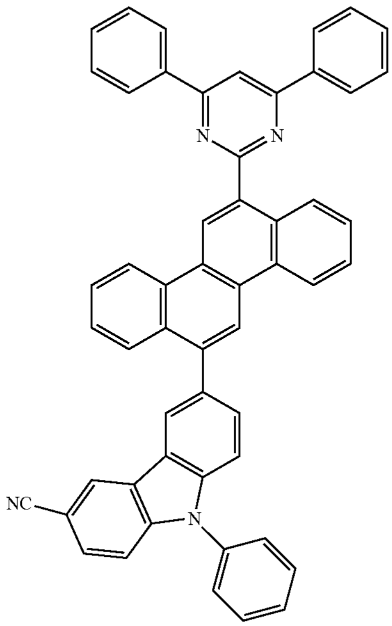
11
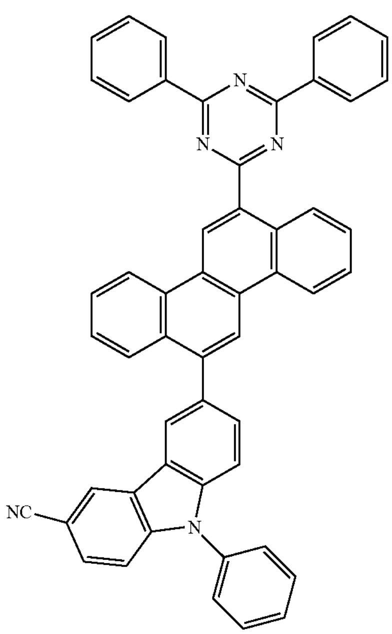
-continued
12
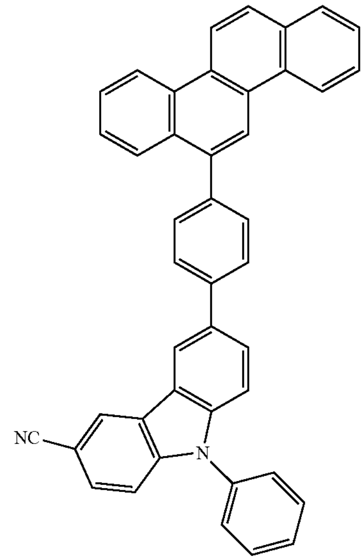
13
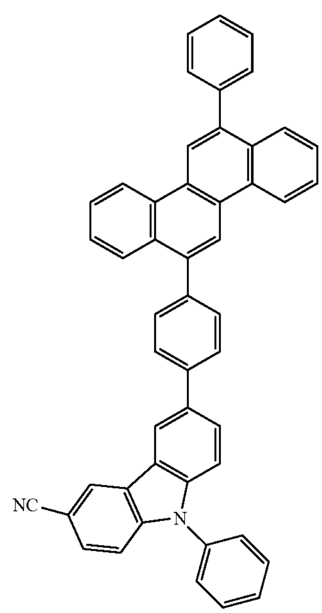

14
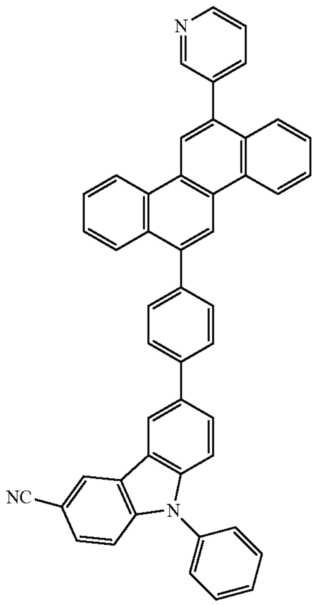
16
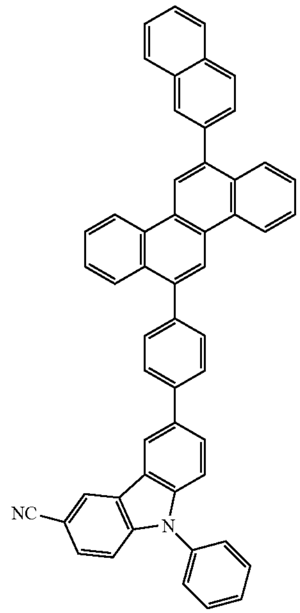
15
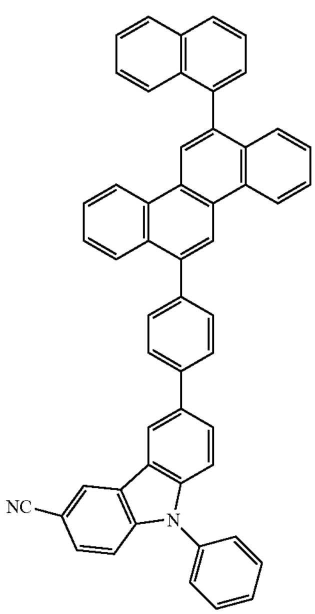
17
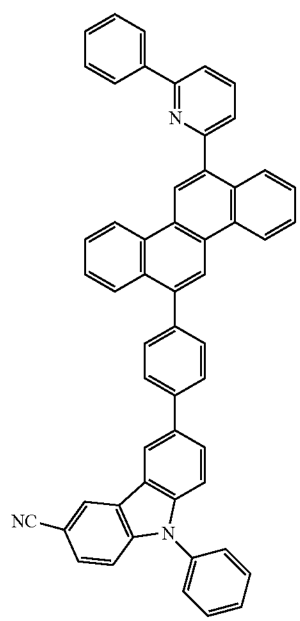

-continued
18
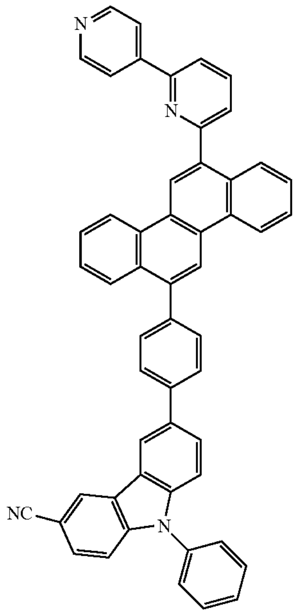
19
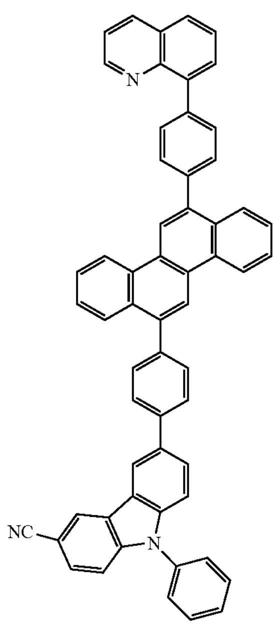
-continued
20
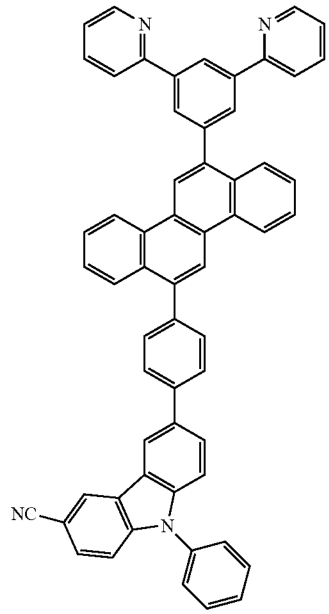
21
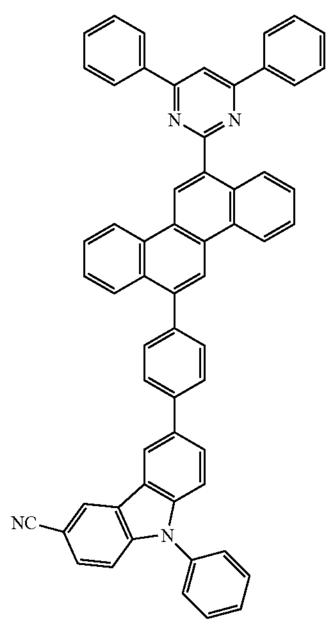

22
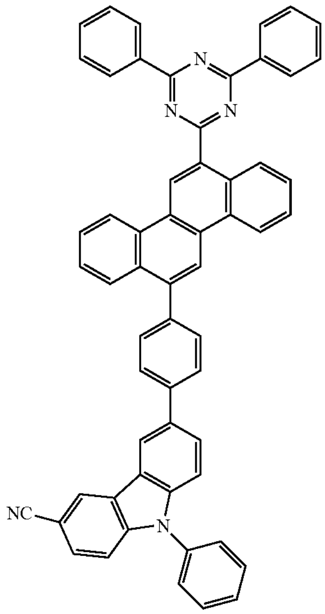
24
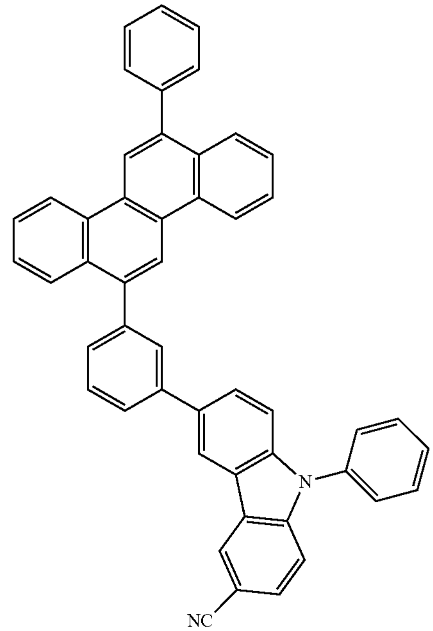
23
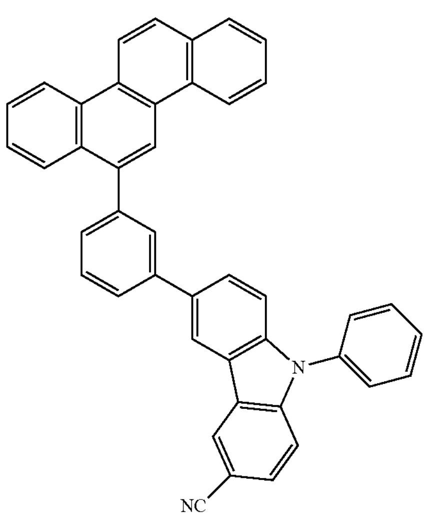
25
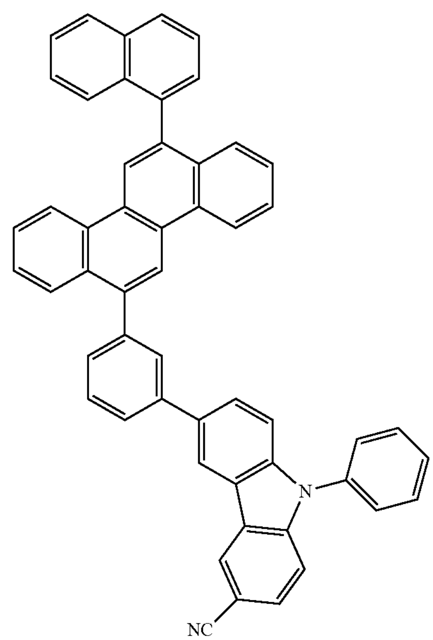

26
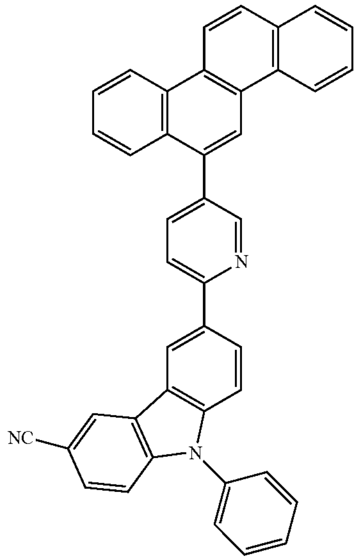
27
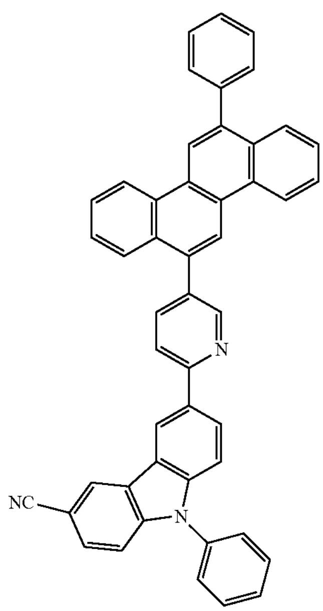
28
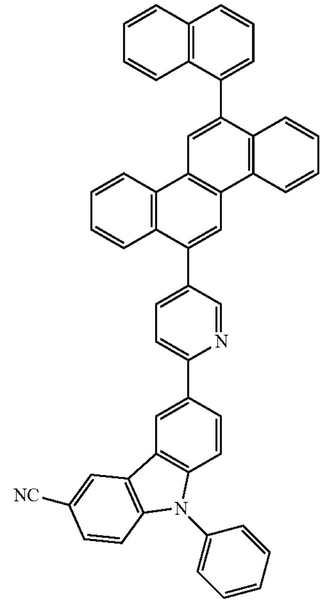
29
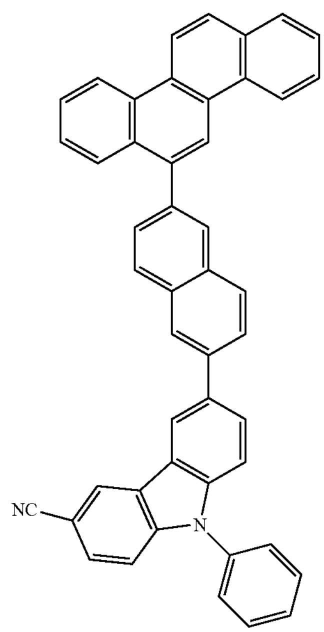

30
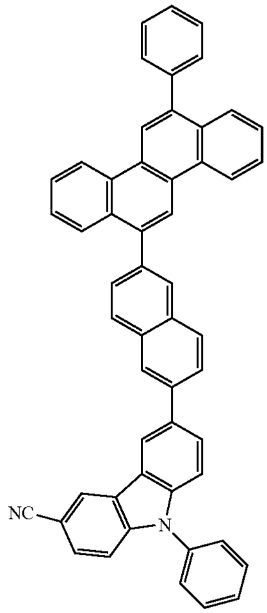
31
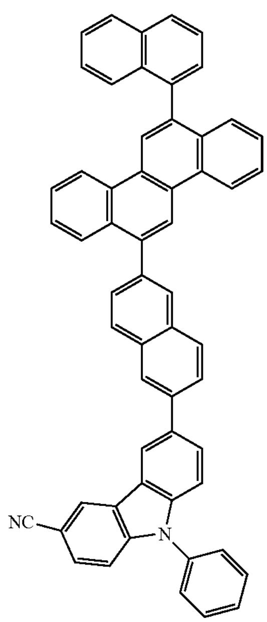
32
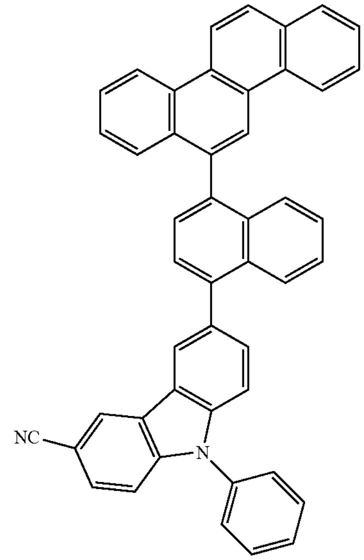
33
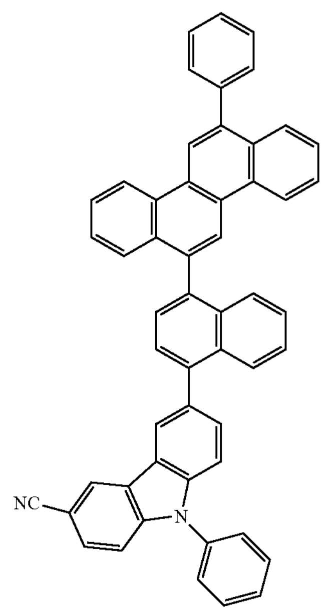

-continued
34
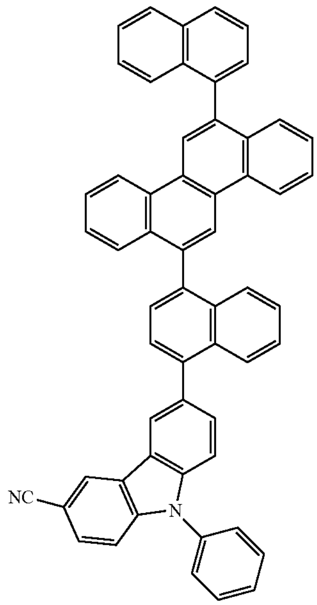
35
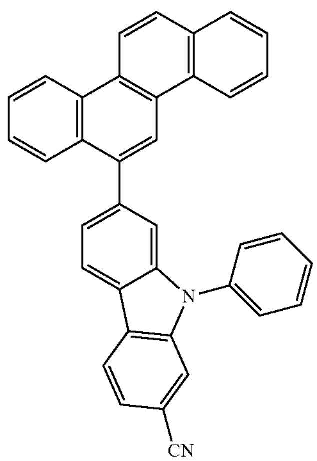
36
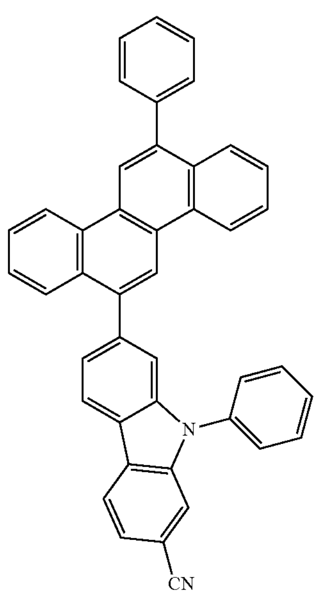
-continued
37
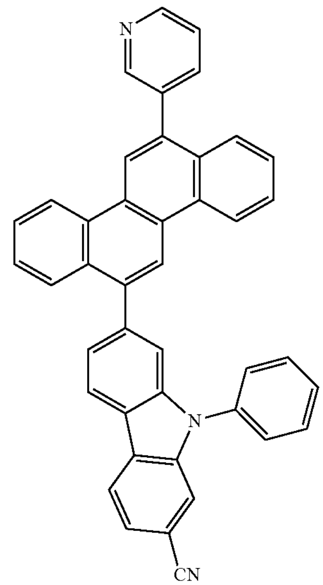
38
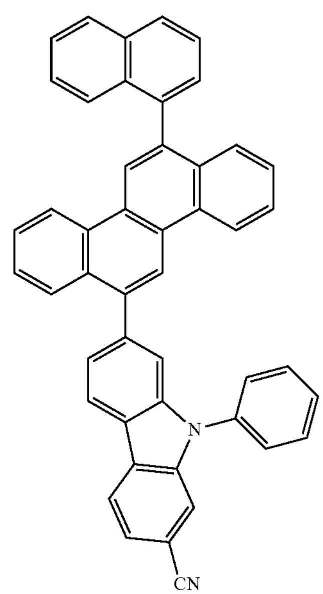

-continued
39
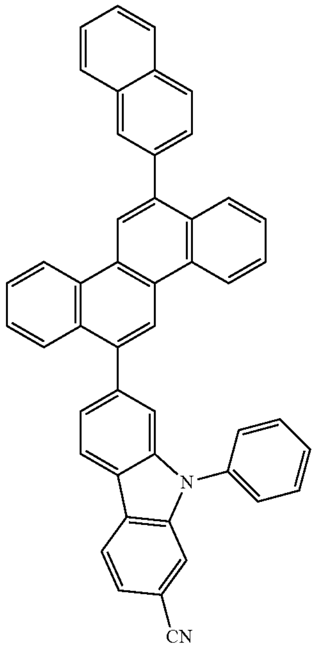
40
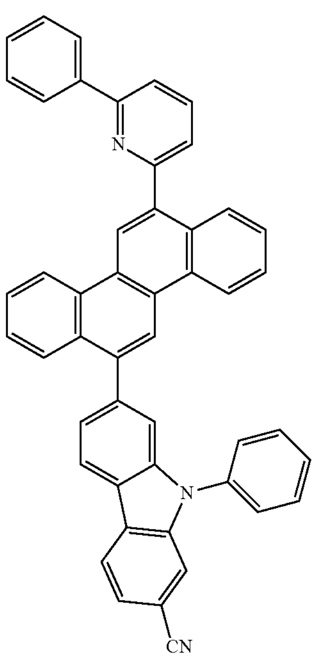
-continued
41
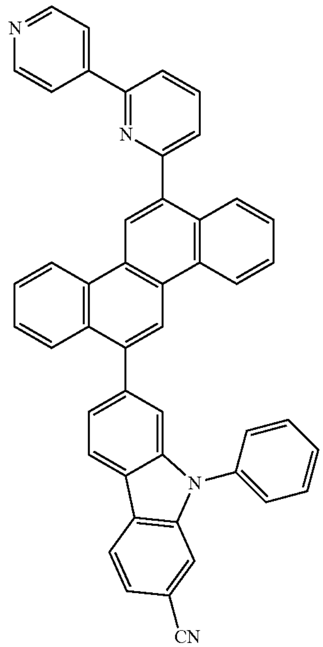
42
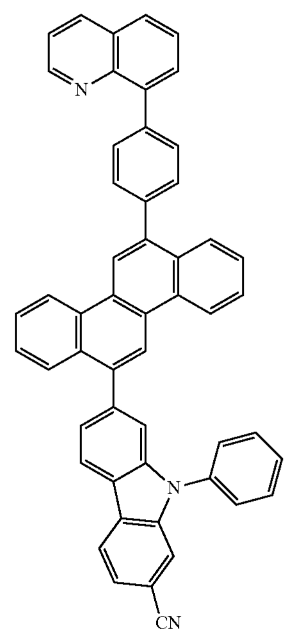

-continued
43
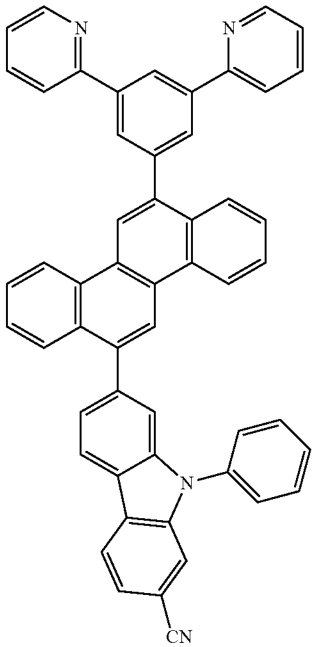
44
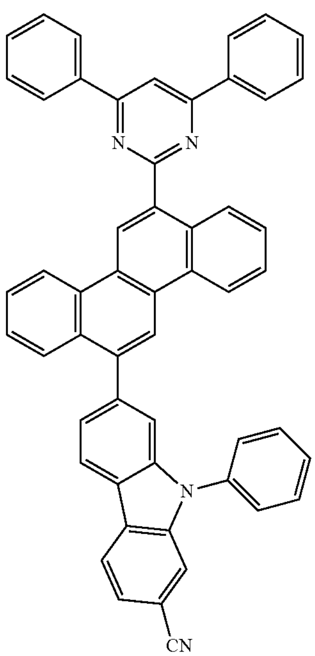
-continued
45
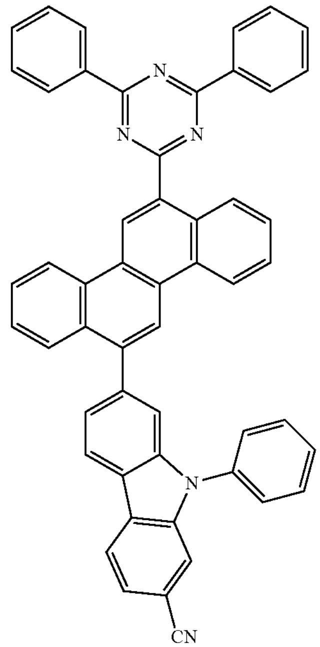
46
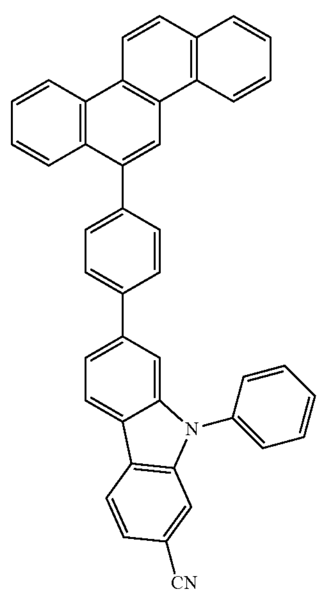

-continued
47
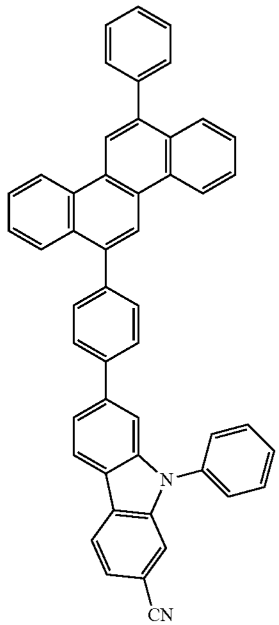
49
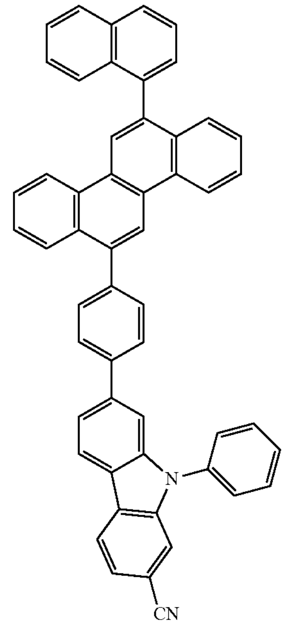
48
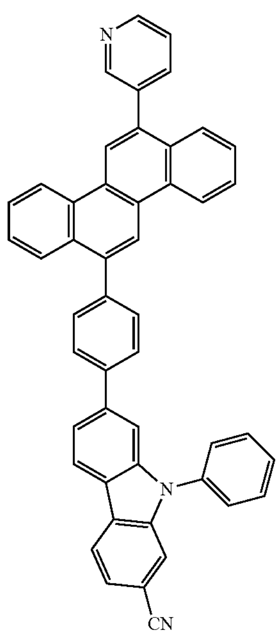
50
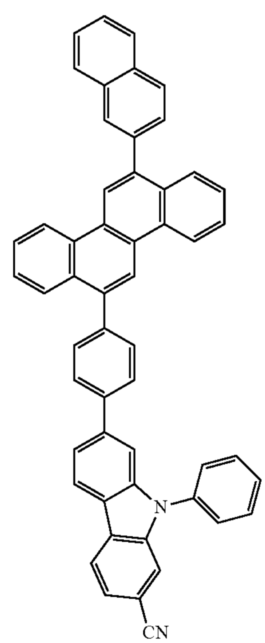

-continued
51
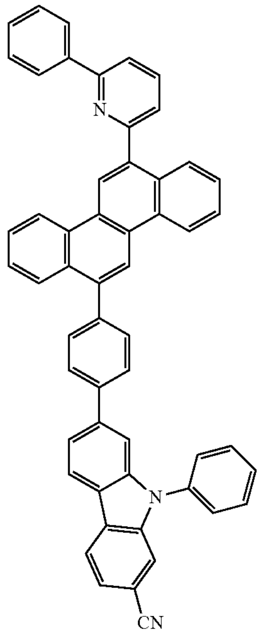
-continued
53
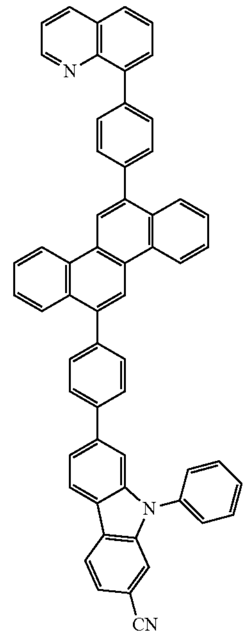
52
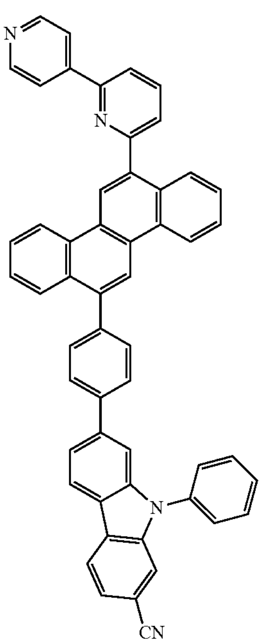
54
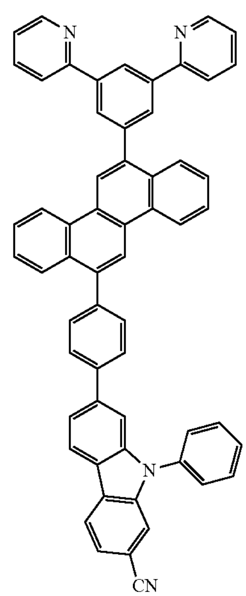

-continued
55
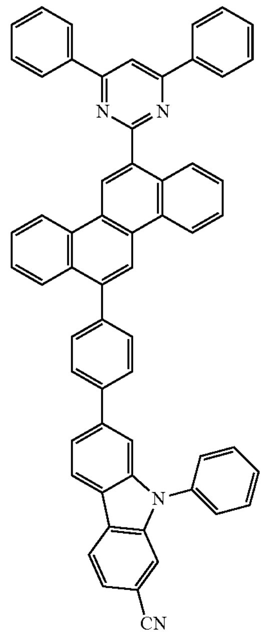
56
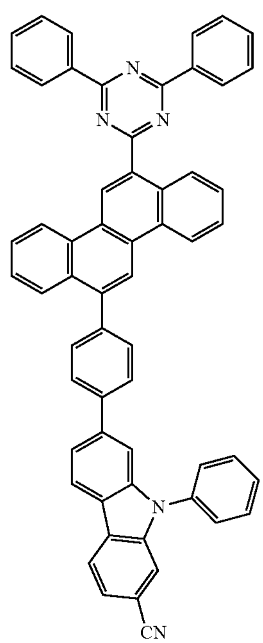
-continued
57
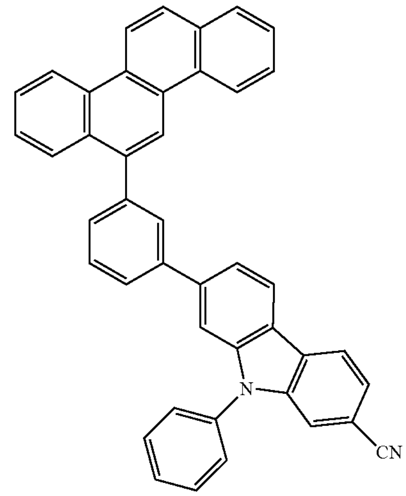
58
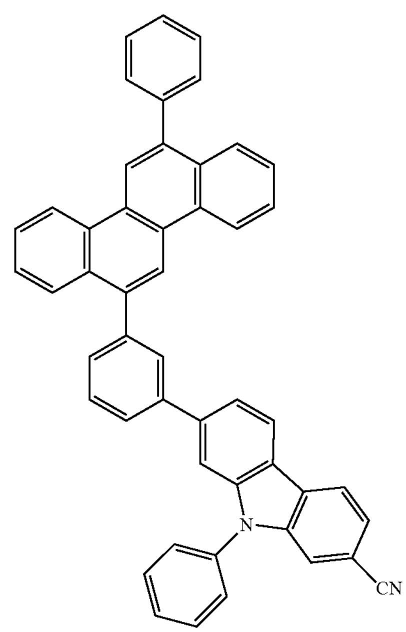

-continued
59
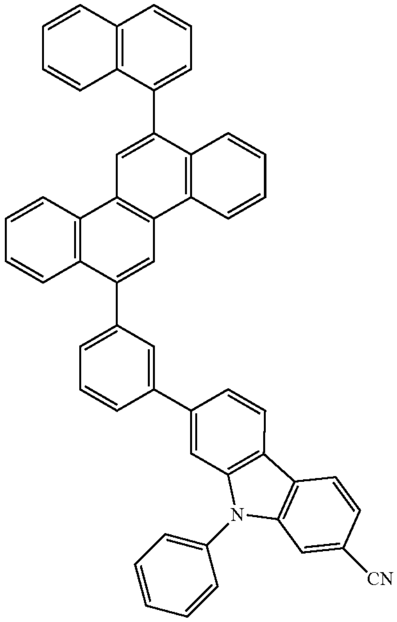
61
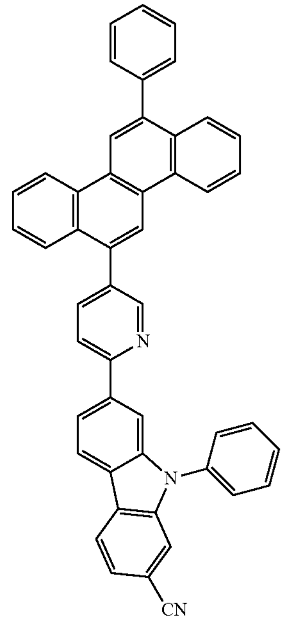
60
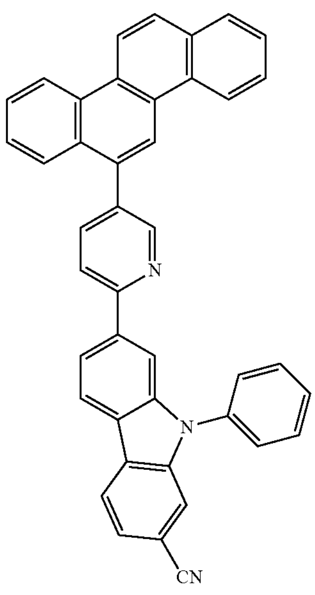
62
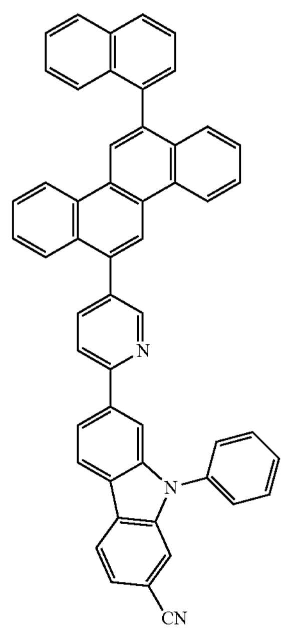

63
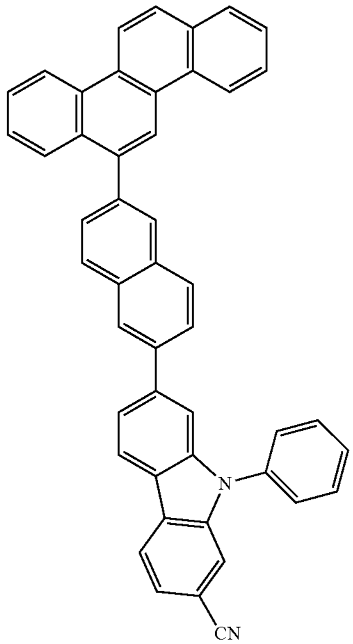
65
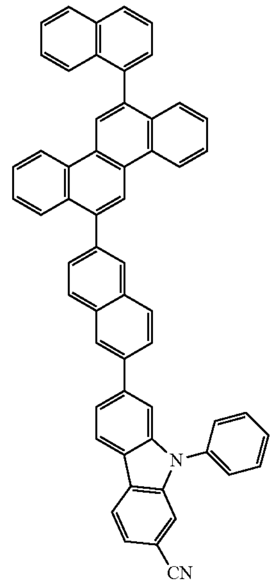
64
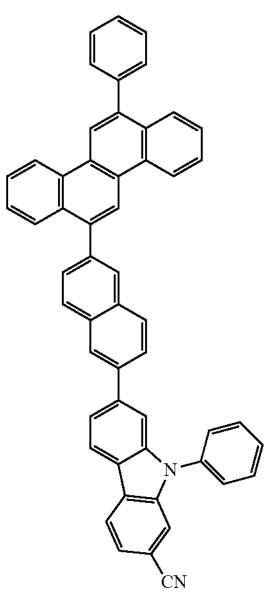
66
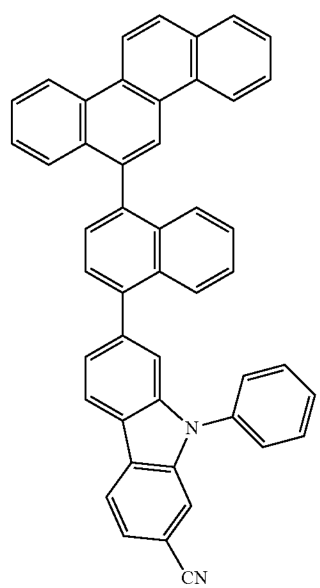

-continued
67
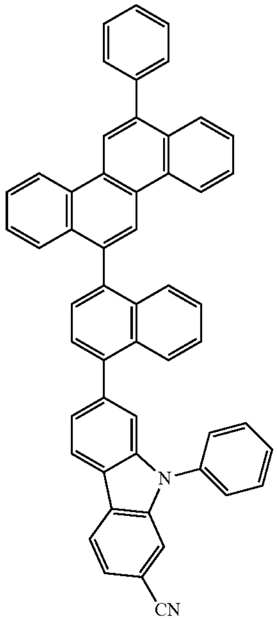
68
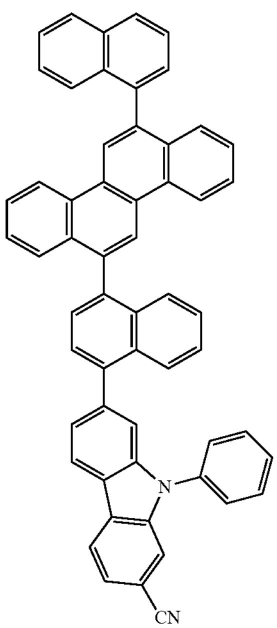
-continued
69
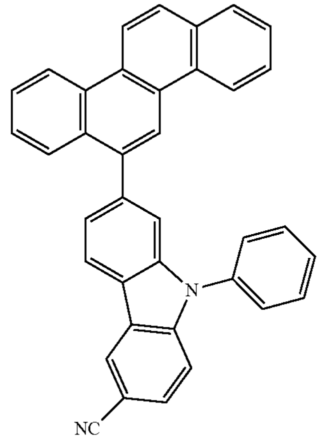
70
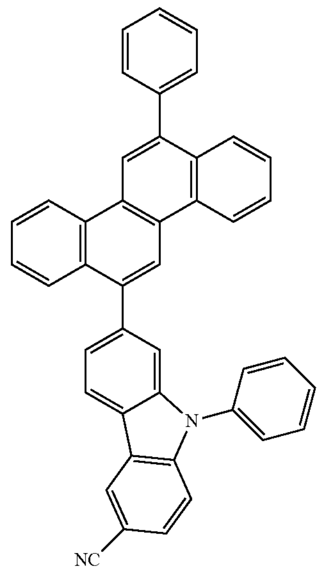
71
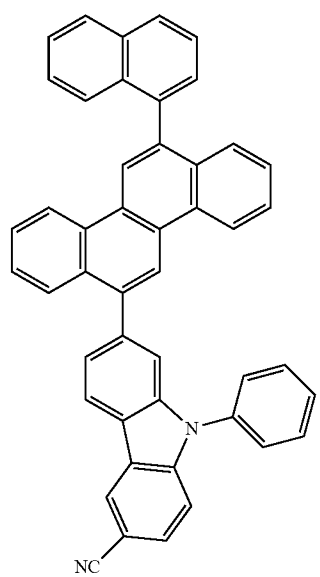

-continued
72
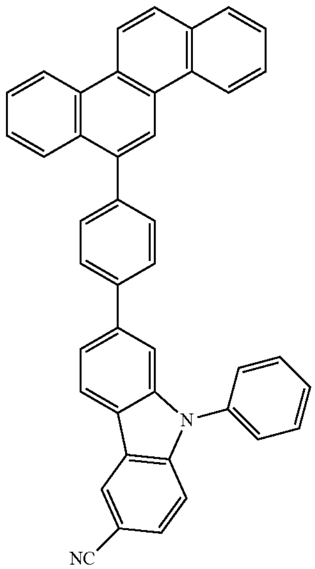
73
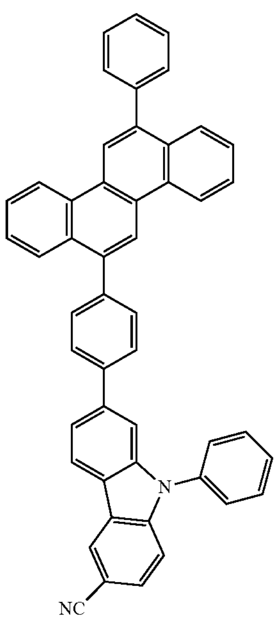
-continued
74
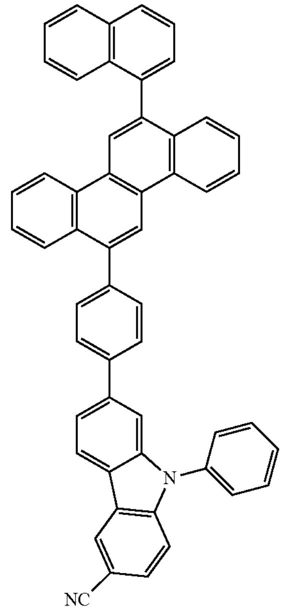
75
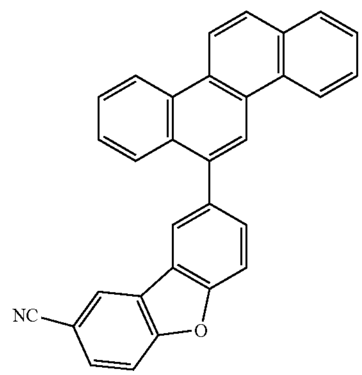
76
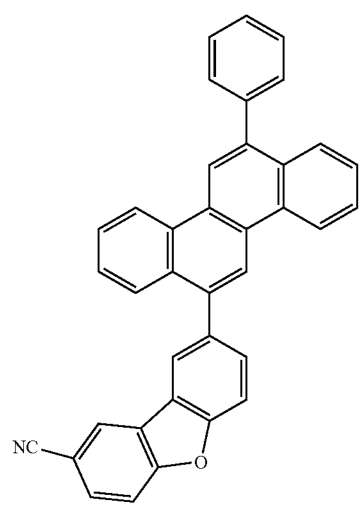

-continued
77
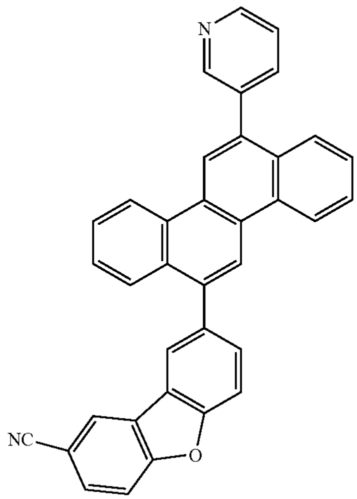
78
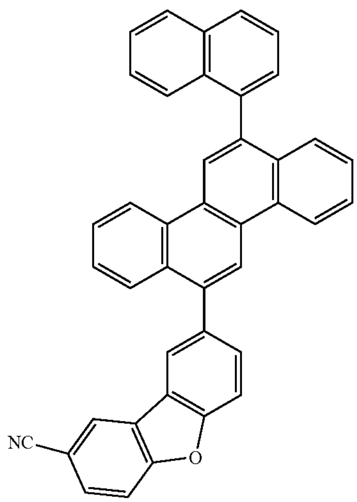
79
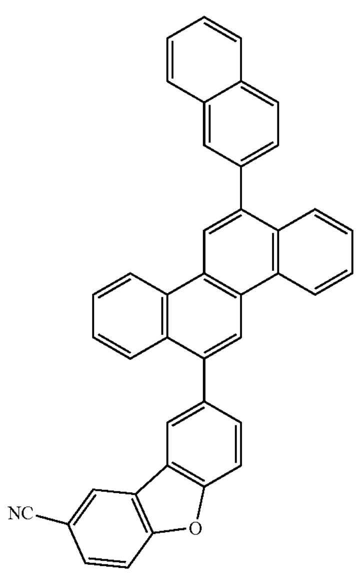
-continued
80
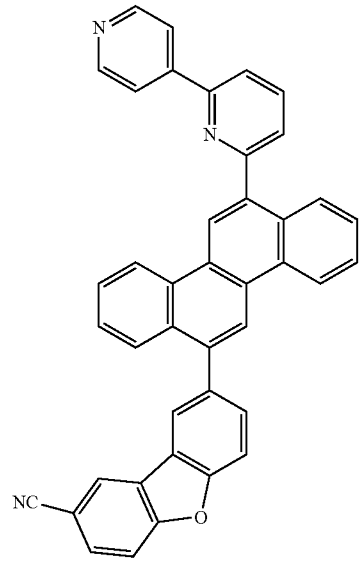
81
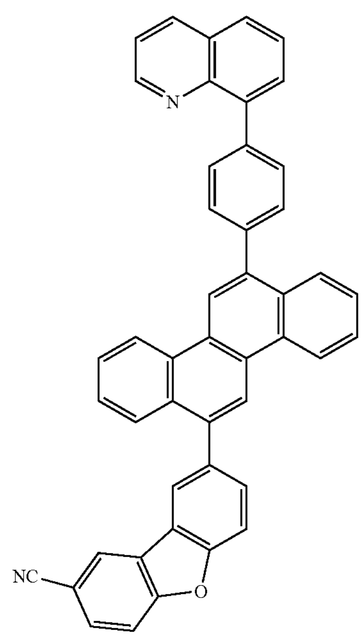

-continued
82
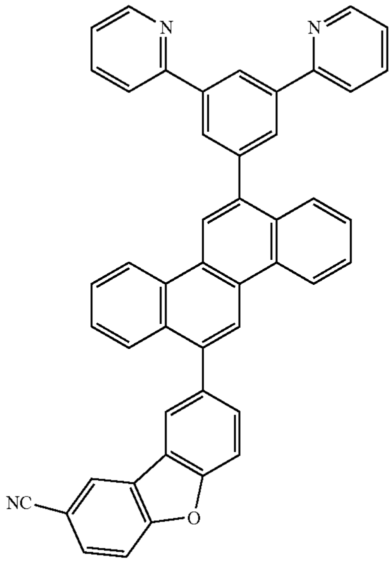
83
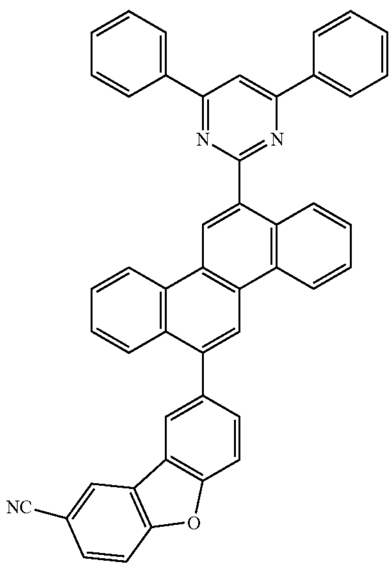
84
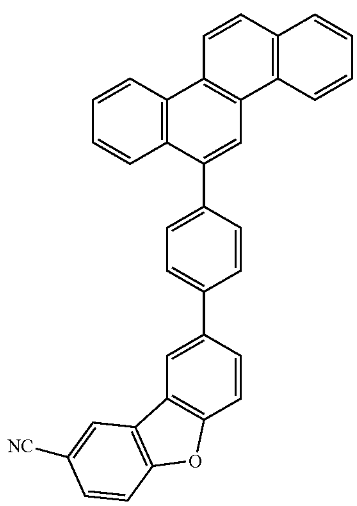
-continued
85
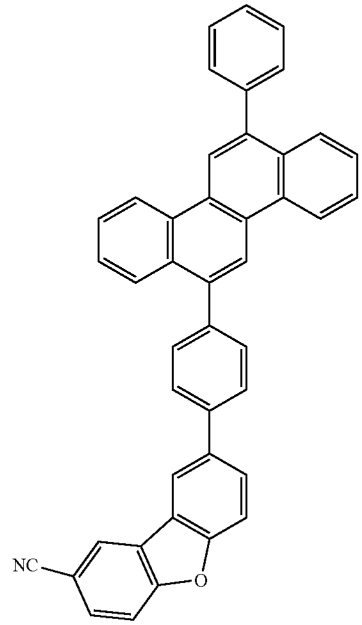
86
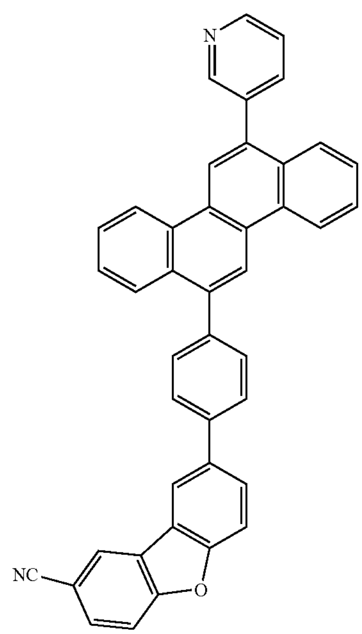

-continued
87
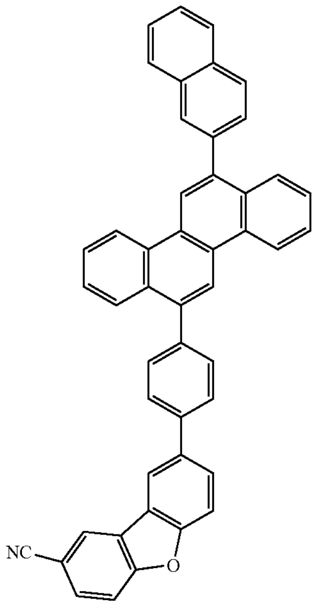
88
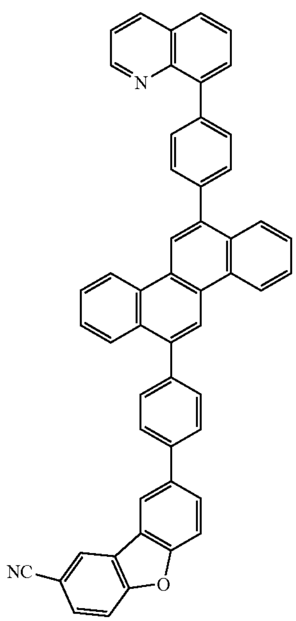
-continued
89
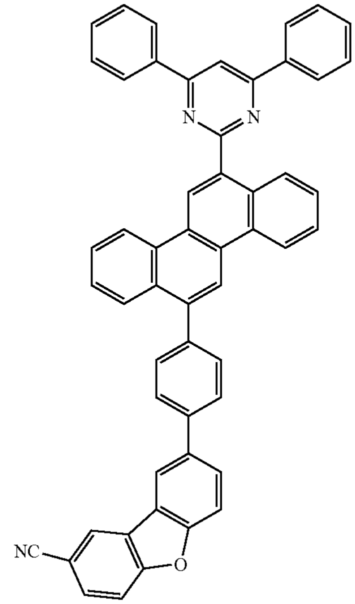
90
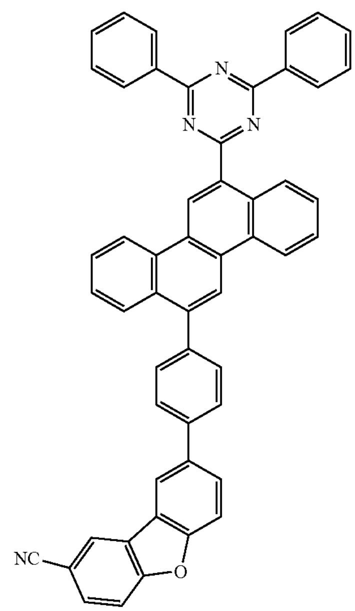
91
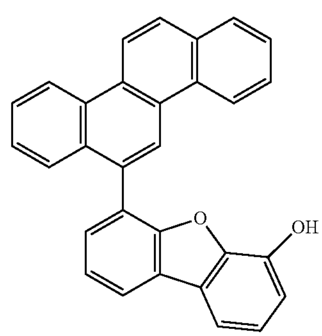

-continued
92
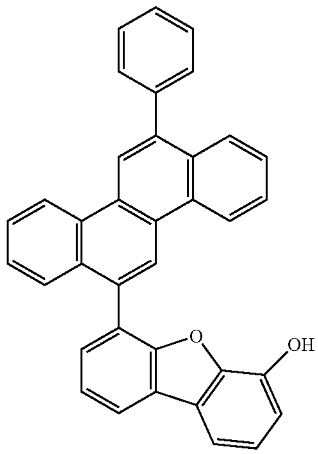
93
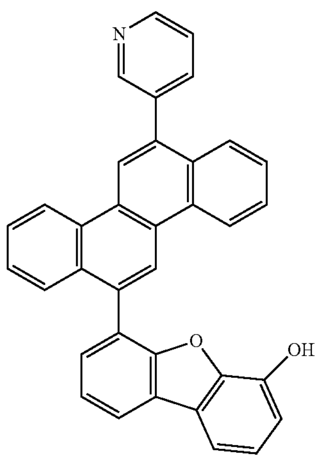
94
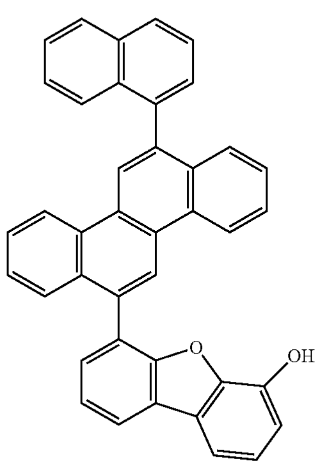
-continued
95
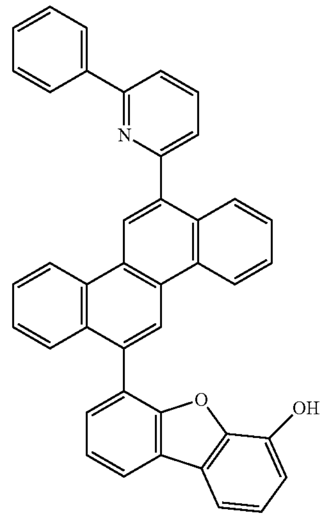
96
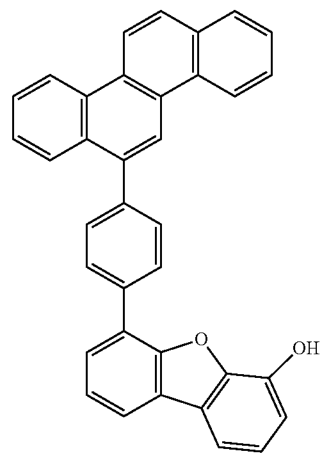
97
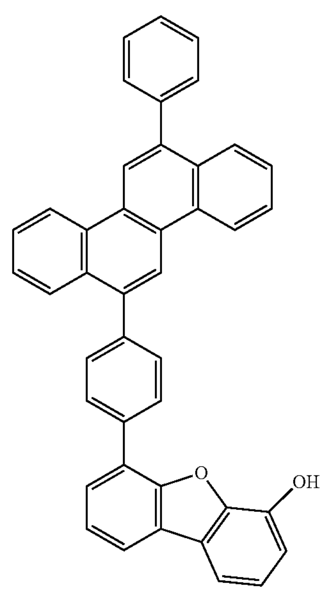

-continued
98
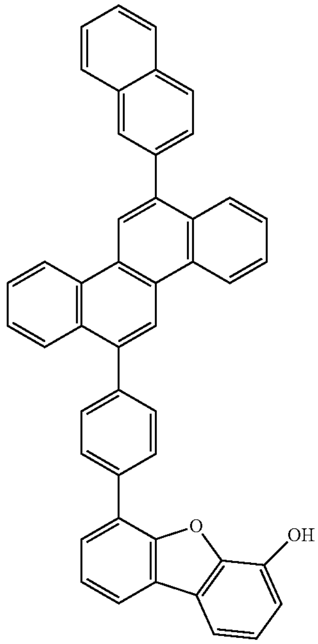
99
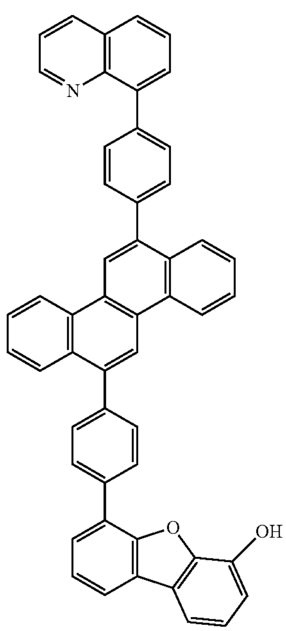
-continued
100
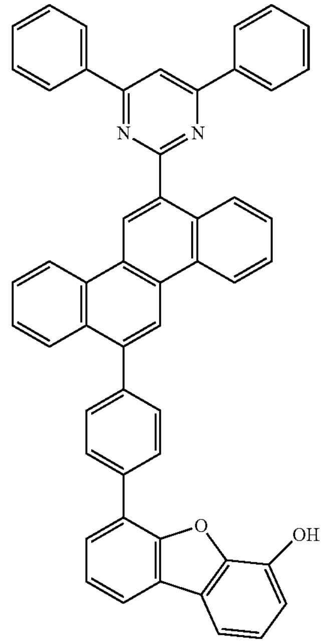
101
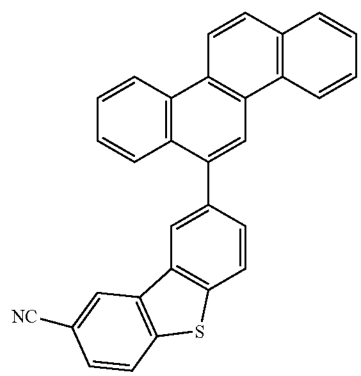
102
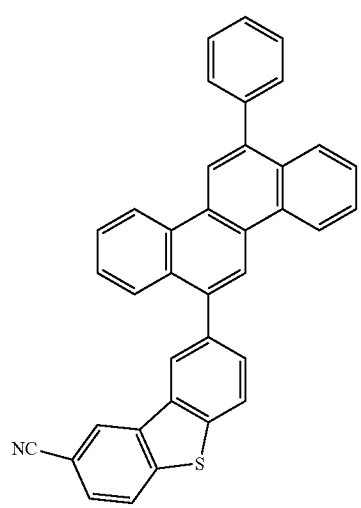

-continued
103
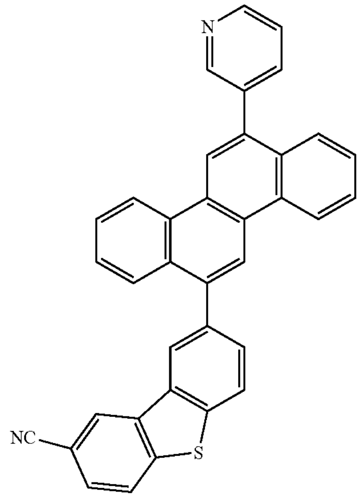
104
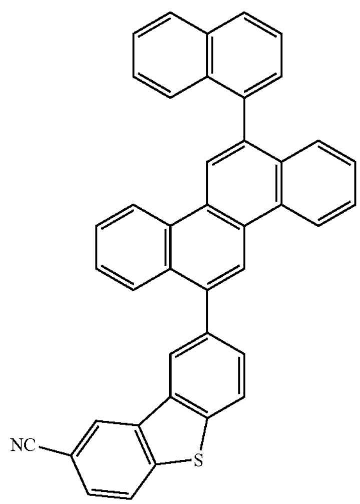
105
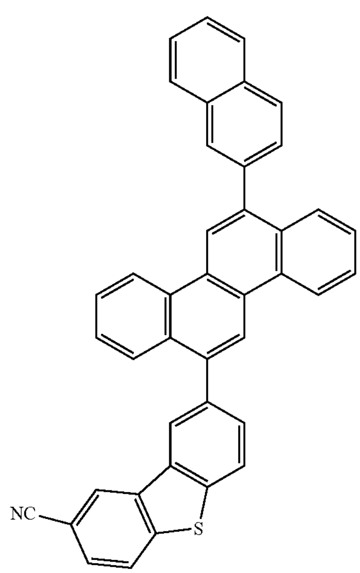
-continued
106
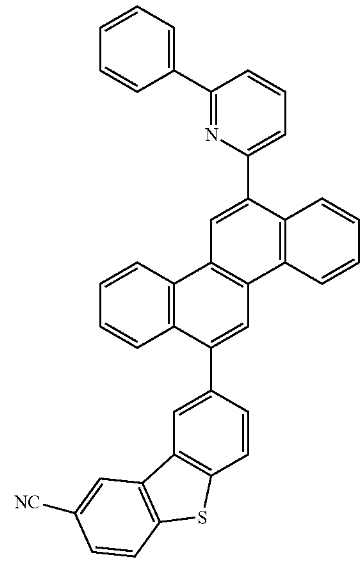
107
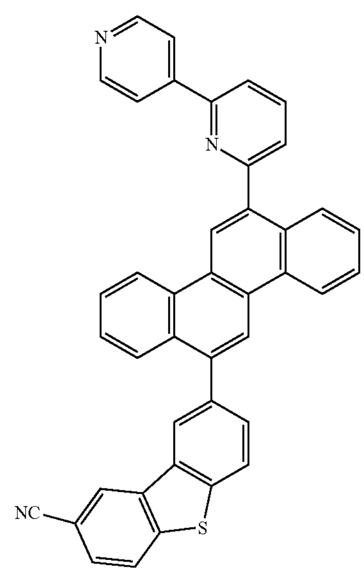

-continued
108
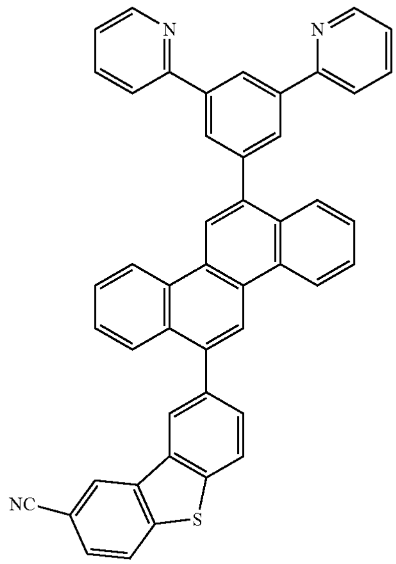
109
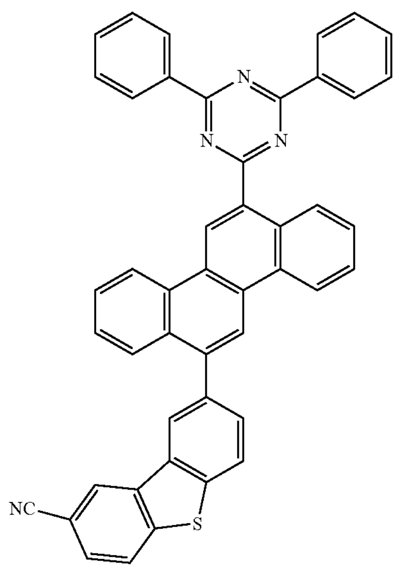
110
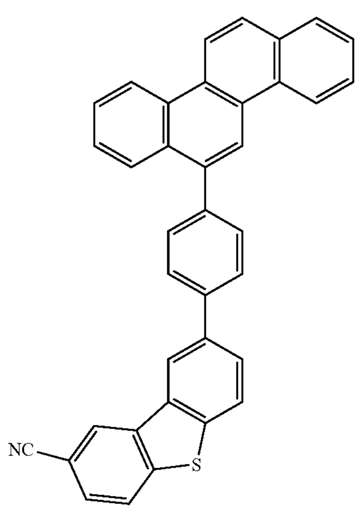
-continued
111
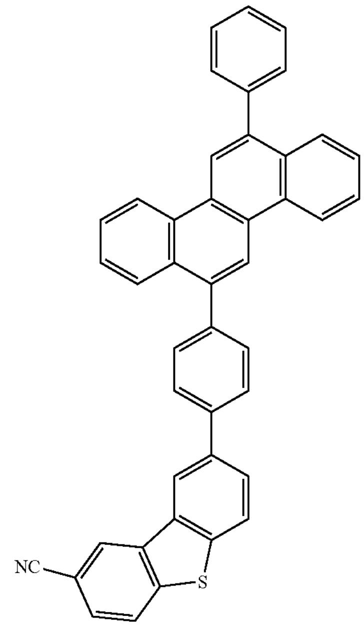
112
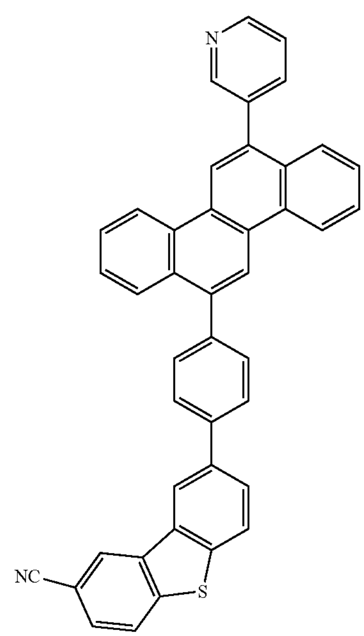

-continued
113
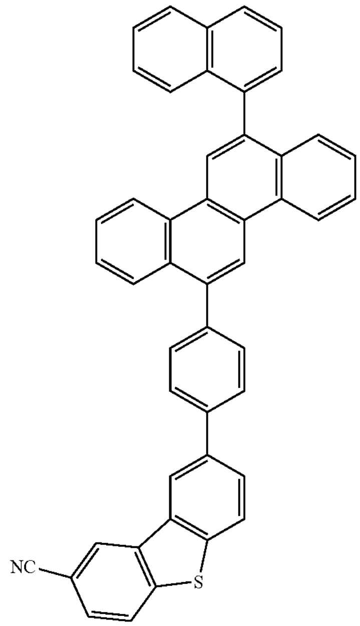
114
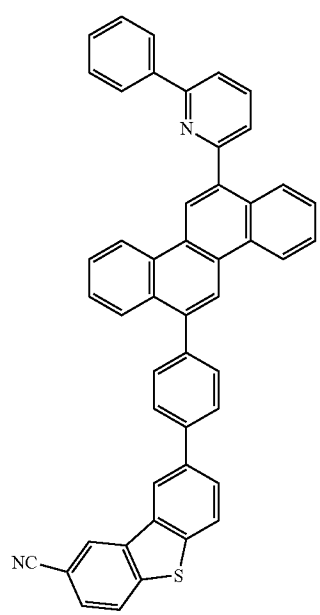
-continued
115
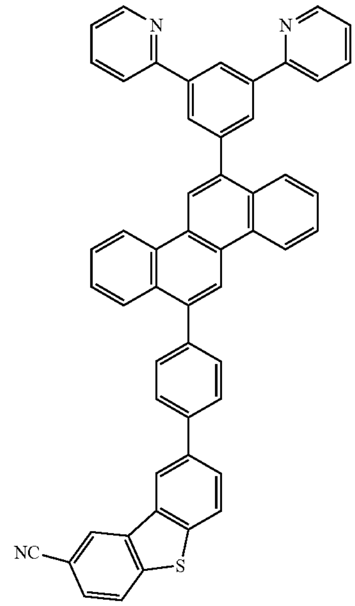
116
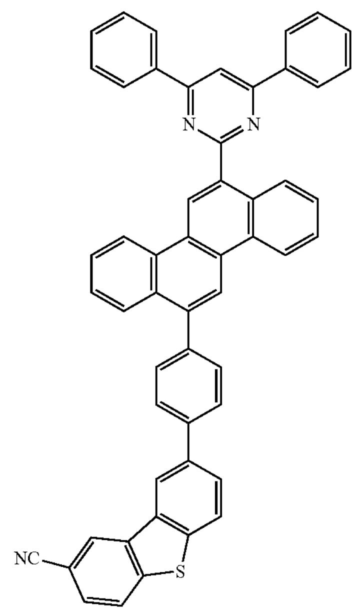
Formula 1 may include a group represented by Formula 2. The group represented by Formula 2 may include, e.g., a "carbazole-based ring" that is substituted with "CN (cyano)" (see Formula 2' below).
<Formula 2'>
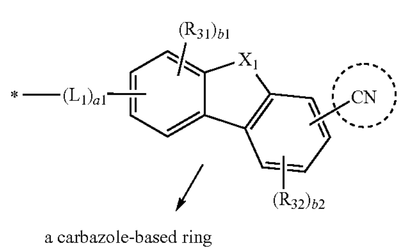

Formula 2 may include a "carbazole-based ring" substituted with CN, and $X_1$, which may be a heteroatom of the "carbazole-based ring," may help offset electron withdrawing effects of CN. Accordingly, the compound represented by Formula 1 may have excellent thermal stability. thus, an organic light-emitting device including a compound represented by Formula 1 may have a long lifespan.

Also, Formula 2 may include a "carbazole-based ring" substituted with CN, and an intramolecular bonding force may be enhanced. Thus, an organic light-emitting device including a compound represented by Formula 1 may have a long lifespan.

Accordingly, an organic light-emitting device including the condensed cyclic compound represented by Formula 1 may have a low driving voltage, high efficiency, high brightness, and long lifespan.

The condensed cyclic compound represented by Formula 1 may be synthesized by a suitable organic synthesis method. A synthesis method of the condensed cyclic compound may be obvious to one of ordinary skill in the art in view of the following embodiments or examples.

The condensed cyclic compound of Formula 1 may be used or included between a pair of electrodes of an organic light-emitting device. In an implementation, the condensed cyclic compound may be included in an electron transport region, e.g., an electron transport layer. Accordingly, an organic light-emitting device according to an embodiment may include a first electrode; a second electrode facing the first electrode; and an organic layer between the first and second electrodes. The organic layer may include an emission layer. The organic layer may include at least one of the condensed cyclic compounds described above, e.g., the compound represented by Formula 1.

The expression "(an organic layer) includes at least one condensed cyclic compound" used herein includes a case in which "(an organic layer) includes one condensed cyclic compound of Formula 1 and a case in which (an organic layer) includes two or more different condensed cyclic compounds of Formula 1".

For example, the organic layer may include, as the condensed cyclic compound, only Compound 1. In this regard, Compound 1 may exist in an electron transport layer of the organic light-emitting device. In another embodiment of the present invention, the organic layer may include, as the condensed cyclic compound, Compound 1 and Compound 2. In this regard, Compound 1, and Compound 2 may exist in an identical layer (for example, Compound 1 and Compound 2 may both exist in an electron transport layer), or different layers (for example, Compound 1 may exist in an emission layer and Compound 2 may exist in an electron transport layer).

The organic layer may include, e.g., i) a hole transport region between the first electrode and the emission layer. The hole transport region may include at least one of a hole injection layer, a hole transport layer, a buffer layer, or an electron blocking layer. The organic layer may include, e.g., ii) an electron transport region between the emission layer and the second electrode. The electron transport region may include at least one of a hole blocking layer, an electron transport layer, or an electron injection layer. The electron transport region may include the condensed cyclic compound represented by Formula 1. For example, the electron transport region may include the electron transport layer, and the electron transport layer may include the condensed cyclic compound represented by Formula 1.

The expression "organic layer" used herein refers to a single layer and/or a plurality of layers disposed between the first and second electrodes of an organic light-emitting device. A material of the "organic layer" is not limited to an organic material.

FIG. 1 illustrates a schematic view of an organic light-emitting device 10 according to an embodiment. The organic light-emitting device 10 may include a first electrode 110, an organic layer 150, and a second electrode 190.

Hereinafter a structure of the organic light-emitting device 10 and a method of manufacturing the organic light-emitting device 10, according to an embodiment, will be described with reference to FIG. 1.

In an implementation, a substrate may be additionally disposed or provided under the first electrode 110 or above the second electrode 190. The substrate may be a glass substrate or a transparent plastic substrate, each with excellent mechanical strength, thermal stability, transparency, surface smoothness, ease of handling, and water repellancy.

The first electrode 110 may be formed by depositing or sputtering a material for forming the first electrode 110 on the substrate. When the first electrode 110 is an anode, the material for the first electrode 110 may be selected from materials with a high work function facilitate hole injection. The first electrode 110 may be a reflective electrode, a semi-transmissive electrode, or a transmissive electrode. The material for the first electrode 110 may be a transparent and highly conductive material, and examples of such a material may include indium tin oxide (ITO), indium zinc oxide (IZO), tin oxide ($SnO_2$), and zinc oxide (ZnO). When the first electrode 110 is a semi-transmissive electrode or a reflective electrode, a material for forming the first electrode 110 may include at least one of magnesium (Mg), aluminum (Al), aluminum-lithium (Al—Li), calcium (Ca), magnesium-indium (Mg—In), and magnesium-silver (Mg—Ag).

The first electrode 110 may have a single-layer structure, or a multi-layer structure including two or more layers. For example, the first electrode 110 may have a three-layered structure of ITO/Ag/ITO, but the structure of the first electrode 120 is not limited thereto.

The organic layer 150 may be disposed on the first electrode 110. The organic layer 150 may include an emission layer.

The organic layer 150 may further include a hole transport region between the first electrode 110 and the emission layer, and/or an electron transport region between the emission layer and the second electrode 190.

The hole transport region may include at least one selected from a hole injection layer, a hole transport layer, a buffer layer, and an electron blocking layer. The electron transport region may include at least one selected from a hole blocking layer, an electron transport layer, and an electron injection layer. However, the hole transport region and the electron transport region are not limited thereto.

The hole transport region may have a single-layered structure formed of a single material, a single-layered structure formed of different materials, or a multi-layered structure having a plurality of layers formed of different materials.

For example, the hole transport region may have a single-layered structure formed of different materials, or a structure of hole injection layer/hold transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, wherein layers of each structure are sequentially stacked from the first electrode 110 in this stated order, but are not limited thereto.

When the hole transport region includes a hole injection layer, the hole injection layer may be formed on the first electrode 110 by using various methods, such as vacuum deposition, spin coating, casting, a Langmuir-Blodgett (LB) method, ink-jet printing, laser-printing, or laser-induced thermal imaging (LITI).

When a hole injection layer is formed by vacuum deposition, the vacuum deposition may be performed, for example, at a deposition temperature of about 100 to about 500° C. at a vacuum degree of about $10^{-8}$ to about $10^{-3}$ torr, and at a deposition rate of about 0.01 to about 100 Å/sec in consideration of a compound for a hole injection layer to be deposited, and the structure of a hole injection layer to be formed.

When a hole injection layer is formed by spin coating, the spin coating may be performed, for example, at a coating rate of about 2,000 rpm to about 50,000 rpm, and at a temperature of about 80° C. to 200° C. in consideration of a compound for a hole injection layer to be deposited, and the structure of a hole injection layer to be formed.

When the hole transport region includes a hole transport layer, the hole transport layer may be formed on the first electrode 110 or the hole injection layer by using various methods, such as vacuum deposition, spin coating, casting, an LB method, ink-jet printing, laser-printing, or LITI. when the hole transport layer is formed by vacuum deposition and spin coating, deposition and coating conditions for the hole transport layer may be determined by referring to the deposition and coating conditions for the hole injection layer.

The hole transport region may include at least one selected from m-MTDATA, TDATA, 2-TNATA, NPB, β-NPB, TPD, Spiro-TBD, Spiro-NPB, α-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), (polyaniline)/poly(4-styrenesulfonate) (PANI/PSS), a compound represented by Formula 201 below, and a compound represented by Formula 202 below.

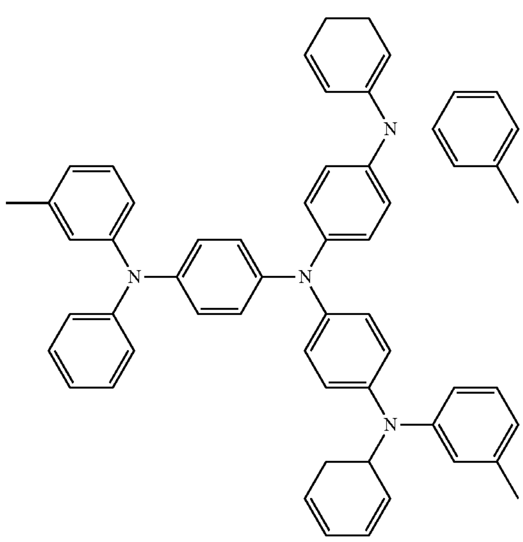

m-MTDATA

-continued

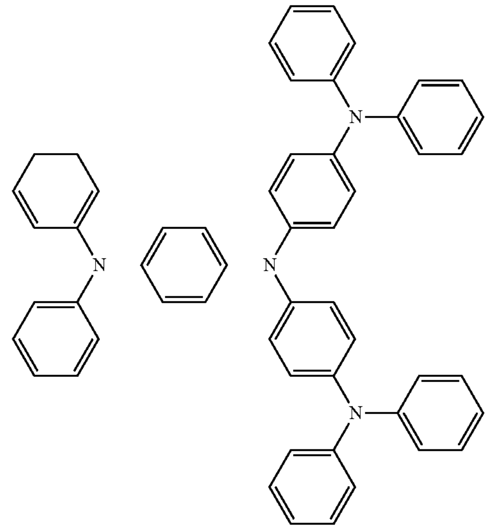

TDATA

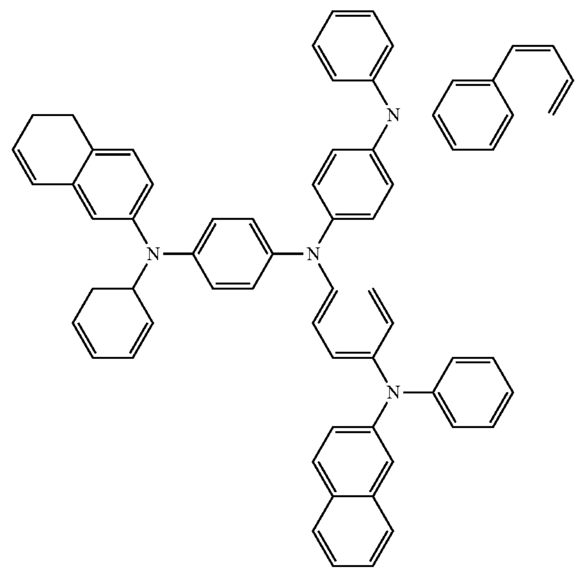

2-TNATA

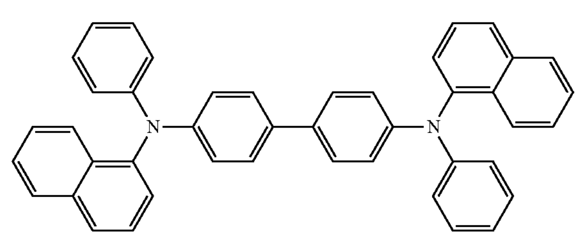

NPB

-continued

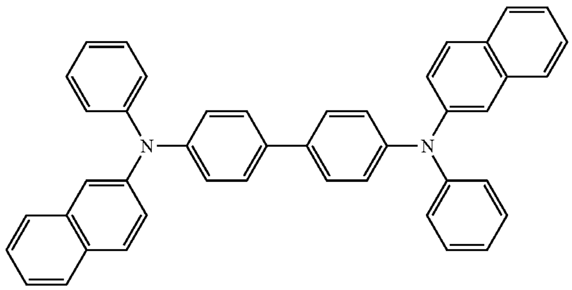

β-NPB

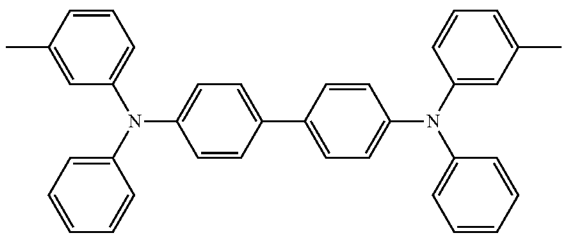

TPD

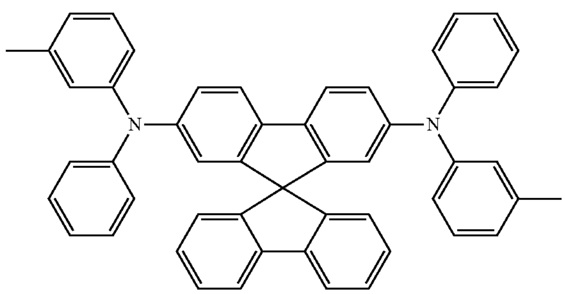

Spiro-TPD

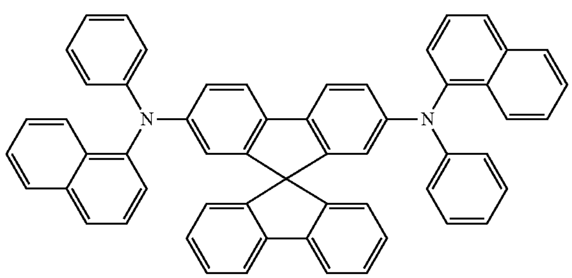

Spiro-NPB

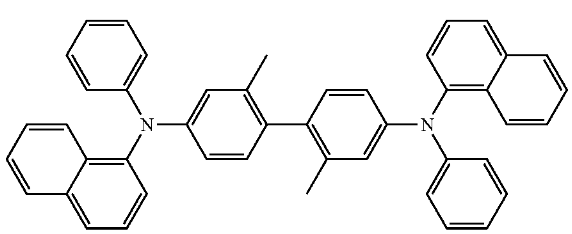

α-NPB

-continued

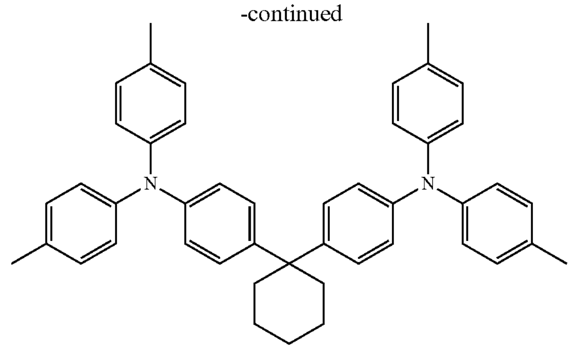

TAPC

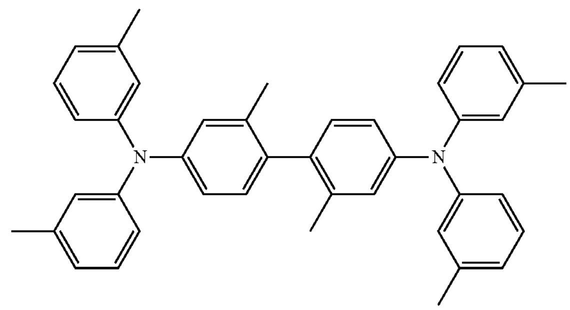

HMTPD

<Formula 201>α

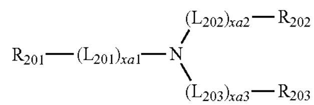

<Formula 202>

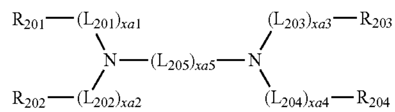

In Formulae 201 and 202, $L_{201}$ to $L_{205}$ may be understood by referring to the description provided herein in connection with $L_1$;

xa1 to xa4 may be eac hindependently selected from 0, 1, 2, and 3;

xa5 may be selected from 1, 2, 3, 4, and 5; and $R_{201}$ to $R_{204}$ may be understood by referring to the description provided herein in connection with $R_{21}$.

In an implementation, in Formulae 201 and 201, $L_{201}$ to $L_{205}$ may be each independently selected from;

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3; and $R_{201}$ to $R_{204}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, and a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but are not limited thereto.

The compound represented by Formula 201 may be represented by Formula 201A below.

<Formula 201A>

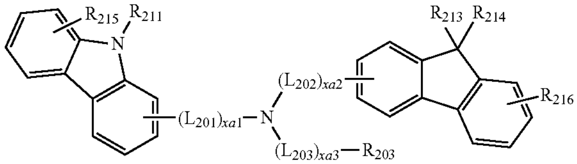

For example, the compound represented by Formula 201 may be represented by Formula 201A-1 below, but is not limited thereto.

<Formula 201A-1>

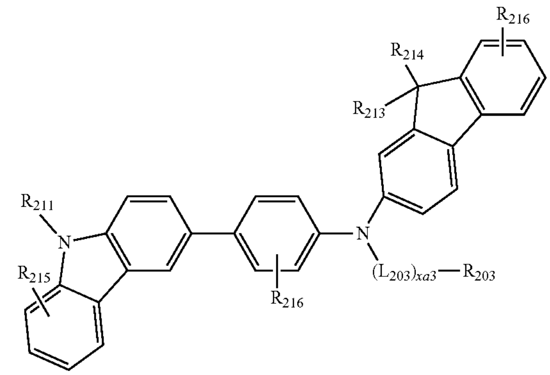

For example, the compound represented by Formula 202 may be represented by Formula 202A below, but is not limited thereto.

<Formula 202A>

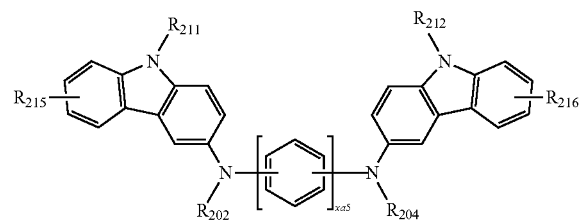

$L_{201}$ to $L_{203}$, xa1 to xa3, xa5, and $R_{202}$ to $R_{204}$ in Formulae 201A, 201A-1, and 202A are already described above, $R_{211}$ may be understood by referring to the description provided in connection with $R_{203}$, and $R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, and a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group and a monovalent non-aromatic condensed heterocyclic group.

In an implementation, in Formulae 201A, 201A-1, and 202A, $L_{201}$ to $L_{203}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, -F, -Cl, -Br, I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{203}$, $R_{211}$, and $R_{212}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, and a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, and a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, and a $C_1$-$C_{20}$ alkoxy;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be 1 or 2.

$R_{213}$ and $R_{214}$ in Formulae 201A and 201A-1 may bind to each other to form a saturated or unsaturated ring.

The compound represented by Formula 201 and the compound represented by Formula 201 may include compounds HT1 to HT20 illustrated below, but are not limited thereto.

HT1

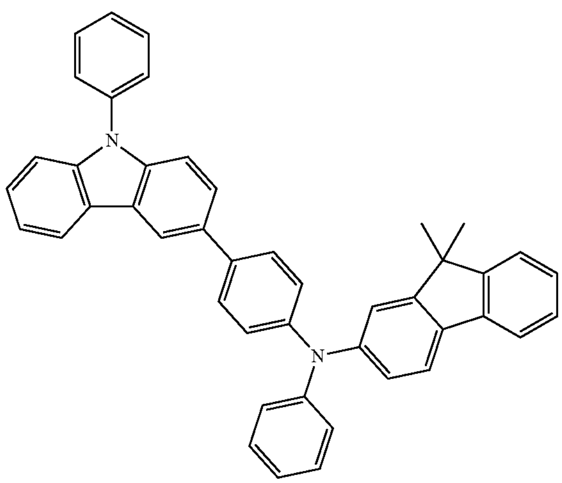

HT2

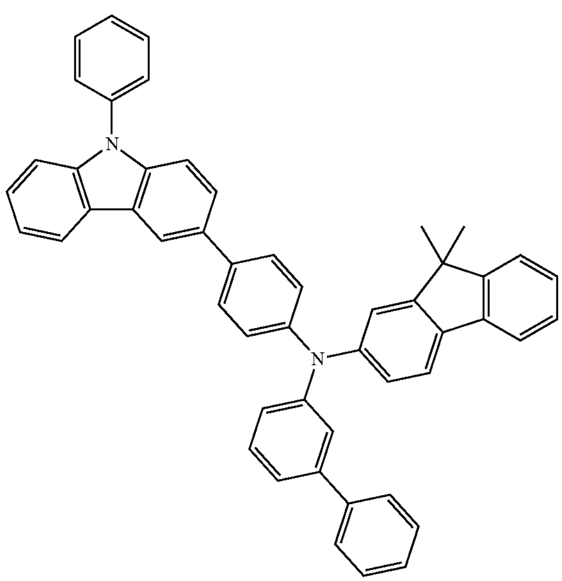

-continued

HT3

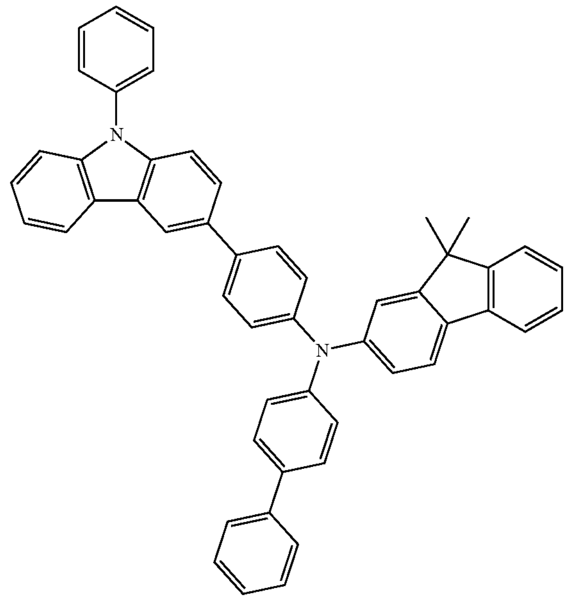

HT4

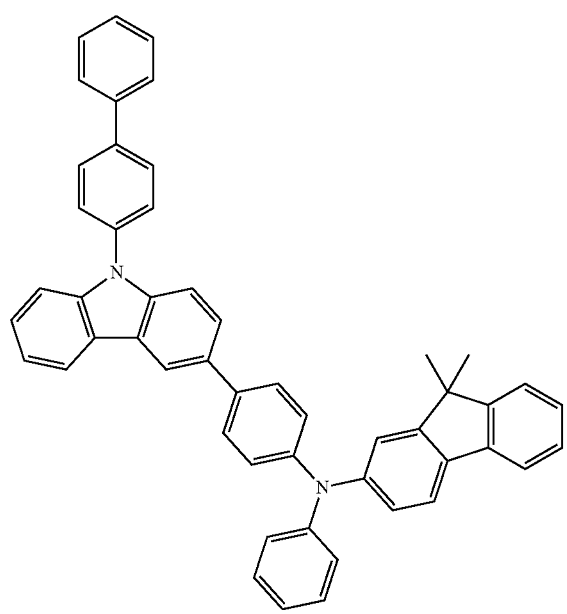

-continued
HT5
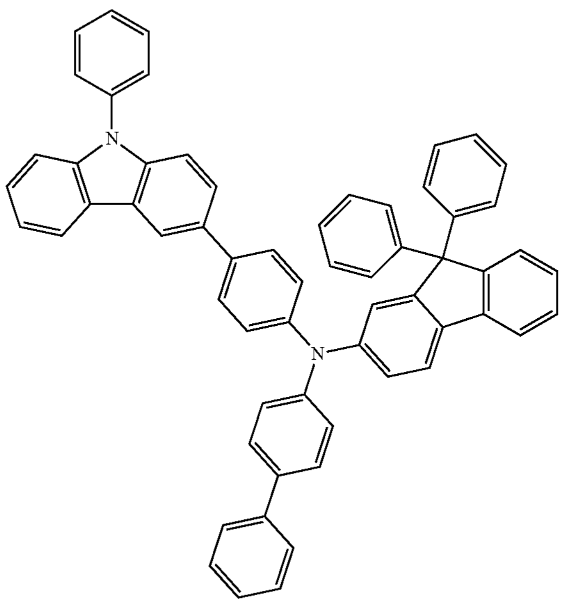
HT6
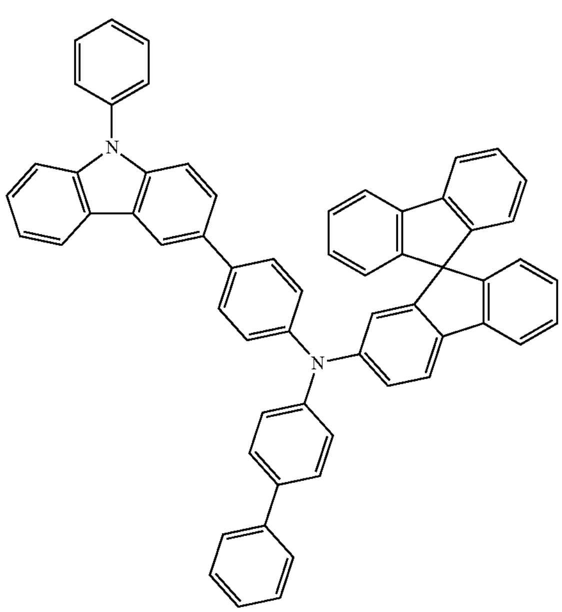
-continued
HT7
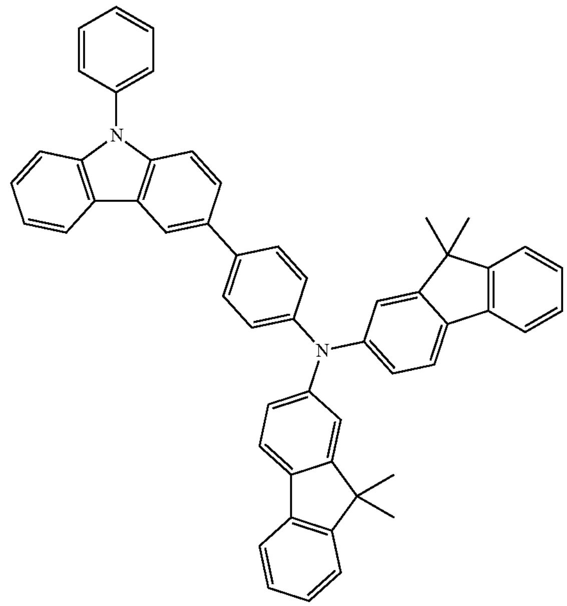
HT8
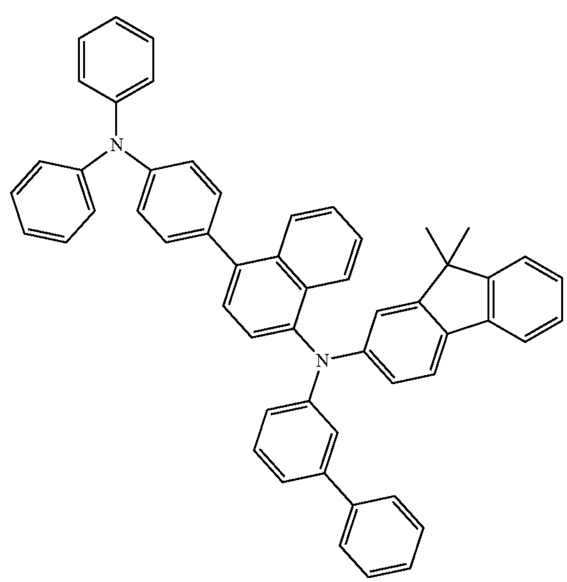

-continued
HT9
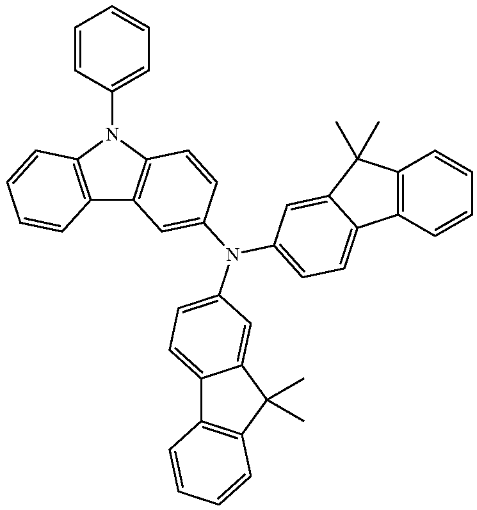
HT10
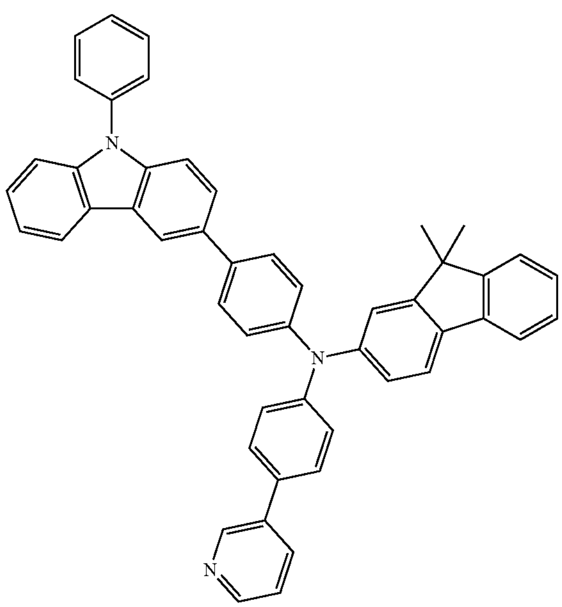
-continued
HT11
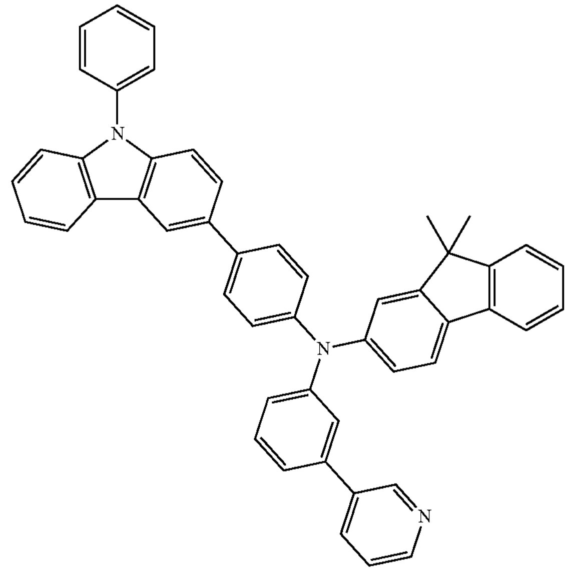
HT12
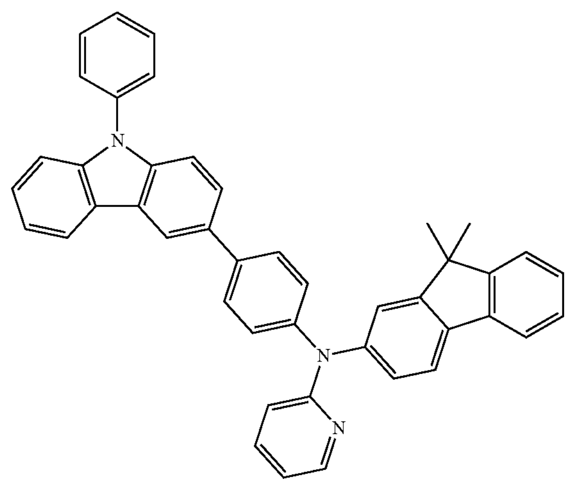
HT13
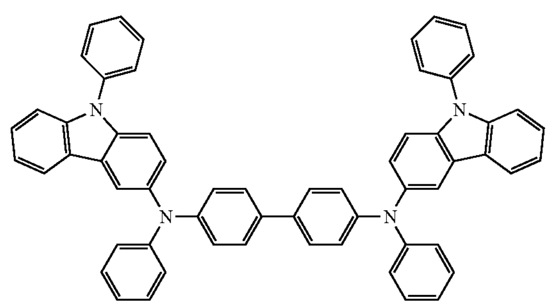

-continued

HT14

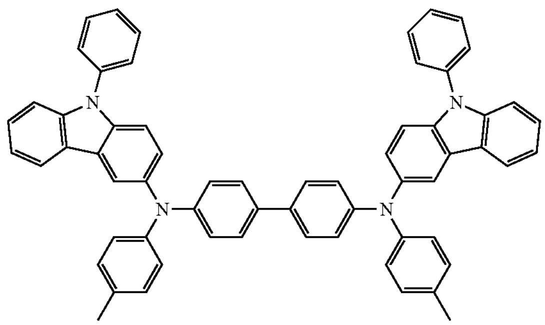

HT15

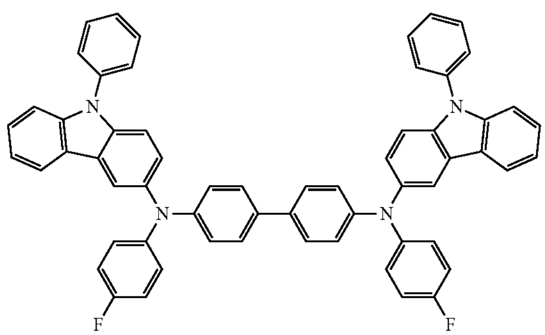

HT16

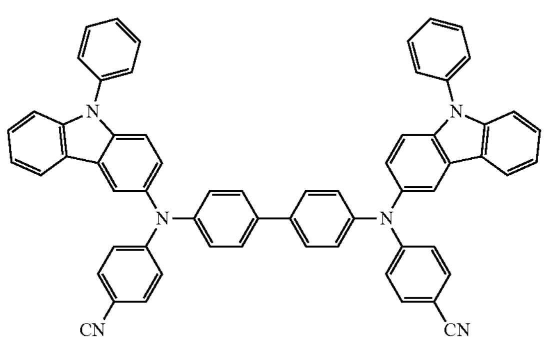

HT17

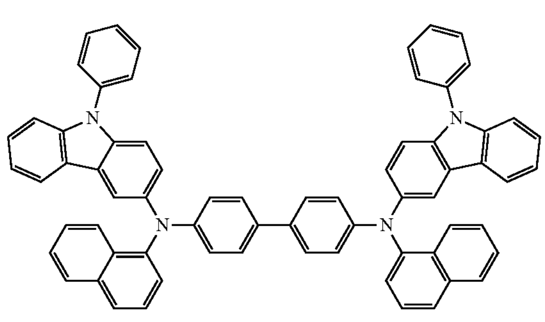

-continued

HT18

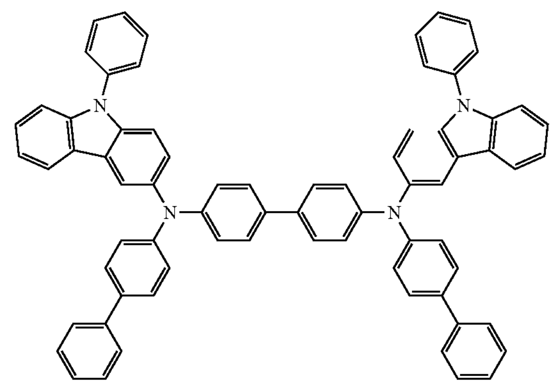

HT19

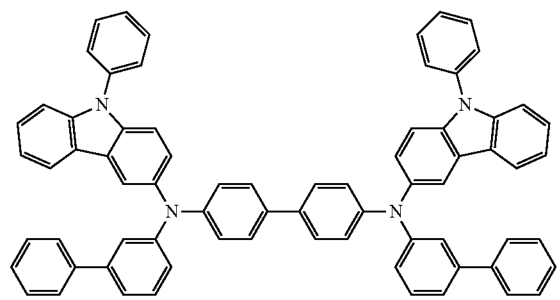

HT20

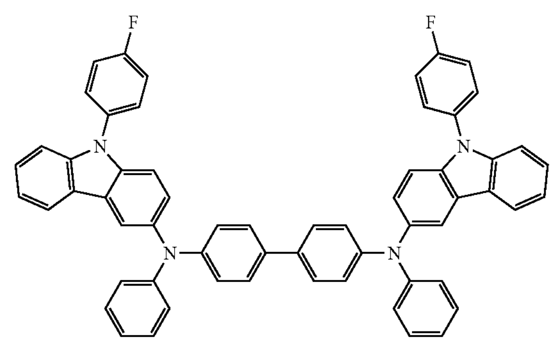

A thickness of the hole transport region may be about 100 Å to about 10,000 Å, e.g., about 100 Å to about 1,000 Å. When the hole transport region includes a hole injection layer and a hole transport layer, a thickness of the hole injection layer may be about 100 Å to about 10,000 Å, e.g., about 100 Å to about 1,000 Å, and a thickness of the hole transport layer may be about 50 Å to about 2,000 Å, e.g., about 100 Å to about 1,500 Å. When the thickness of the hole transport region, the hole injection layer, and the hole transport layer are within these rangtes, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, e.g., a p-dopant. The p-dopant may include, e.g., one of a quinone derivative, a metal oxide, and a cyano group-containing compound, but is not limited thereto. For example, non-limiting examples of the p-dopant may include a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and compound HT-D1 illustrated below, but are not limited thereto.

<Compound HT-D1>

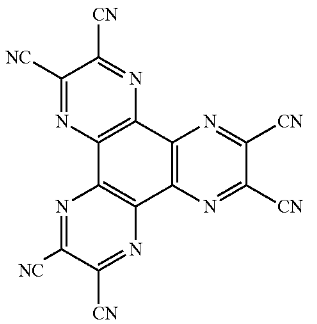

<F4-TCNQ>

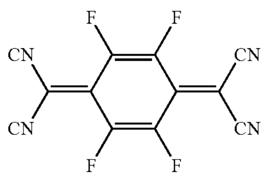

The hole transport region may further include, in addition to the hole injection layer and the hole transport layer, at least one of a buffer layer and an electron blocking layer. The buffer layer may help compensate for an optical resonance distance according to a wavelength of light emitted from the emission layer, and thus, a light-emission efficiency of a formed organic light-emitting device may be improved. For use as a material of the buffer layer, materials of the hole transport region may be used. The electron blocking layer may help prevent injection of electrons from the electron transport region.

An emission layer may be formed on the first electrode 110 or the hole transport region by using various methods, e.g., vacuum deposition, spin coating, casting, an LB method, ink-jet printing, laser-printing, or LITI. When the emission layer is formed by vacuum deposition and spin coating, deposition and coating conditions for the emission layer may be determined by referring to the deposition and coating conditions for the hole injection layer.

When the organic light-emitting device 10 is a full color organic light-emitting device, the emission layer may be patterned into a red emission layer, a green emission layer, and a blue emission layer, according to a sub-pixel. In some embodiments, the emission layer may have a stacked structure of a red emission layer, a green emission layer, and a blue emission layer, or may include a red-light emission material, a green-light emission material, and a blue-light emission material, which are mixed with each other in a single layer, to emit white light.

The emission layer may include a host and a dopant.

The host may include at least one selected from TPBi, TBADN, ADN (also referred to as "DNA"), CBP, CDBP, and TCP.

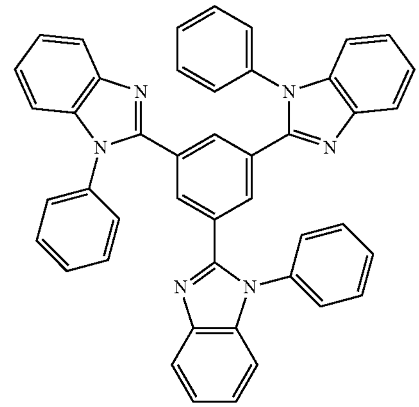

TPBI

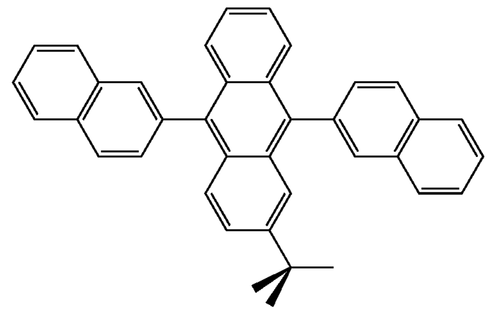

TBADN

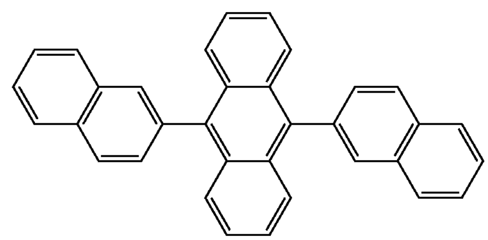

ADN

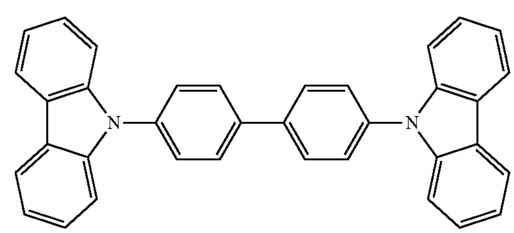

CBP

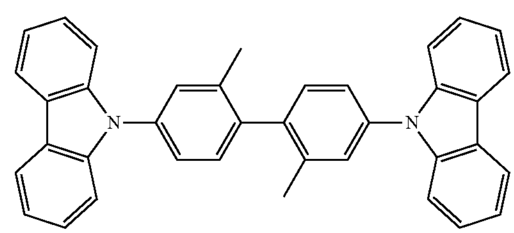

CDBP

-continued

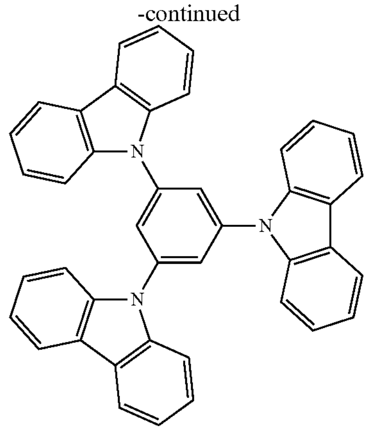

TCP

According to another embodiment, the host may include a compound represented by Formula 301 below.

$Ar_{301}$-[$(L_{301})_{xb1}$-$R_{301}$]$_{xb2}$ <Formula 301>

In Formula 301, $Ar_{301}$ may be selected from:

a naphthalene, a heptalene, a fluorenene, a spiro-fluorenene, a benzofluorenene, a dibenzofluorenene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorenene, a spiro-fluorenene, a benzofluorenene, a dibenzofluorenene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, -F, -Cl, -Br, -I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$-cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group and —Si($Q_{301}$)($Q_{302}$)($Q_{303}$) (wherein $Q_{301}$ to $Q_{303}$ are each independently selected from a hydrogen, a $C_1$-$C_{60}$ alkyl group, a $C_2$-$C_{60}$ alkenyl group, a $C_6$-$C_{60}$ aryl group, and a $C_2$-$C_{60}$ heteroaryl group);

$L_{301}$ may be understood by referring to the description provided in connection with $L_{201}$:

$R_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xb1 may be selected from 0, 1, 2, and 3; and xb2 may be selected from 1, 2,3, and 4.

In this regard, in Formula 301, $L_{301}$ may be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid, and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and $R_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

a phenyl group, a naphthyl group, a fluorenyl group, a spiro-fluorenyl group, a benzofluorenyl group, a dibenzofluorenyl group, a phenanthrenyl group, an anthraceyl group, a pyrenyl group, and a chrysenyl group; and a phenyl group, a naphthyl group, a fluorenyl group, a spiro-fluorenyl group, a benzofluorenyl group, a dibenzofluorenyl group, a phenanthrenyl group, an anthraceyl group, a pyrenyl group, and a chrysenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, but they are not limited thereto.

For example, the host may include a compound represented by Formula 301A below.

<Formula 301A>

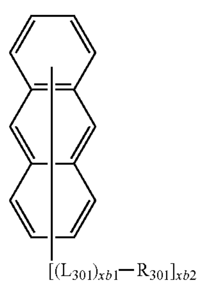

Substituents of Formula 301A may be the same as those that are already described above.

The compound represented by Formula 301 may include at least one of Compounds H1 to H42 below. However, the compound represented by 301A is not limited thereto.

H1

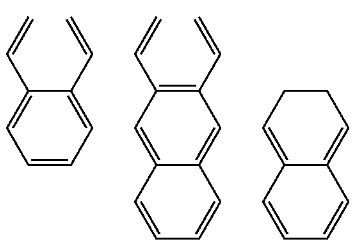

H2

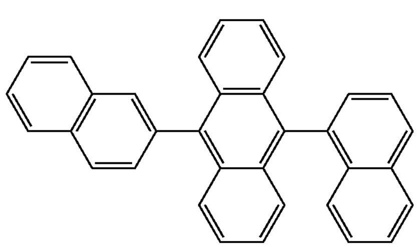

-continued

H3

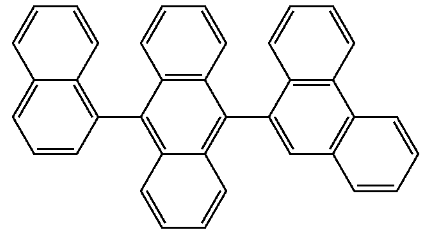

H4

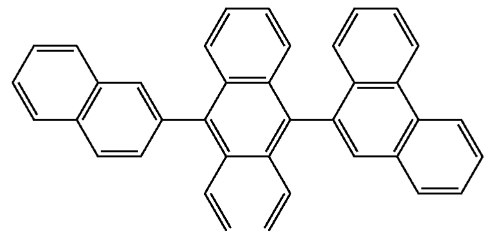

H5

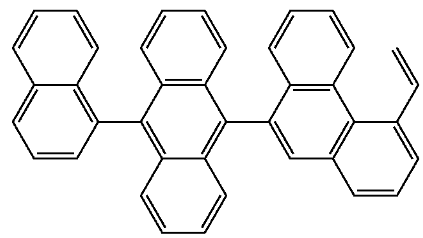

H6

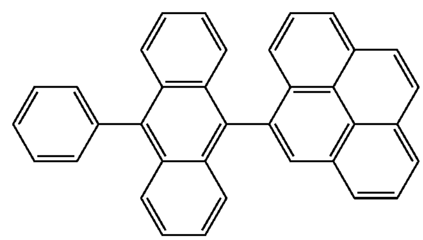

H7

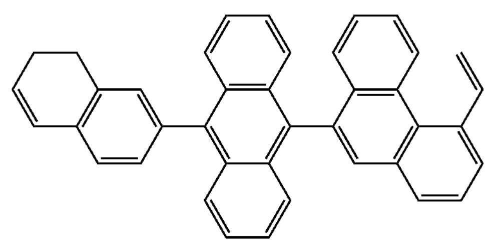

H8

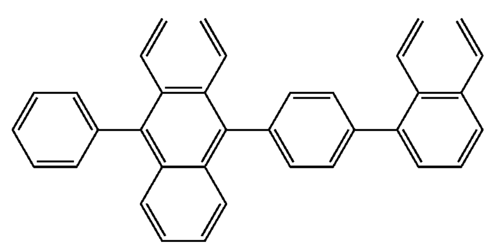

-continued
H9
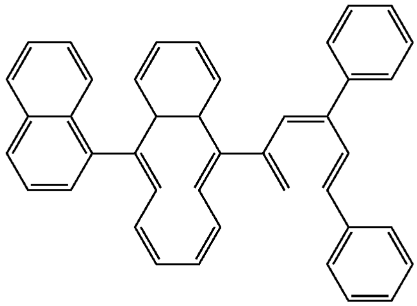
H10
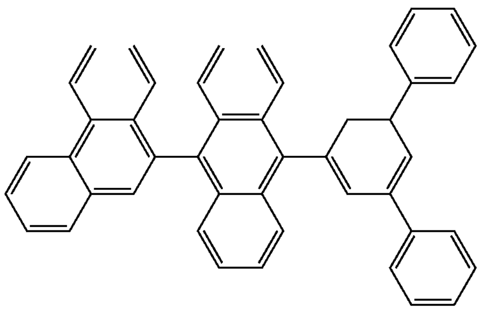
H11
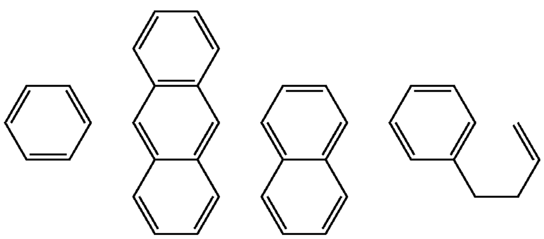
H12
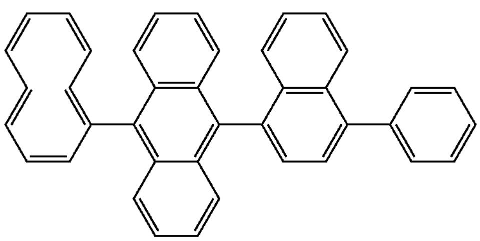
H13
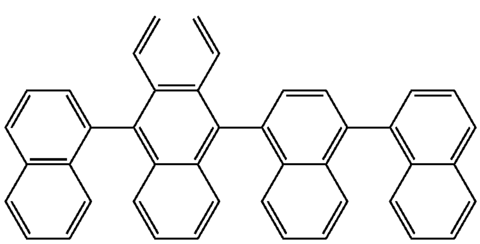
H14
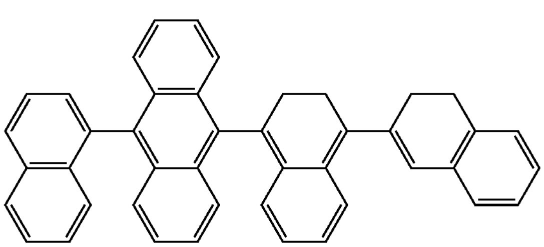
-continued
H15
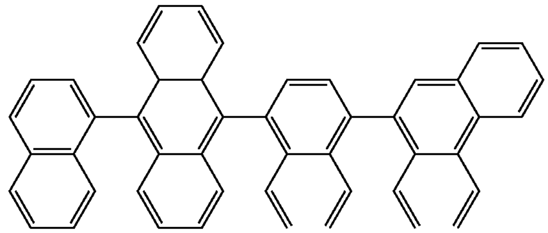
H16
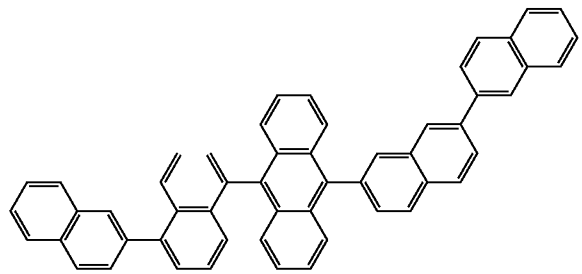
H17
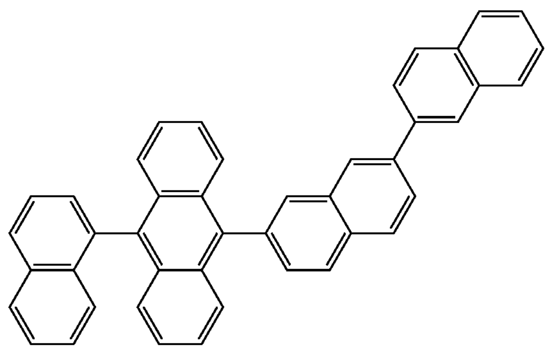
H18
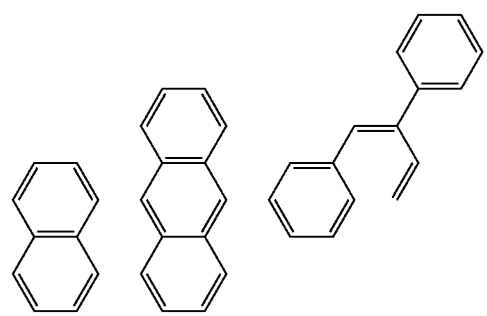
H19
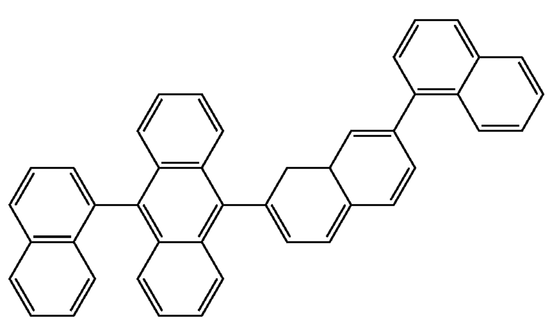

-continued
H20
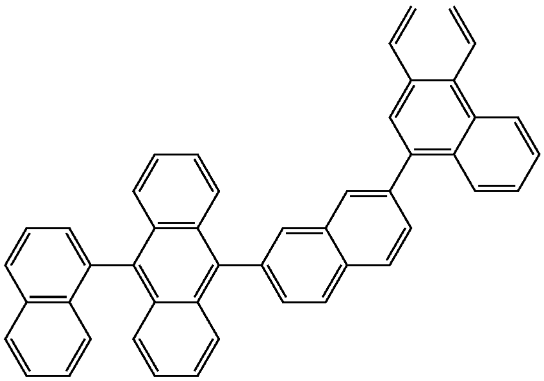
H21
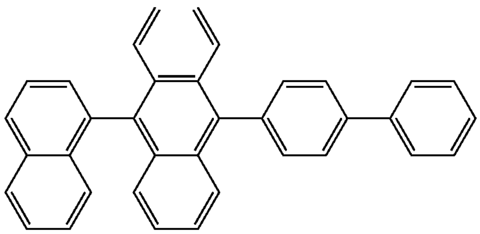
H22
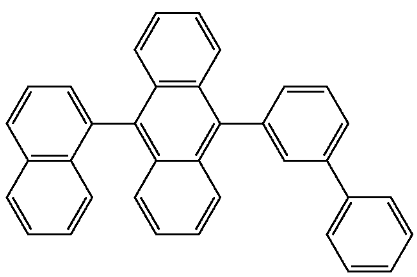
H23
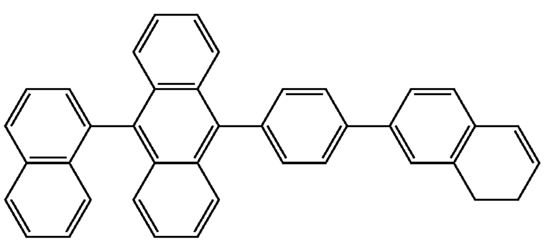
H24
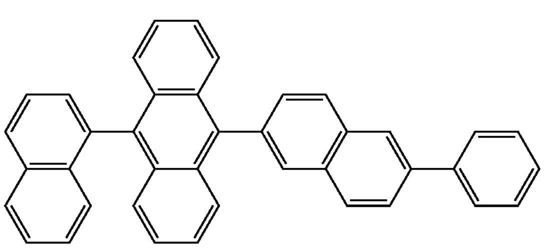
-continued
H25
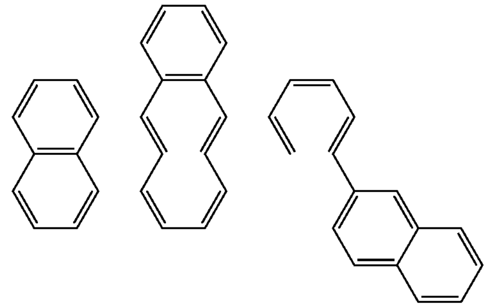
H26
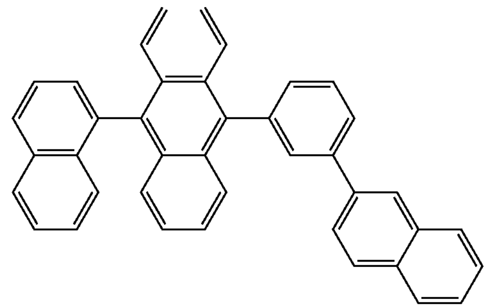
H27
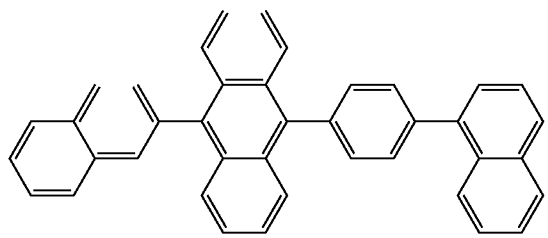
H28
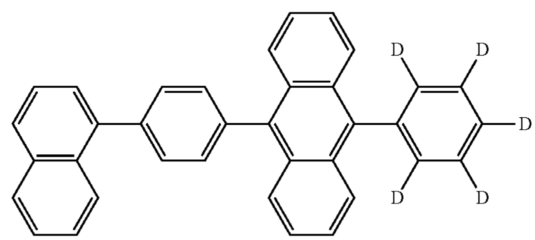
H29
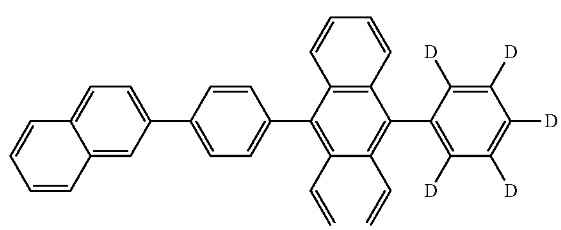
H30
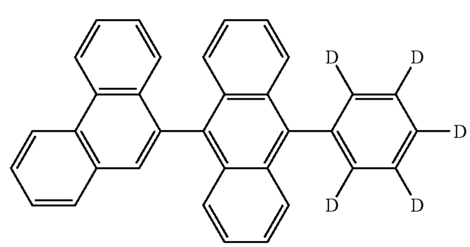

-continued
H31
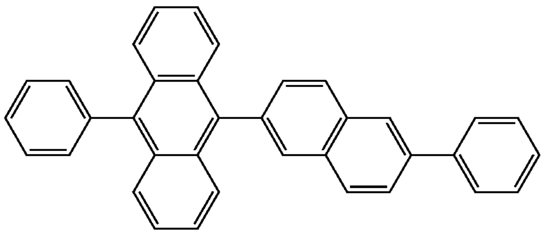
H32
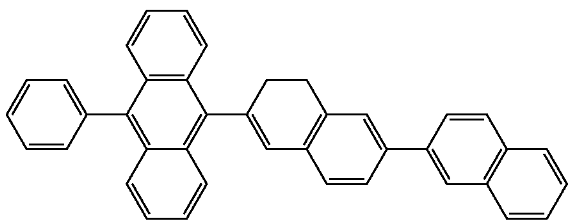
H33
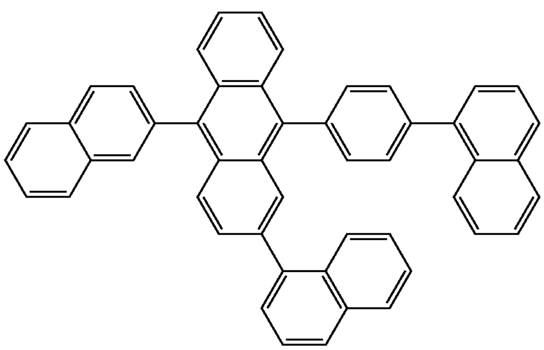
H34
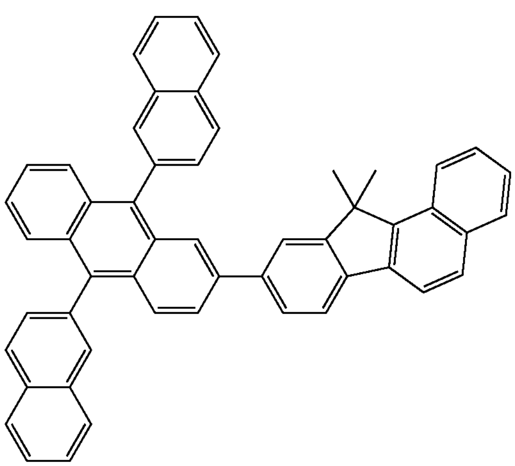
-continued
H35
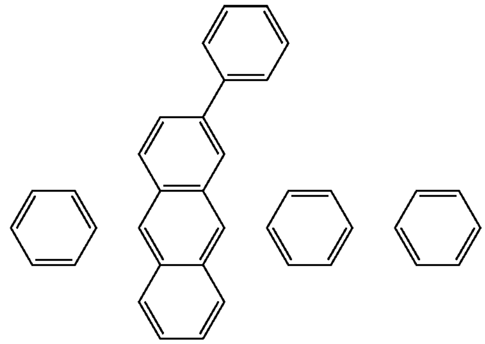
H36
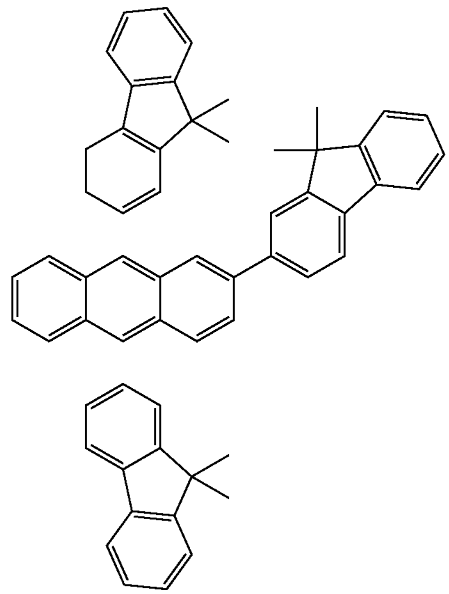
H37
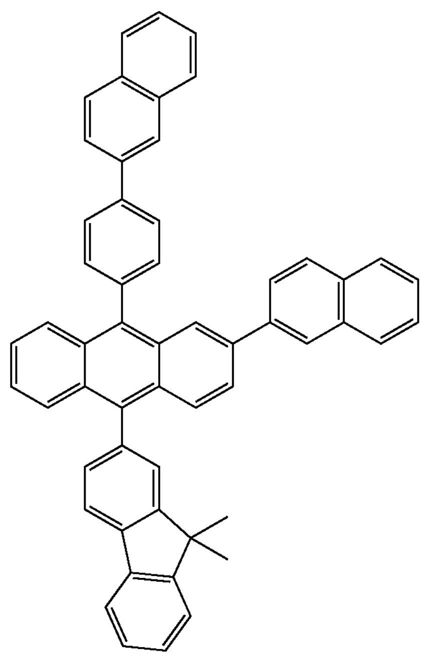

-continued
H38
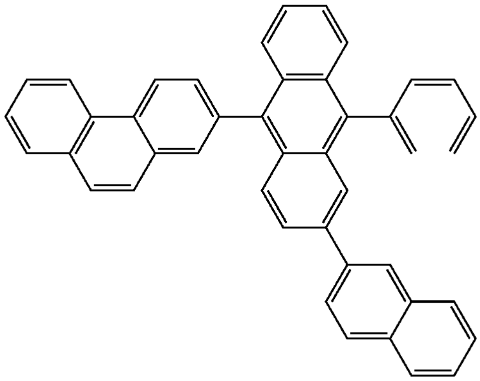
H39
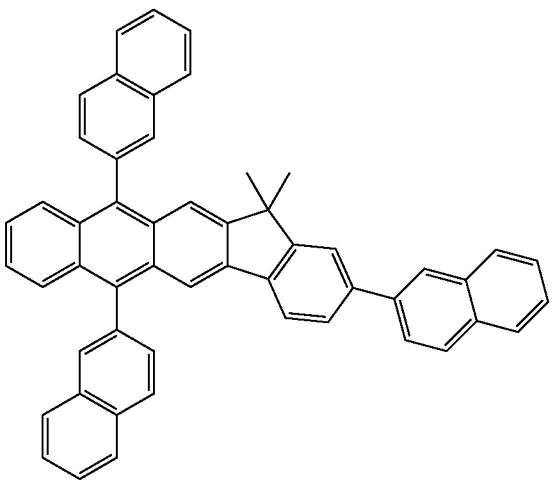
H40
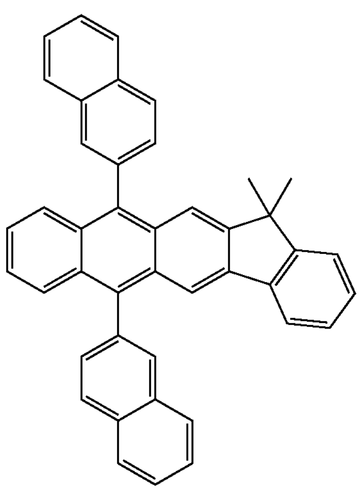
-continued
H41
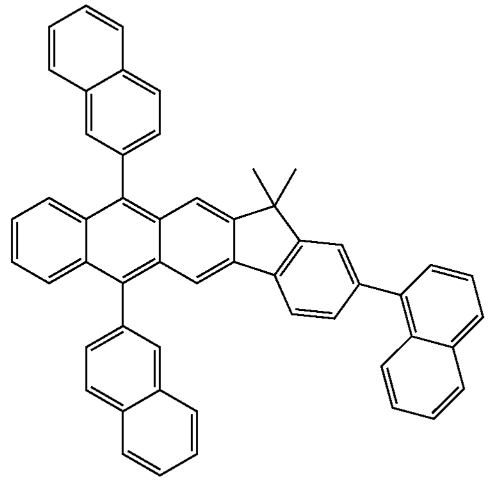
H42
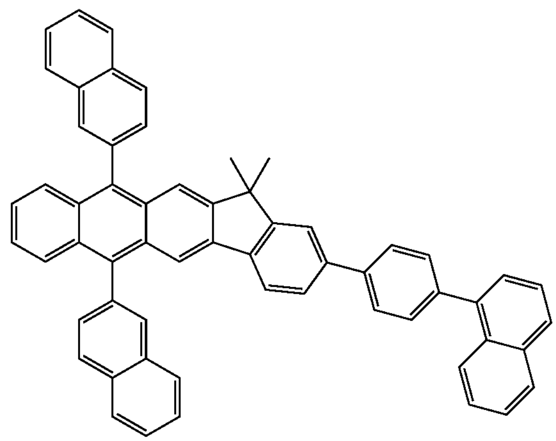
According to another embodiment, the host may include at least one of Compounds H43 to H40 below. However, the host is not limited thereto.
H43
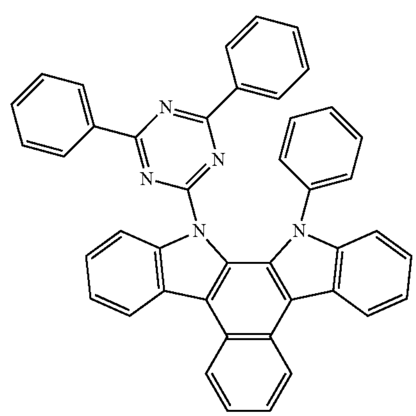

-continued
H44
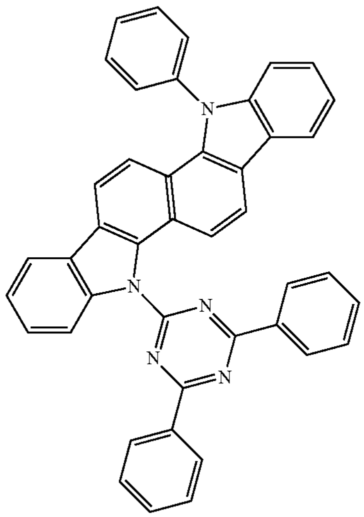
H45
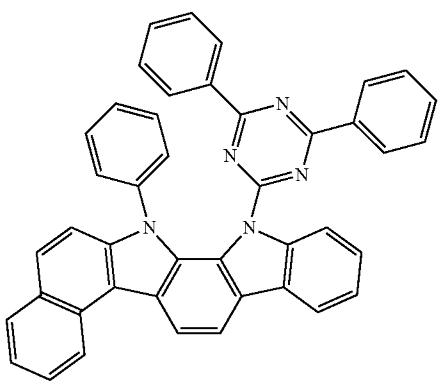
H46
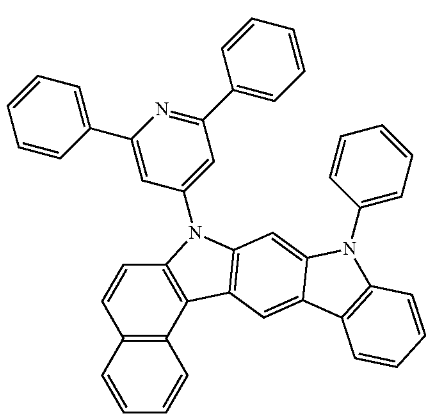
-continued
H47
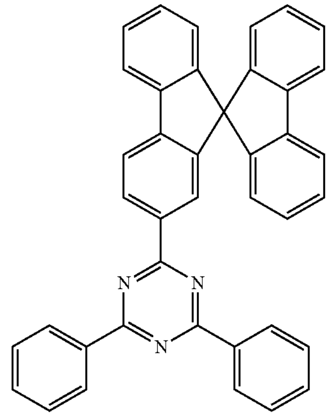
H48
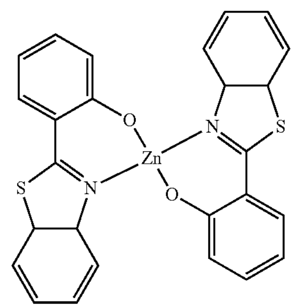
H49
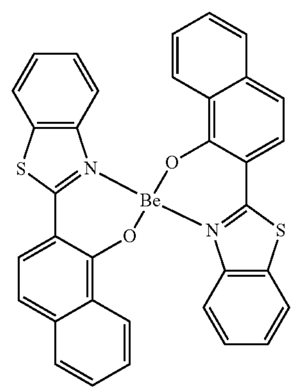
The dopant may include at least one selected front a fluorescent dopant and a phosphorescent dopant.
The phosphorescent dopant may include an organometallic complex represented by Formula 401 below.
<Formula 401>
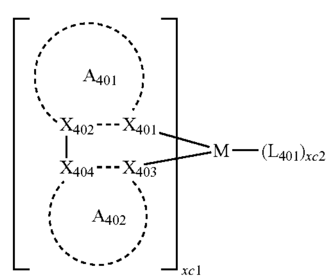

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may be each independently nitrogen or carbon;

$A_{401}$ and $A_{402}$ rings may be each independently selected from a substituted or unsubstituted benzene, a substituted or unsubstituted naphthalene, a substituted or unsubstituted fluorenene, a substituted or unsubstituted spiro-fluorenene, a substituted or unsubstituted indene, a substituted or unsubstituted pyrrol, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazol, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzooxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene; and a substituent of at least one selected from the substituted benzene, substituted naphthalene, substituted fluorenene, substituted spiro-fluorenene, substituted indene, substituted pyrrol, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazol, substituted benzoimidazole, substituted benzofuran, substituted benzothiophene, substituted isobenzothiophene, substituted benzoxazole, substituted isobenzoxazole, substituted triazole, substituted oxadiazole, substituted triazine, substituted dibenzofuran, and substituted dibenzothiophene may be selected from:

a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed cyclic group, a monovalent non-aromatic condensed heteropolycyclic group —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$-cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$); and Let $L_{401}$ may be an organic ligand;

xc1 may be 1, 2, or 3; and xc2 may be 0, 1, 2, or 3.

$L_{401}$ may be a monovalent, divalent, or trivalent organic ligand. For example, $L_{401}$ may be selected from a halogen ligand (for example, Cl or F), a diketone ligand (for example, acetylacetonate, 1,3-diphenyl-1,3-propandionate, 2,2,6,6-tetramentyl-3,5-heptandionate, or hexafluoroacetonate), a carboxylic acid ligand (for example, picolinate, dimethyl-3-pyrazolecarboxylate, or benzoate), a carbon mono-oxide ligand, an isonitrile ligand, a cyano ligand, and a phosphorous ligand (for example, phosphine or phosphite), but is not limited thereto.

When $A_{401}$ in Formula 401 has two or more substituents, the substituents of $A_{401}$ may bind to each other to form a saturated or unsaturated ring.

When $A_{402}$ in Formula 401 has two or more substituents, the substituents of $A_{402}$ may bind to each other to form a saturated or unsaturated ring.

When xc1 in Formula 401 is two or more, a plurality of ligands

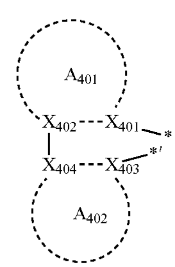

in Formula 401 may be identical to or different from each other. When xc1 in Formula 401 is two or more, $A_{401}$ and $A_{402}$ may be respectively directly connected to $A_{401}$ and $A_{402}$ of other neighboring ligands, or $A_{401}$ and $A_{402}$ may be respectively connected to $A_{401}$ and $A_{402}$ of other neighboring ligands with a linker (for example, a $C_1$-$C_5$ alkylene, or —N(R')— (wherein R' may be a $C_1$-$C_{10}$ alkyl group or a $C_6$-$C_{20}$ aryl group) or —C(═O)—) therebetween.

The phosphorescent dopant may include at least one of Compounds PD1 to PD74 below, but is not limited thereto.

PD1

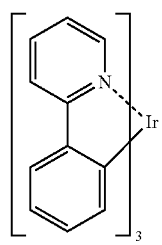

PD2

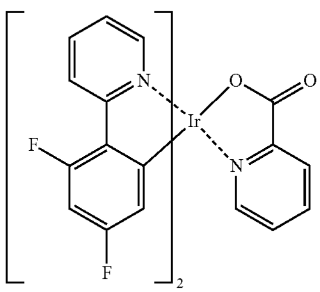

PD3

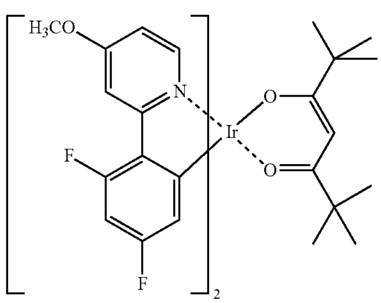

PD4

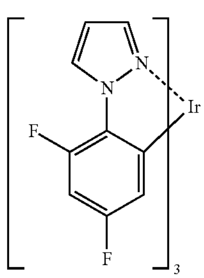

-continued

PD5

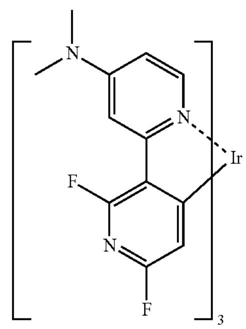

PD6

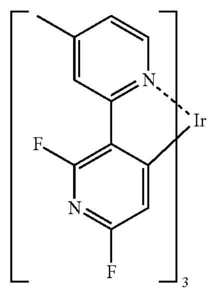

PD7

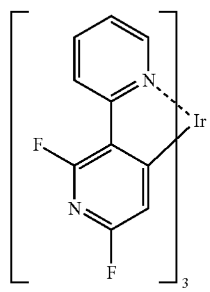

PD8

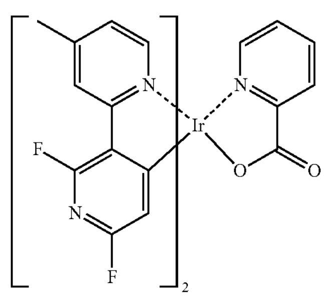

PD9

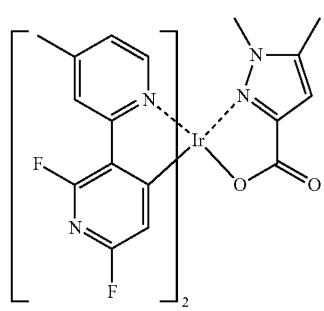

-continued
PD10
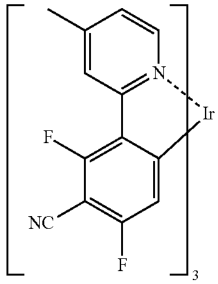
PD11
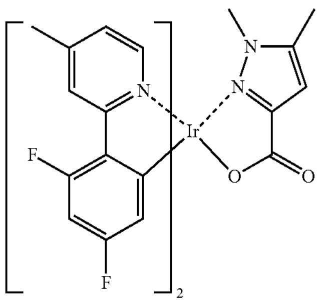
PD12
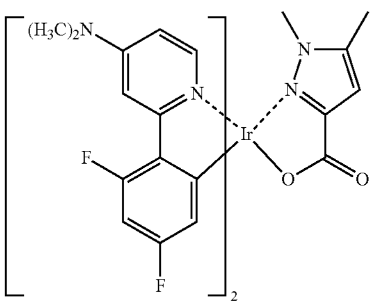
PD13
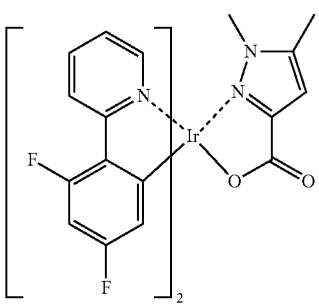
PD14
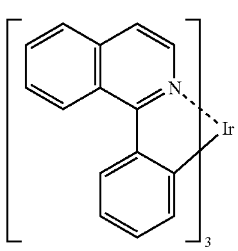
-continued
PD15
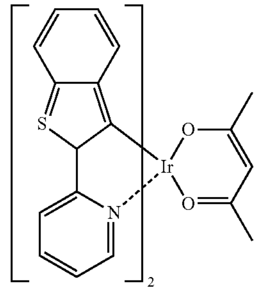
PD16
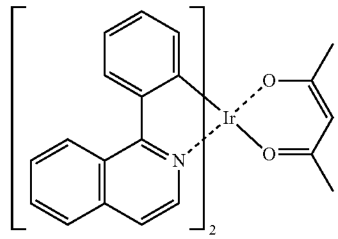
PD17
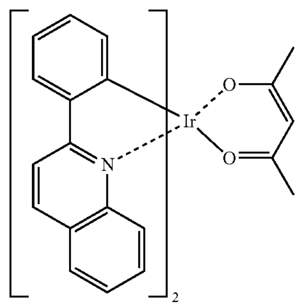
PD18
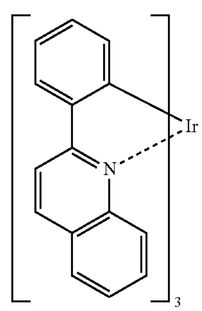
PD19
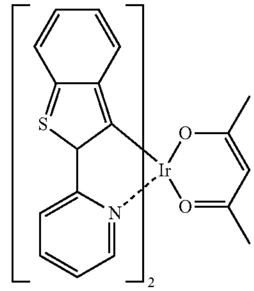

-continued
PD20
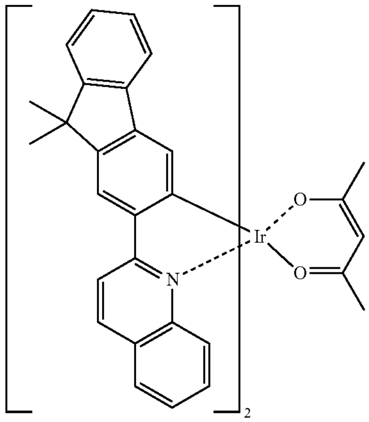
PD21
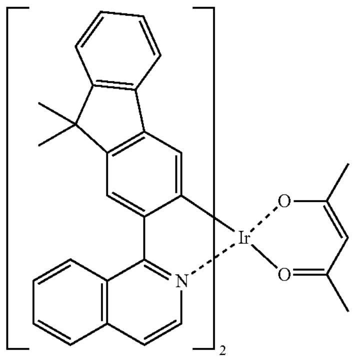
PD22
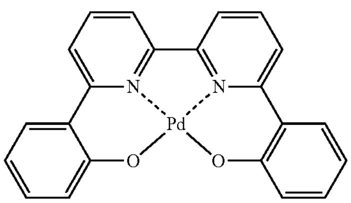
PD23
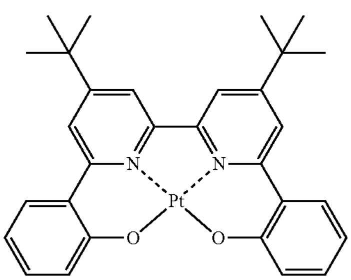
PD24
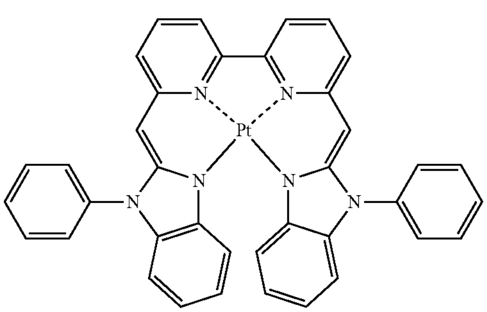
-continued
PD25
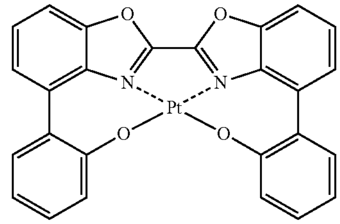
PD26
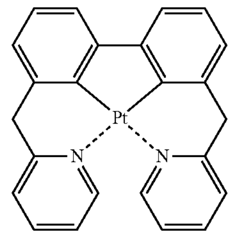
PD27
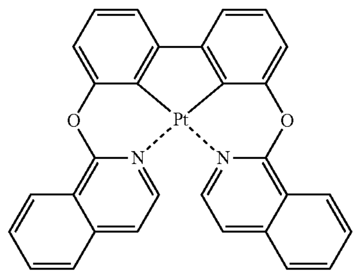
PD28
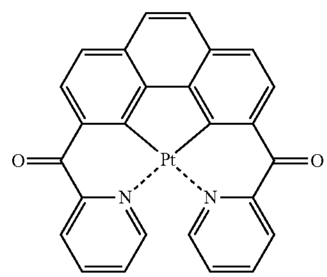
PD29
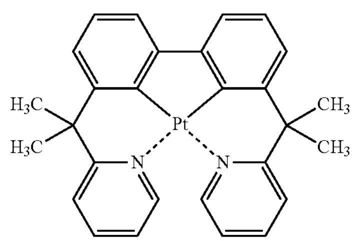
PD30
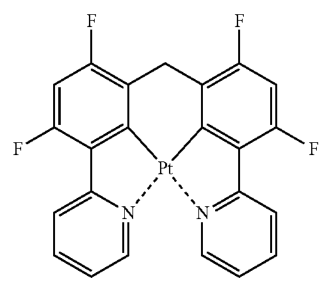

-continued
PD31
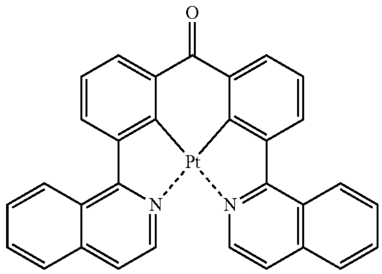
PD32
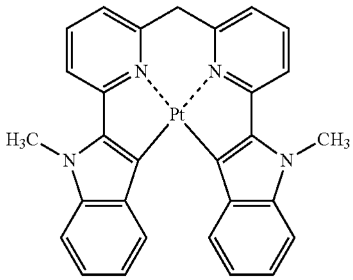
PD33
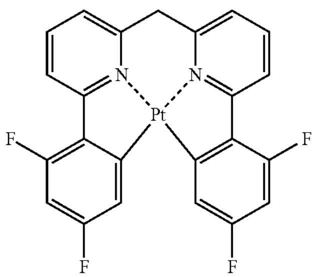
PD34
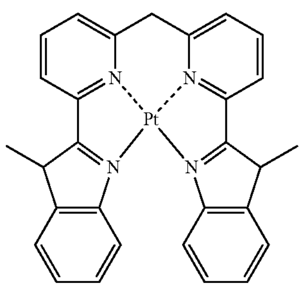
PD35
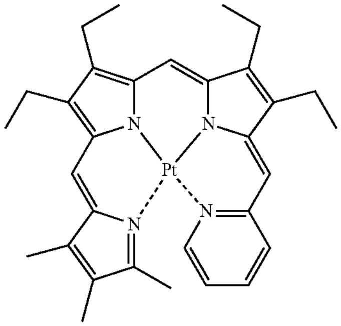
-continued
PD36
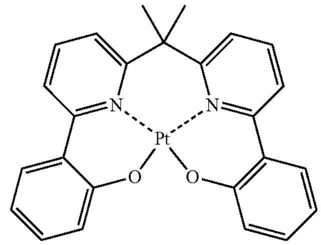
PD37
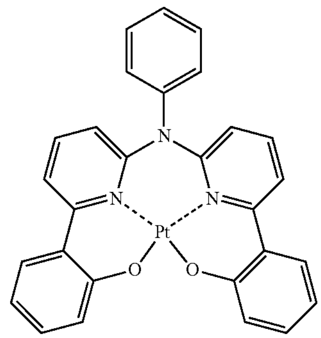
PD38
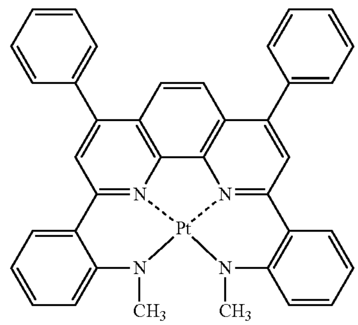
PD39
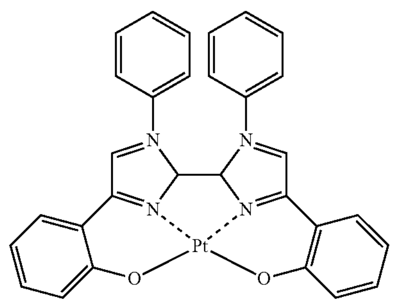
PD40
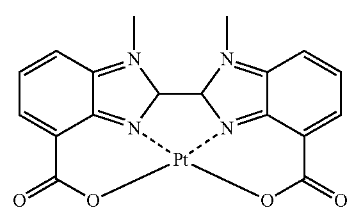
PD41
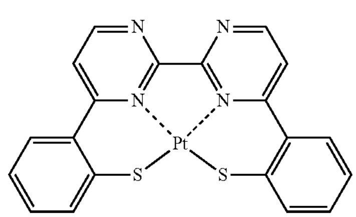

-continued
PD42
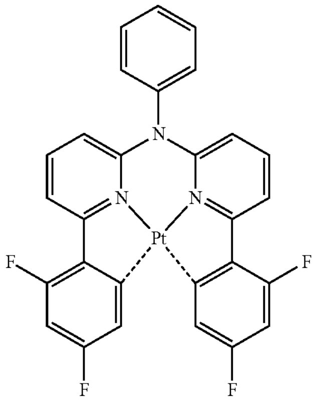
PD43
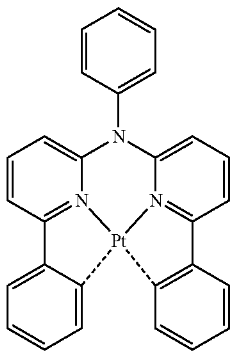
PD44
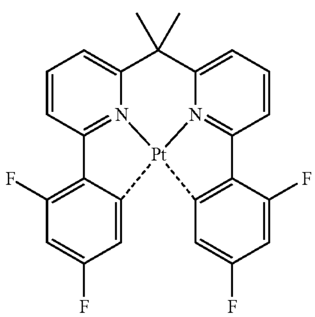
PD45
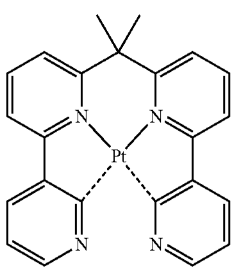
PD46
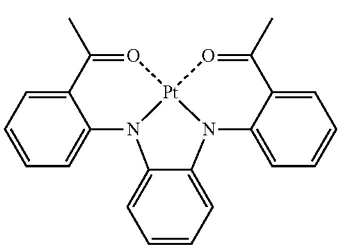
-continued
PD47
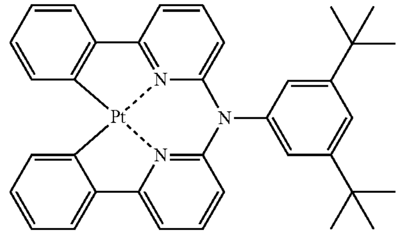
PD48
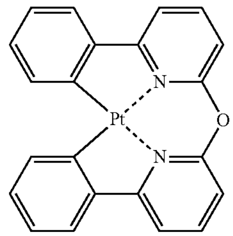
PD49
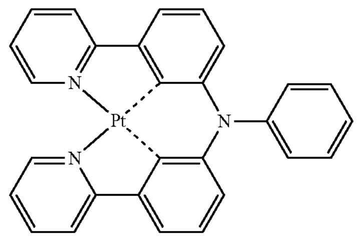
PD50
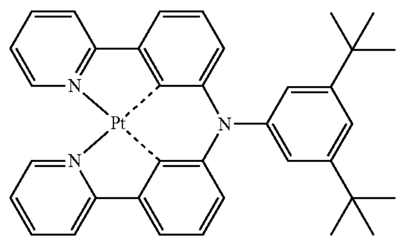
PD51
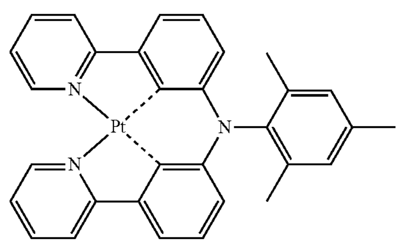
PD52
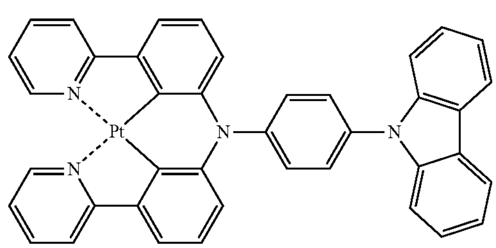

-continued
PD53
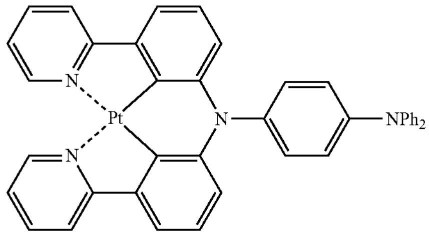
PD54
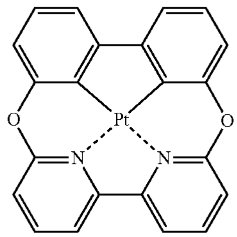
PD55
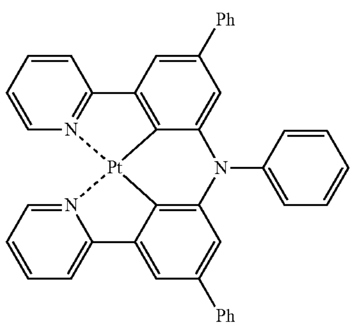
PD56
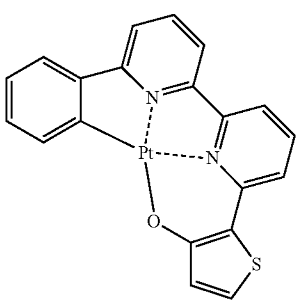
PD57
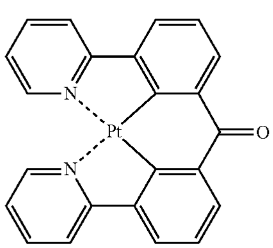
-continued
PD58
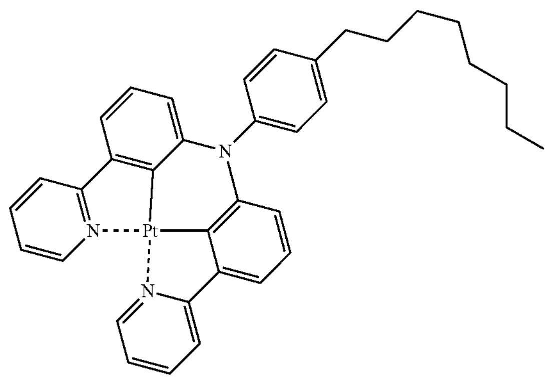
PD59
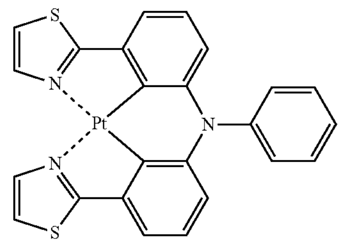
PD60
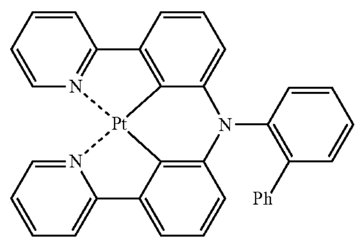
PD61
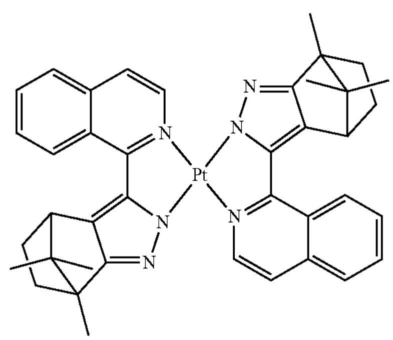
PD62
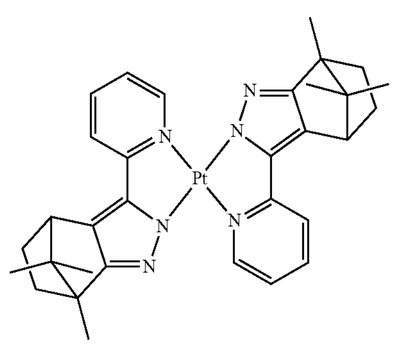

-continued
PD63
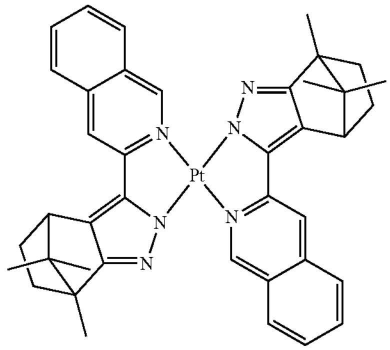
PD64
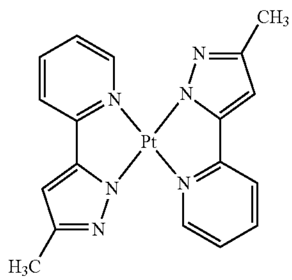
PD65
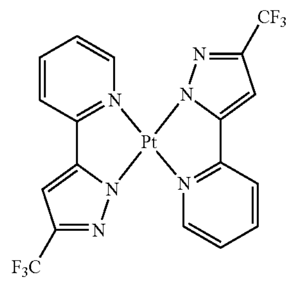
PD66
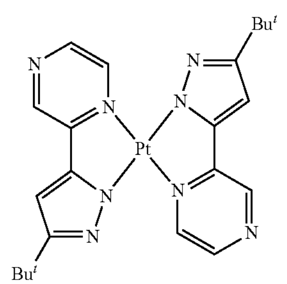
PD67
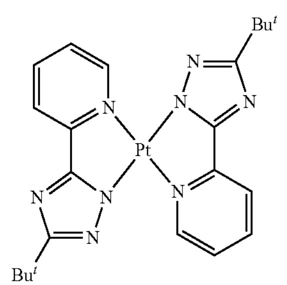
-continued
PD68
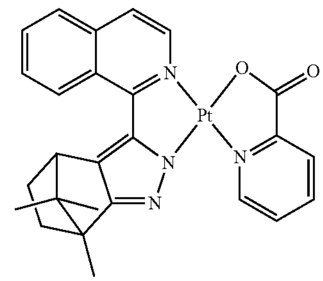
PD69
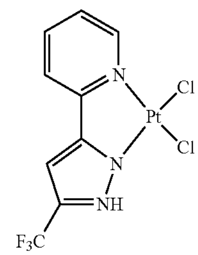
PD70
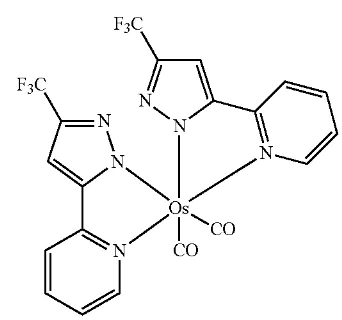
PD71
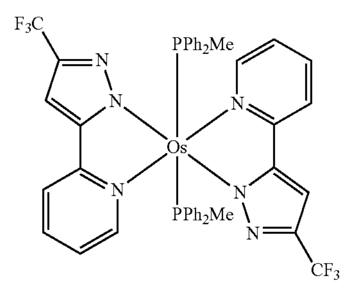
PD72
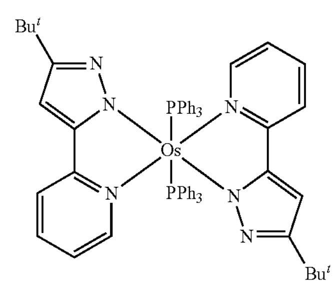

-continued
PD73
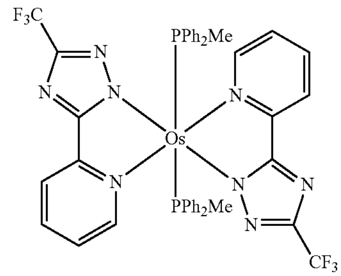
PD74
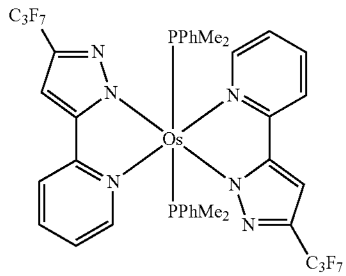
In an implementation, the phosphorescent dopant may include PtOEP below.
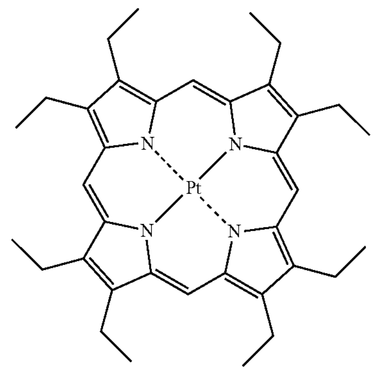
PtOEP
The fluorescent dopant may include at least one selected from DPAVBi, BDAVBi, TBPe, DCM, DCJTB, Coumarin 6, and C545T below.
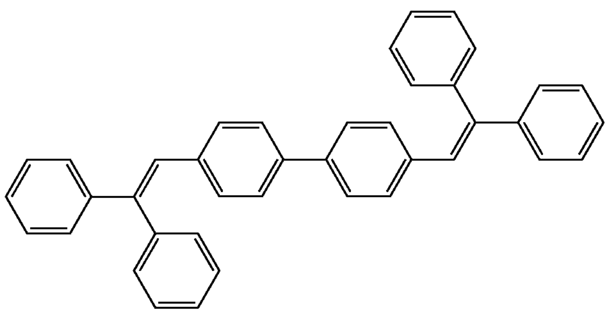
DPVBi
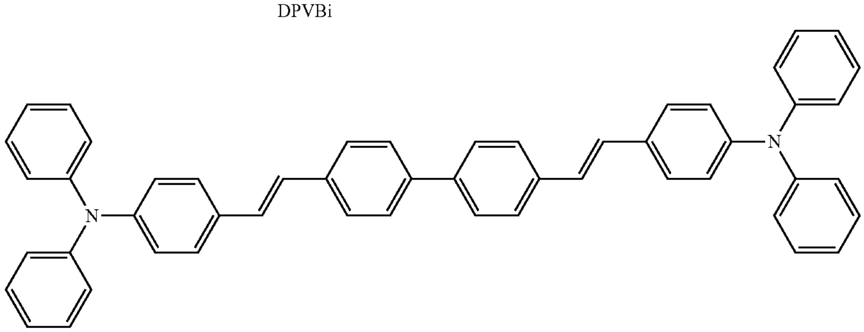
DPAVBi
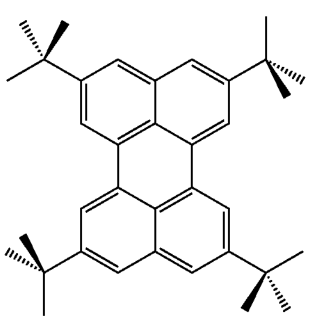
TBPe
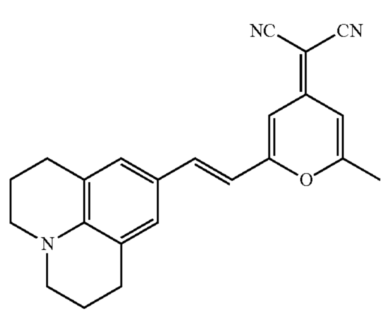
DCM
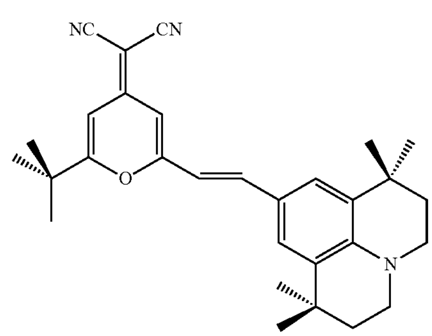
DCJTB -continued

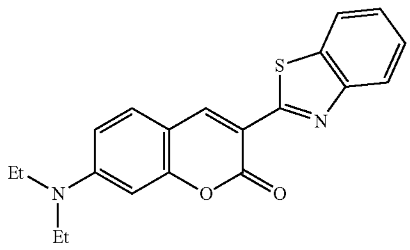

Coumarin 6

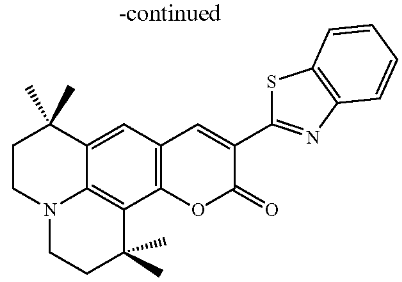

C545T

In an implementation, the fluorescent dopant may include a compound represented by Formula 501 below.

<Formula 501>

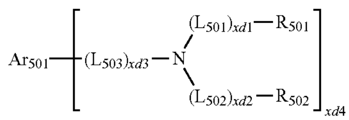

In Formula 501, $Ar_{501}$ may be selected from:

a naphthalene, a heptalene, a fluorenene, a spiro-fluorenene, a benzofluorenene, a dibenzofluorenene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorenene, a spiro-fluorenene, a benzofluorenene, a dibenzofluorenene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$-cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group and —Si($Q_{501}$)($Q_{502}$)($Q_{503}$) (wherein $Q_{501}$ to $Q_{503}$ are each independently selected from a hydrogen, a $C_1$-$C_{60}$ alkyl group, a $C_2$-$C_{60}$ alkenyl group, a $C_6$-$C_{60}$ aryl group, and a $C_2$-$C_{60}$ heteroaryl group);

$L_{501}$ to $L_{503}$ may be understood by referring to the description provided in connection with $L_{201}$;

$R_{501}$ and $R_{502}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a dibenzofuranyl group, and a dibenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a dibenzofuranyl group, and a dibenzothiophenyl group; and xd1 to xd3 may be each independently selected from 0, 1, 2, and 3; and xb4 may be selected from 1, 2, 3, and 4.

The fluorescent host may include at least one of Compounds FD1 to FD8 below.

FD1

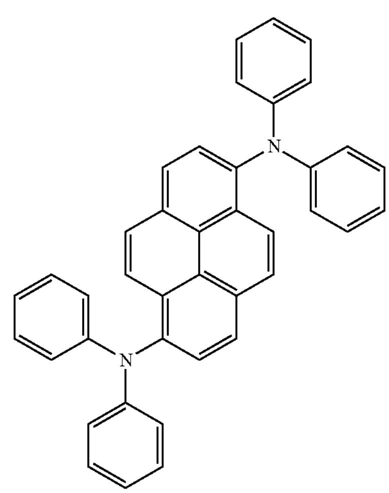

-continued
FD2
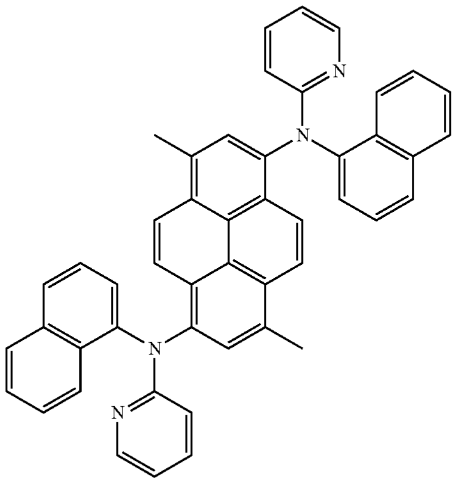
FD3
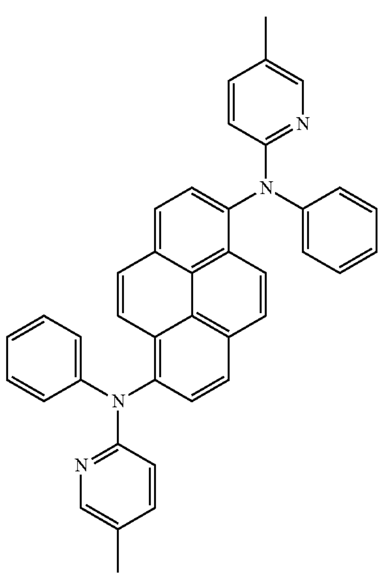
-continued
FD4
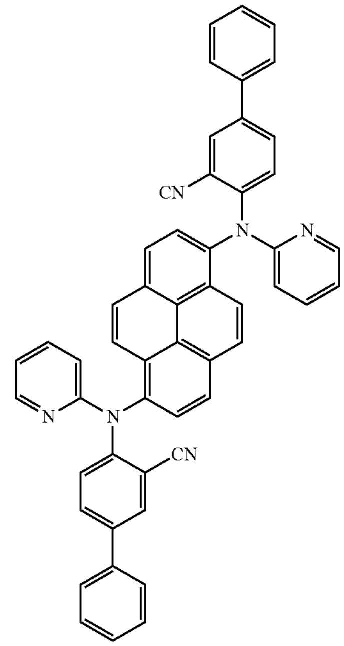
FD5
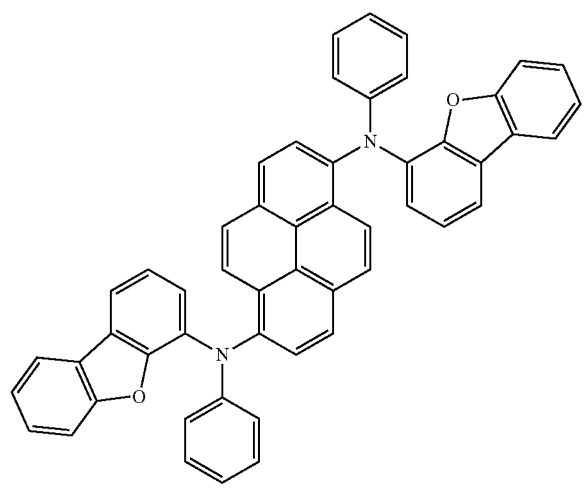
FD6
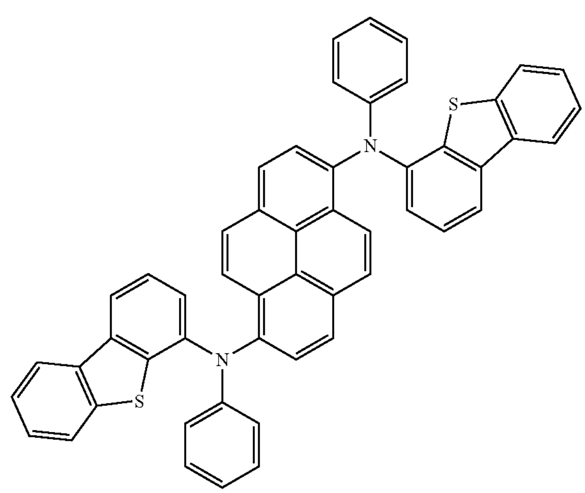

-continued

FD7

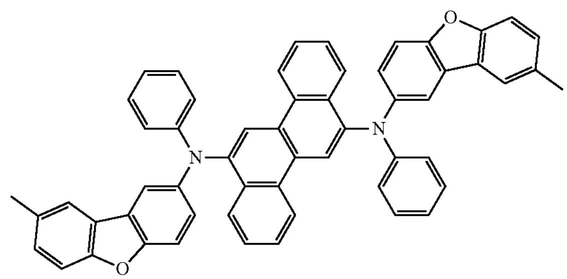

FD8

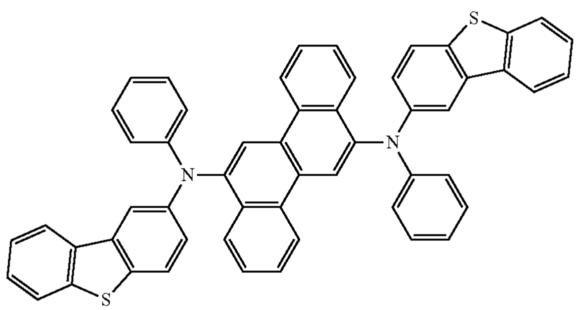

An amount of the dopant in the emission layer may be, e.g., about 0.01 to about 15 parts by weight, based on 100 parts by weight of the host, but is not limited thereto.

A thickness of the emission layer may be about 100 Å to about 1,000 Å, e.g., about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer, but is not limited thereto.

For example, the electron transport region may have a structure of electron transport layer/electron injection layer or a structure of hole blocking layer/electron transport layer/electron injection layer, wherein layers of each structure are sequentially stacked from the emission layer in the stated order, but is not limited thereto.

According to an embodiment, the organic layer 150 of the organic light-emitting device may include an electron transport region between the emission layer and the second electrode 190, wherein the electron transport region includes the condensed cyclic compound represented by Formula 1.

The electron transport region may include a hole blocking layer. When the emission layer includes a phosphorescent dopant, the hole blocking layer may help prevent diffusion of triplet excitons or holes into an electron transport layer.

When the electron transport region includes a hole blocking layer, the hole blocking layer may be formed on the emission layer by using various methods, such as vacuum deposition, spin coating casting, an LB method, ink-jet printing, laser-printing, or LITL. When the hole blocking layer is formed by vacuum deposition and spin coating, deposition and coating conditions for the hole blocking layer may be determined by referring to the deposition and coating conditions for the hole injection layer.

The hole blocking layer may include, e.g., at least one of BCP and Bphen below, but is not limited thereto.

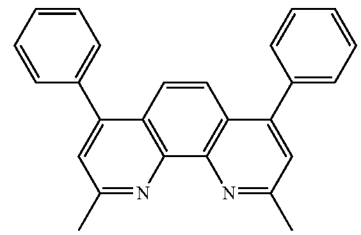

BCP

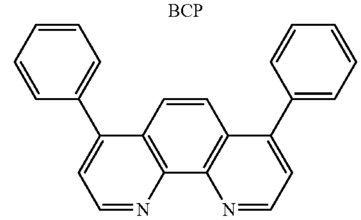

Bphen

A thickness of the hole blocking layer may he about 20 Å to about 1,000 Å, e.g., about 30 Å to about −300 Å. When the thickness of the hole blocking layer is within these ranges, the hole blocking layer may have excellent hole blocking characteristics without a substantial increase in driving voltage.

The electron transport region may include an electron transport layer. The electron transport layer may be formed on the emission layer or the hole blocking layer by using various methods, such as vacuum deposition, spin coating casting, an LB method, ink-jet printing, laser-printing, or LITI. When an electron transport layer is formed by vacuum deposition and spin coating, deposition and coating conditions for the electron transport layer may be determined by referring to the deposition and coating conditions for the hole injection layer.

According to an embodiment, the organic layer 150 of the organic light-emitting device may include an electron transport region between the emission layer and the second electrode 190. The electron transport region may include an electron transport layer, and the electron transport layer may include the condensed cyclic compound represented by Formula 1.

The electron transport layer may further include, in addition to the condensed cyclic compound represented by Formula 1, at least one selected from BCP, Bphen, and $Alq_3$, Balq, TAZ, and NTAZ below.

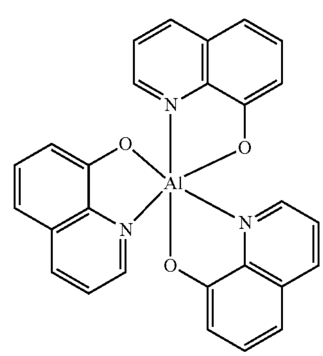

$Alq_3$

-continued

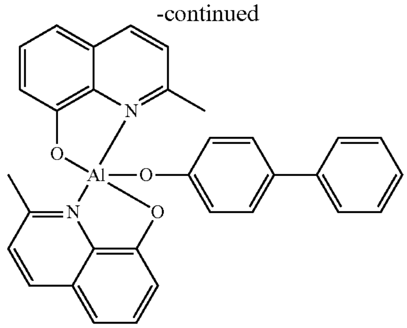

BAlq

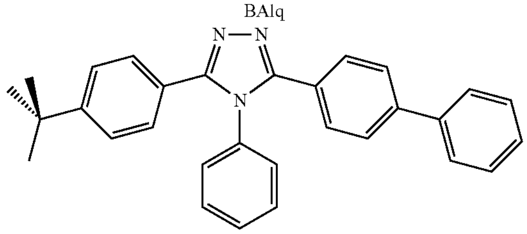

TAZ

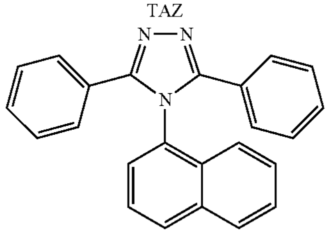

NTAZ

A thickness of the electron transport layer may be about 100 Å to about 1,000 Å, e.g., about 150 Å to about 500 Å. When the thickness of the electron transport layer is within the range described above, the electron transport layer may have satisfactory electron transportation characteristics without a substantial increase in driving voltage.

The electron transport layer may farther include a metal-containing material in addition to the materials described above.

The metal-containing material may include a Li complex. The Li complex may include, e.g., Compound ET-D1 (lithium quinolate, LiQ) or ET-D2 below.

ET-D1

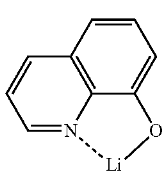

ET-D2

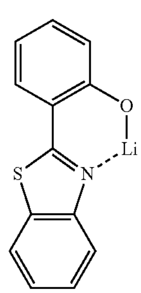

The electron transport region may include an electron injection layer that facilitates electron injection from the second electrode 190.

The electron injection layer may he formed on the electron transport layer by using various methods, such as vacuum deposition, spin coating casting, an LB method, ink-jet printing, laser-printing, or LITI. When an electron injection layer is formed by vacuum deposition and spin coating, deposition and coating conditions for the electron injection layer may be determined by referring to the deposition and coating conditions for the hole injection layer.

The electron injection layer may include at least one selected from, LiF, NaCl, CsF, $Li_2O$, BaO, and LiQ.

A thickness of the electron injection layer may be about 1 Å to about 100 Å, e.g., about 3 Å to about 90 Å. When the thickness of the electron injection layer is within the range described above, the electron injection layer may have satisfactory electron transportation characteristics without a substantial increase in driving voltage.

The second electrode 190 may on the organic layer 150 having such a structure. The second electrode 190 may be a cathode that is an electron injection electrode, and in this regard, a material for forming the second electrode 190 may be a material having a low work function, and such a material may be a metal, an alloy, an electrically conductive compound, or a mixture thereof. Detailed examples of the second electrode 190 may include lithium (Li), magnesium (Mg), aluminum (Al), aluminum-lithium (Al—Li), calcium (Ca), magnesium-indium (Mg—In), or magnesium-silver (Mg—Ag). According to another embodiment of the present invention, the material for forming the second electrode 190 may be ITO or IZO. The second electrode 190 may be a reflection electrode, a semi-transmissive electrode, or a transmissive electrode.

Hereinbefore, the organic light-emitting device has been described with reference to FIG. 1, but is not limited thereto.

A $C_1$-$C_{60}$ alkyl group used herein refers to a linear or branched aliphatic hydrocarbon monovalent group having 1 to 60 carbon atoms, and detailed examples thereof are a methyl group, an ethyl group, a propyl group, an isobutyl group, a sec-butyl group, a tert-butyl group, a pentyl group, an iso-amyl group, and a hexyl group. A $C_1$-$C_{60}$ alkylene group used herein refers to a divalent group having the same structure as the $C_1$-$C_{60}$ alkyl group.

A $C_1$-$C_{60}$ alkoxy group used herein refers to a monovalent group represented by —$OA_{101}$ (wherein $A_{101}$ is the $C_1$-$C_{60}$ alkyl), and detailed examples thereof are a methoxy group, an ethoxy group, and an isopropyloxy group.

A $C_2$-$C_{60}$ alkenyl group used herein refers to a hydrocarbon group formed by substituting at least one carbon double bond in the middle or terminal of the $C_2$-$C_{60}$ alkyl group, and detailed examples there of are an ethenyl group, a prophenyl group, and a butenyl group. A $C_2$-$C_{60}$ alkenylene group used herein refers to a divalent group having the same structure as the $C_2$-$C_{60}$ alkenyl group.

A $C_2$-$C_{60}$ alkynyl group used herein refers to a hydrocarbon group formed by substituting at least one carbon triple bond in the middle or terminal of the $C_2$-$C_{60}$ alkyl group, and detailed examples thereof are an ethynyl group and a propynyl group. A $C_2$-$C_{60}$ alkynylene group used herein refers to a divalent group having the same structure as the $C_2$-$C_{60}$ alkynyl group.

A $C_3$-$C_{10}$ cycloalkyl group used herein refers to a monovalent hydrocarbon monocyclic group having 3 to 10 carbon atoms, and detailed examples thereof are a cyclopropyl group, a cyclobutyl group, a cyclopentyl group, a cyclohexyl group, and a cycloheptyl group. A $C_3$-$C_{10}$ cycloalkylene group used herein refers to a divalent group having the same structure as the $C_3$-$C_{10}$ cycloalkyl group.

A $C_2$-$C_{10}$ heterocycloalkyl group used herein refers to a monovalent monocyclic group having at least one heteroatom selected from N, O, P, and S as a ring-forming atom and 2 to 10 carbon atoms, and detailed examples thereof are a tetrahydroruranyl group and a tetrahydrothiophenyl group. A $C_2$-$C_{10}$ heterocycloalkylene group used herein refers to a divalent group having the same structure as the $C_2$-$C_{10}$ heterocycloalkyl group.

A $C_3$-$C_{10}$ cycloalkenyl group used herein refers to a monovalent monocyclic group that has 3 to 10 carbon atoms and at least one double bond in the ring thereof and does not have aromacity, and detailed examples thereof are a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

A $C_2$-$C_{10}$ heterocycloalkenyl group used herein refers to a monovalent monocyclic group that has at least one heteroatom selected from N, O, P, and S as a ring-forming atom, 2 to 10 carbon atoms, and at least one double bond in its ring. Detailed examples of the $C_2$-$C_{10}$ heterocycloalkenyl group are a 2,3-hydrofuranyl group and a 2,3-hydrothiophenyl group. A $C_2$-$C_{10}$ heterocycloalkenylene group used herein refers to a divalent group having the same structure as the $C_2$-$C_{10}$ heterocycloalkenyl group.

A $C_6$-$C_{60}$ aryl group used herein refers to a monovalent group having a carbocyclic aromatic system having 6 to 60 carbon atoms, and a c6-c60 arylene group used herein refers to a divalent group having a carbocyclic aromatic system having 6 to 60 carbon atoms. Detailed examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_2$-$C_{60}$ heteroaryl group used herein refers to a monovalent group having a carbocyclic aromatic system that has at least one heteroatom selected from N, O, P, and S as a ring-forming atom, and 2 to 60 carbon atoms. A $C_2$-$C_{60}$ heteroarylene group used herein refers to a divalent group having a carbocyclic aromatic system that has at least one heteroatom selected from N, O, P, and S as a ring-forming atom, and 2 to 60 carbon atoms. Detailed examples of the $C_2$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and the $C_2$-$C_{60}$ heteroarylene group each include two or more rings, the rings may be fused to each other.

$C_6$-$C_{60}$ aryloxy group used herein indicates —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

A monovalent non-aromatic condensed polycyclic group (for example, having 8 to 60 carbons) used herein refers to a monovalent group that has two or more rings condensed to each other, only carbon atoms as a ring-forming atom, and non-aromacity in the entire molecular structure. A detailed example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic condensed heteropolycyclic group (for example, having 2 to 60 carbons) used herein refers to a monovalent group that has two or more rings condensed to each other, has a heteroatom selected from N, O, P, and S, other than carbon atoms, as a ring forming atom, and has non-aromacity in the entire molecular structure. A detailed example of the monovalent non-aromatic condensed heteropolycyclic group is a carbazolyl group. A divalent non-aromatic condensed heteropolycyclic group used herein refers to a divalent group having the same structure as the monovalent non-aromatic condensed heteropolycyclic group.

The term "Ph" used herein refers to a phenyl group, the term "Me" used herein refers to a methyl group, the term "Et" used herein refers to an ethyl group, and the term "tert-Bu" or "But" used herein may refer to a tert-butyl group.

Hereinafter, an organic light-emitting device according to an embodiment of the present invention will be described in detail with reference to Synthesis Examples and Examples. The wording "B" was used instead of "A" used in describing Synthesis Examples means that a molar equivalent of A was identical to a molar equivalent of B.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Synthesis Example 1

Synthesis of Compound 2

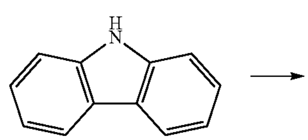

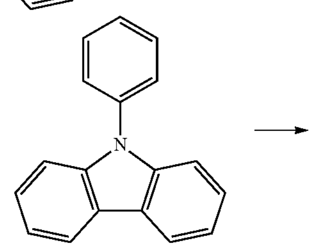

A-1

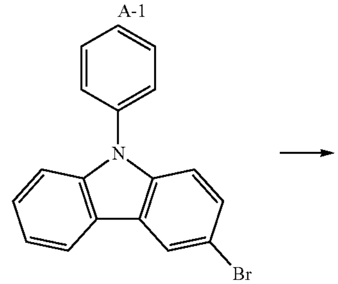

A-2

-continued

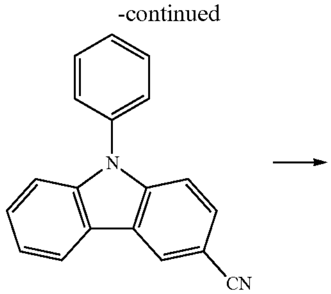

A-3

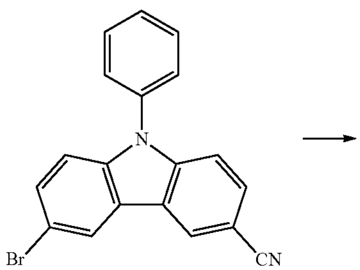

A-4

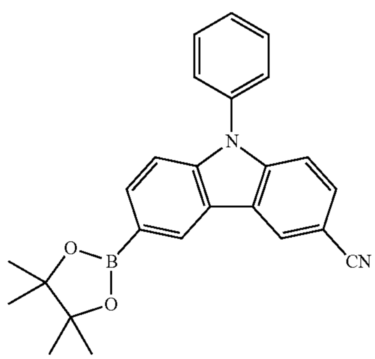

A-5

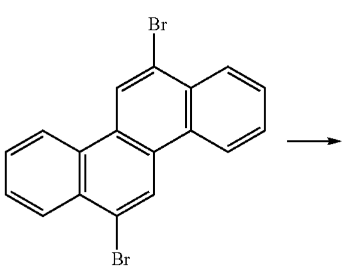

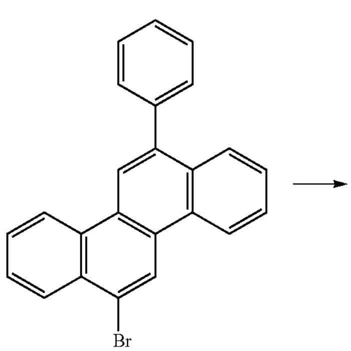

A-6

-continued

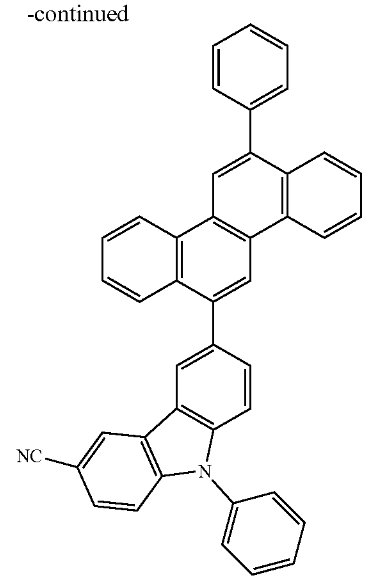

2

1) Synthesis of Intermediate A-1

6.69 g (40 mmol) of 9H-carbazole, 6.28 g (40 mmol) of bromobenzene, 1.52 g (24 mmol) of copper powder, and 8.29 g (60 mmol) of $K_2CO_3$ were dissolved in 100 mL of o-dichlorobenzene, and then, the resultant solution was stirred at a temperature of 180° C. for 24 hours. The reaction solution was cooled to room (e.g., ambient) temperature, 60 mL of water was added thereto, and the result was extracted three times by using 50 mL of ethyl acetate. An organic layer obtained therefrom was dried by using magnesium sulfate, and then residues obtained by evaporation of a solvent therefore were separation-purified by using silica gel column chromatography to obtain 7.10 g of Intermediate A-1 (yield: 73%). The obtained compound was identified by LC-MS. $C_{18}H_{13}N$: M+243.1.

2) Synthesis of Intermediate A-2

7.10 g (29.2 mmol) of Intermediate A-1 was completely dissolved in 100 mL of $CH_2Cl_2$ (methylene chloride), 5.20 g (29.2 mmol) of N-bromosuccinimide was added thereto, and the resultant solution was stirred at room temper store for 12 hours. 80 mL of water was added to the reaction solution, and then an extraction was performed thereon three times by using 60 mL of methylene chloride. An organic layer obtained therefrom was dried by using magnesium sulfate, a solvent was evaporated therefrom, and then, the resultant solution was re-crystallized by using methanol to obtain 7.70 g (yield 82%) of Intermediate A-2. The obtained compound was identified by LC-MS. $C_{18}H_{12}BrN$: M+321.0.

3) Synthesis of Intermediate A-3

7.70 g (23.9 mmol) of Intermediate A-2 and 3.21 g (35.9 mmol) of CuCN were dissolved in 100 mL of DMF, and then, the resultant solution was stirred at a temperature of 150° C. for 24 hours. The reaction solution was cooled at room temperature, 80 mL of ammonia water and 80 mL of water were added thereto, and the result was extracted three times by using 60 mL of methylene chloride. An organic layer obtained therefrom was dried by using magnesium sulfate, and then residues obtained by evaporation of a solvent therefrom were separation-purified by using silica gel column chromatography to obtain 5.82 g (yield: 91%) of Intermediate A-3. The obtained compound was identified by LC-MS. $C_{19}H_{12}N_2$: M+268.1.

4) Synthesis of Intermediate A-4

5.82 g (21.7 mmol) of Intermediate A-3 was completely dissolved in 100 mL of $CH_2Cl_2$,3.86 g (21.7 mmol) of N-bromosuccinimide was added thereto, and the resultant solution was stirred at room temperature for 8 hours. 80 mL of water was added to the reaction solution, and then an extraction was performed thereon three times by using 60 mL of methylene chloride. An organic layer was dried by using magnesium sulfate, a solvent was evaporated therefrom, and then, the resultant solution was re-crystallized by using methanol to obtain 7.22 g (yield 96%) of Intermediate A-4. The obtained compound was identified by LC-MS. $C_{19}H_{11}BrN_2$: M+346.0.

5) Synthesis of Intermediate A-5

7.22 g (20.8 mmol) of Intermediate A-4, 5.81 g (22.9 mmol) of bis-(pinacolato)diboron, 6.12 g (62.4 mmol) of KOAc, and 0.50 g (0.62 mmol) of palladium(diphenylphosphinoferrocene)chloride were dissolved in 100 mL of DMSO in a 250 mL flask, and then, the resultant solution was reluxed at a temperature of 80° C. for 12 hours. The reaction solution was cooled to room temperature, 60 mL of distilled water was added thereto, and the result was extracted three times by using 60 mL of methylene chloride. An organic layer obtained therefrom was dried by using magnesium sulfate, and then residues obtained by evaporating a solvent therefrom were washed with ethanol and dried to obtain 6.70 g (yield: 82%) of Intermediate A-5. The obtained compound was identified by LC-MS, $C_{25}H_{23}BN_2O_2$: M+394.2

6) Synthesis of Intermediate A-6

7.72 g (20 mmol) of 6,12-dibromochrysene, 1.83 g (15 mmol) of phenylboronic acid, 0.35 g (0.30 mmol) of $Pd(PPh_3)_4$, and 8.29 g (60 mmol) of $K_2CO_3$ were dissolved in 80 mL of $THF/H_2O$ mixture (volume ratio of 2/1), and then, the resultant solution was stirred at a temperature of 70° C. for 5 hours. The reaction solution was cooled to room temperature, 60 mL of water was added thereto, and the result was extracted three times by using 60 mL of ethyl ether. An organic layer obtained therefrom was dried by using magnesium sulfate, and then residues obtained by evaporating a solvent therefrom were separation-purified by using silica gel column chromatography to obtain 5.35 g (yield: 70%) of Intermediate A-6. The obtained compound was identified by LC-MS. $C_{22}H_{13}Br$: M+356.0.

7) Synthesis of Compound 2

3.0 g (7.8 mmol) of Intermediate A-6, 3.15 g (8.0 mmol) of Intermediate A-5, 0.46 g (0.4 mmol) of $Pd(PPh_3)_4$, and 3.32 g (24 mmol) of $K_2CO_3$ were dissolved in 80 mL of $THF/H_2O$ mixture (volume ratio of 2/1), and then, the resultant mixture was stirred at a temperature of 80° C. for 12 hours. The reaction solution was cooled to room temperature, and then an extraction was performed thereon three times by using 50 mL of water and 50 mL of ethyl acetate. An organic layer obtained therefrom was dried by using magnesium sulfate, and then residues obtained by evaporating a solvent therefrom were separation-purified by using silica gel column chromatography to obtain 3.20 g (yield: 72%) of Compound 2. The obtained compound was identified by MS/FAB and $^1H$ NMR.

$C_{43}H_{26}N_2$ cal. 570.7, found 570.7.

$^1H$ NMR (400 MHz, $CDCl_3$) δ8.40 (s, 1H), 8.03 (s, 1H), 7.98 (m, 2H), 7.80 (d, 2H) 7.61 (m, 2H), 7.52 (d, 1H), 7.47 (d, 1H), 7.34-7.25 (m, 5H), 7.21-7.12 (m, 7H), 7.08-6.94 (m, 4H).

Synthesis Example 2

Synthesis of Compound 5

3.58 g (yield: 74%) of Compound 5 was obtained in the same manner as used to synthesize Compound 2 in Synthesis Example 1, except that 2-bromonaphthalene was used instead of bromobenzene in the synthesis of Compound 2. The obtained compound was identified by MS/FAB and $^1H$ NMR.

$C_{47}H_{28}N_2$ cal. 620.8, found 620.8.

$^1H$ NMR (400 MHz, $CDCl_3$) δ8.32 (s, 1H), 7.94-7.92 (m, 3H), 7.72-7.70 (d, 2H), 7.59 (s, 1H), 7.45-7.37 (m, 7H), 7.26-7.12 (m, 10H), 7.03-6.94 (m, 4H).

Synthesis Example 3

Synthesis of Compound 10

3.90 g (yield: 69%) of Compound 10 was obtained in the same manner as used to synthesize Compound 2 in Synthesis Example 1, except that 2-bromo-4,6-diphenylpyrimidine was used instead of bromobenzene in the synthesis of Compound 2. The obtained compound was identified by MS/FAB and $^1H$ NMR.

$C_{53}H_{32}N_4$ cal. 724.8, found 724.8.

$^1H$ NMR (400 MHz, $CDCl_3$) δ8.49 (s, 1H), 8.07 (2, 1H), 8.00 (d, 1H), 7.97 (d, 1H) 7.77 (d, 1H), 7.70-7.67 (m, 6H), 7.46 (s, 1H), 7.43 (d, 1H), 7.37 (d, 1H), 7.33 (t, 1H), 7.25-7.08 (m, 12H), 6.99-6.90 (m, 5H).

Synthesis Example 4

Synthesis of Compound 13

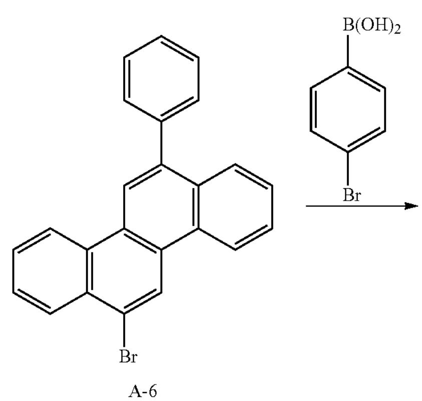

-continued

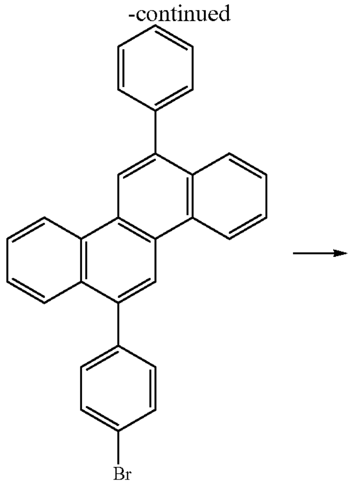

A-7

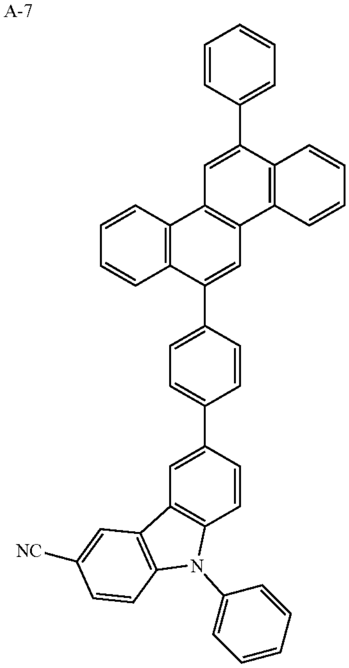

13

1) Synthesis of Intermediate A-7

7.67 (g (20 mmol) of Intermediate A-6, 3.01 g (15 mmol) of 4-bromophenylboronic acid, 0.35 g (0.30 mmol) of $Pd(PPh_3)_4$, and 8.29 g (60 mmol) of $K_2CO_3$ were dissolved in 100 mL of $THF/H_2O$ mixture (volume ratio of 2/1), and then, the resultant solution was stirred at a temperature of 70° C. for 5 hours. The reaction solution was cooled to room temperature, 80 mL of water was added thereto, and the result was extracted three times by using 80 mL of ethyl ether. An organic layer obtained therefrom was dried by using magnesium sulfate, and then residues obtained by evaporating a solvent therefrom were separation0purified by using silica gel column chromatography to obtain 6.25 g (yield: 68%) of Intermediate A-7. The obtained compound was identified by LC-MS. C30H16Br: M+459.4.

2) Synthesis of Compound 13

3.48 g (yield: 69%) of Compound 13 was obtained in the same manner as used to synthesize Compound 2 in Synthesis Example 1, except that Intermediate A-7 was used instead of Intermediated A-5. The obtained compound was identified by MS/FAB and $^1$H NMR.

$C_{49}H_{30}N_2$ cal. 647.8, found 646.8.

$^1$H NMR (400 MHz, $CDCl_3$) δ8.13 (s, 1H), 8.06 (s, 1H), 8.01 (d, 2H), 7.81 (d, 1H) 7.73 (d, 1H), 7.62-7.55 (m, 4H), 7.47-7.28 (m, 9H), 7.22-7.13 (m, 7H), 7.07 7.02 (m, 2H), 6.96 (t, 2H).

Synthesis Example 5

Synthesis of Compound 17

3.61 g (yield: 64%) of Compound 17 was obtained in the same manner as used to synthesize Compound 2 in Synthesis Example 1, except that 2-bromo-6-phenylpyrimidine was used instead of bromobenzene in the synthesis of Compound 2. The obtained compound was identified by MS/FAB and $^1$H NMR.

$C_{54}H_{33}N_3$ cal. 723.9, found 723.9.

$^1$H NMR (400 MHz, $CDCl_3$) δ8.42 (s, 1H), 8.31 (s, 1H), 8.07 (d, 1H), 8.02 (d, 1H) 7.77-7.66 (m, 5H), 7.55-7.52 (m, 2H), 7.44-7.27 (m, 11H), 7.21-7.11 (m, 7H), 7.06-6.93 (m, 4H).

Synthesis Example 6

Synthesis of Compound 36

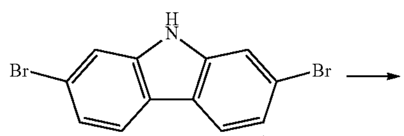

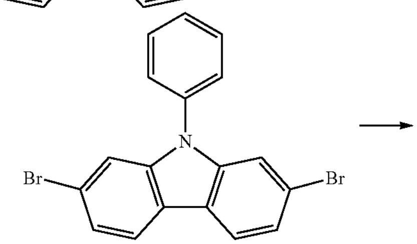

A-8

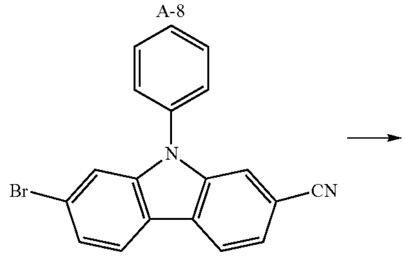

A-9

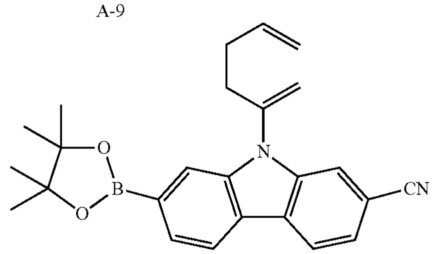

A-10

1) Synthesis of Intermediate A-8

8.78 g (yield: 73%) of Intermediate A-8 was obtained in the same manner as used to synthesize Intermediate A-1 in Synthesis Example 1, except that 2,7-dibromo-9 H-carbazol was used instead of 9H-carbazol. The obtained compound was identified by LC-MS. $C_{18}H_{11}Br_2N$: M+398.9.

2) Synthesis of Intermediate A-9

3.57 g (yield: 47%) of Intermediate A-9 was obtained in the same manner as used to synthesize Intermediate A-3 in Synthesis Example 1, except that Intermediate A-8 was used instead of Intermediate A-2. The obtained compound was identified by LC-MS. $C_{19}H_{11}Br_2N$: M+346.0

3) Synthesis of Intermediate A-10

3.57 g (10.3 mmol) of Intermediate A-9, 2.87 g (11.3 mmol) of bis(pinacolato) diboron, 3.03 g (30.9 mmol) of KOAc, and 0.25 g (0.31 mmol) of palladium(diphenylphosphinoferrocene)chloride were dissolved in 70 mL of DMSO in a 250 mL flask, and then, the resultant solution was refluxed at a temperature of 80° C. for 12 hours. The reaction solution was cooled to room temperature, 40 mL of distilled water was added thereto, and the result was extracted three times by using 40 mL of methylene chloride. An organic layer obtained therefrom was dried by using magnesium sulfate, and then residues obtained by evaporating a solvent therefrom were washed with ethanol and dried to obtain 3.14 g (yield: 82%) of Intermediate A-10. The obtained compound was identified by LC-MS. $C_{25}H_{23}BN_2O_2$: M+394.2.

4) Synthesis of Compound 36

2.98 g (yield: 67%) of Compound 36 was obtained in the same manner as used to synthesize Compound 2 in Synthesis Example 1, except that Intermediate A-10 was used instead of Intermediate A-6. The obtained compound was identified by MS/FAB and $^1$H NMR.

$C_{43}H_{26}N_2$ cal. 570.7, found 570.7.

$^1$H NMR (400 MHz, $CDCl_3$) δ8.18 (s, 1H), 7.94 (d, 1H), 7.86 (dd, 2H), 7.61 (d, 1H) 7.46-7.40 (m, 5H), 7.19-6.96 (m, 12H), 6.91-6.76 (m, 4H).

Synthesis Example 7

Synthesis of Compound 41

1) Synthesis of Intermediate C-1

Intermediate C-1 was obtained in the same manner as used to synthesize Intermediate A-6 in Synthesis Example 1, except that 6-bromo- 2,4-bipyridine was used instead of bromophenyl.

2) Synthesis of Compound 41

3.09 g (yield: 61%) of Compound 41 was obtained in the same manner as used to synthesize Compound 2 in Synthesis Example 1, except that Intermediates A-10 and C-1 were used instead of Intermediates A-5 and A-6, respectively. The obtained compound was identified by MS/FAB and $^1$H NMR.

$C_{47}H_{28}N_4$ cal. 648.8, found 648.8.

$^1$H NMR (400 MHz, $CDCl_3$) δ8.31 (s, 1H), 8.22 (s, 1H), 7.91 (d, 1H), 7.83 (m, 2H), 7.57 (m, 2H), 7.47 (d, 1H), 7.42-7.38 (m, 5H), 7.33-7.27 (m, 2H), 7.22-7.06 (m, 9H), 6.94-6.85 (m, 4H).

Synthesis Example 8

Synthesis of Compound 67

1) Synthesis of Intermediate C-2

Intermediate C-2 was obtained in the same manner as used to synthesize Intermediate A-7 in Synthesis Example 4, except that 6-bromonaphthalenylboronic acid was used instead of 4-bromophenylboronic acid.

2) Synthesis of Compound 67

3.97 g (yield: 73%) of Compound 67 was obtained in the same manner as used to synthesize Compound 2 in Synthesis Example 1, except that Intermediates A-10 and C-2 were used instead of Intermediates A-5 and A-6, respectively. The obtained compound was identified by MS/FAB and $^1$H NMR.

$C_{53}H_{32}N_2$ cal. 696.9, found 696.9.

$^1$H NMR (400 MHz, $CDCl_3$) δ8.25 (s, 1H), 7.89 (d, 1H), 7.83 (t, 2H), 7.60 (dd, 1H), 7.43-7.31 (m, 7H), 7.24-6.97 (m, 14H), 6.90-6.86 (m, 2H), 6.81-6.78 (m, 2H), 6.70-6.67 (m, 2H).

Synthesis Example 9

Synthesis of Compound 71

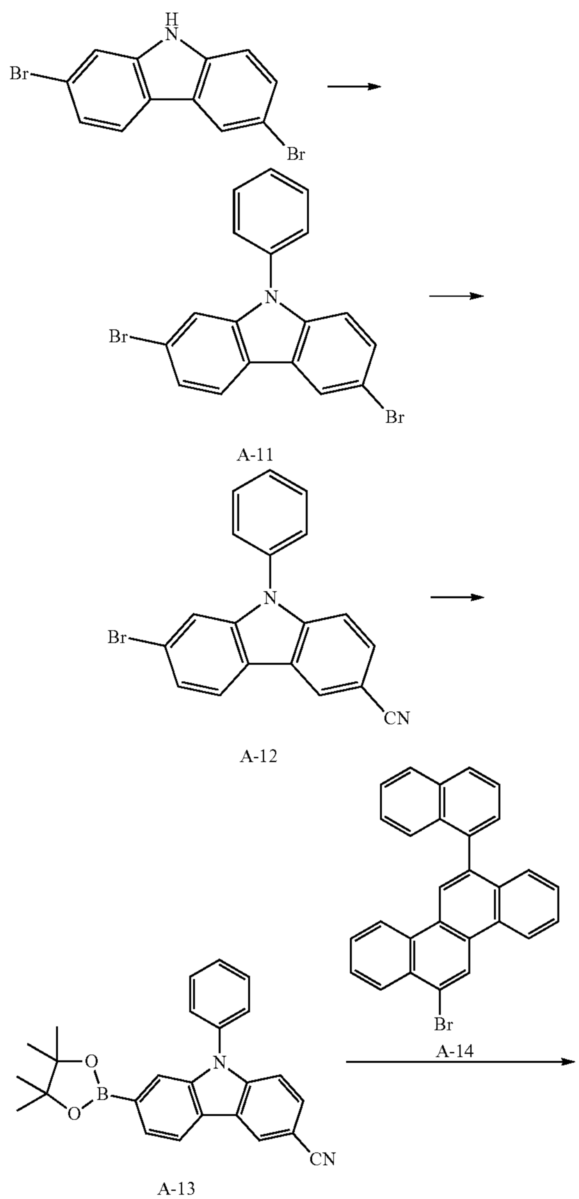

-continued

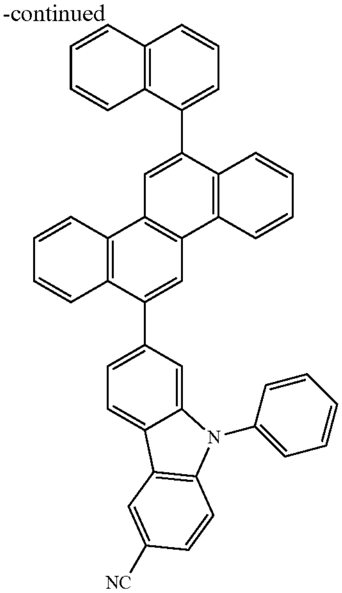

71

1) Synthesis of Intermediate A-11

9.75 g (30 mmol) of 2,6-dibromo-9H-carbazole, 4.71 g (30 mmol) of bromobenzene, 1.14 g (18 mmol) of copper powder, and 6.22 g (45 mmol) of $K_2CO_3$ were dissolved in 100 mL of o-dichlorobenzene, and then, the resultant solution was stirred at a temperature of 180° C. for 24 hours. The reaction solution was cooled to room temperature, 60 mL of water was added thereto and the result was extracted three times by using 50 mL of ethyl acetate. An organic layer obtained therefrom was dried by using magnesium sulfate, and then residues obtained by evaporation of a solvent therefrom were separation-purified by using silica gel column chromatography to obtain 9.16 g of Intermediate A-11 (yield: 76%). The obtained compound was identified by LC-MS. $C_{18}H_{11}Br_2N$: M+401.1.

2) Synthesis of Intermediate A-12

9.16 g (22.8 mmol) of Intermediate A-11 and 2.69 g (30 mmol) of CuCN were dissolved in 100 mL of DMF, and the resultant was stirred at a temperature of 150° C., for 24 hours. The reaction solution was cooled to room temperature, 80 mL of ammonia water and 80 mL of water were added to the reaction solution, and then an extraction was performed thereon three times by using 60 mL of methylene chloride. An organic layer obtained therefrom was dried by using magnesium sulfate, a solvent was evaporated therefrom, and then, the resultant solution was re-crystallized by using methanol to obtain 4.91 g (yield 62%) of Intermediate A-12. The obtained compound was identified by LC-MS. $C_{19}H_{11}BrN_2$: M+347.2.

3) Synthesis of Intermediate A-13

4.91 g (14.1 mmol) of Intermediate A-12, 3.81 g (15 mmol) of bis(pinacolato) diboron, 4.15 g (42.3 mmol) of KOAc, and 0.34 g (0.42 mmol) of palladium(diphenylphosphinoferrocene)chloride were dissolved in 100 mL of DMSO in a 250 mL flask, and then, the resultant solution was reluxed at a temperature of 80° C. for 12 hours. The reaction solution was cooled to room temperature, 60 mL of distilled water was added thereto, and the result was extracted three times by using 60 mL of methylene chloride. An organic layer obtained therefrom was dried by using magnesium sulfate, and then residues obtained by evaporating a solvent therefrom were washed with ethanol and dried to obtain 4.78 g (yield: 86%) of Intermediate A-13. The obtained compound was identified by LC-MS. $C_{25}H_{23}BN_2O_2$: M+394.2.

4) Synthesis of Intermediate A-14

6.24 g (yield: 72%) of Intermediate A-14 was obtained in the same manner as used to synthesize Intermediate A-6 in Synthesis Example 1, except that naphthylboronic acid was used instead of phenylboronic acid. the obtained compound was identified by LC-MS. $C_{28}H_{17}Br$: M+433.4

5) Synthesis of Compound 71

3.15 g (8 mmol) of Intermediate A-13, 3.68 g (8.5 mmol) of Intermediate A-14, 0.46 g (0.4 mmol) of $Pd(PPh_3)_4$, and 3.32 g (24 mmol) of $K_2CO_3$ were dissolved in 80 mL of $THF/H_2O$ mixture (volume ration of 2/1), and then, the resultant solution was stirred at room temperature of 80° C. for 12 hours. The reaction solution was cooled to room temperature, and then an extraction was performed thereon three times by using 50 mL of water and 50 mL of ethyl acetate. An organic layer obtained therefrom was dried by using magnesium sulfate, and then residues obtained by evaporating a solvent therefrom were separation-purified by using silica gel column chromatography to obtain 3.68 g (yield: 74%) of Compound 71. The obtained compound was identified by MS/FAB and $^1H$ NMR.

$C_{47}H_{28}N_2$ cal. 620.8, found 620.8

$^1H$ NMR (400 MHz, $CDCl_3$) δ8.12 ( s, 2H), 7.84 (d, 1H), 7.82 (d, 1H), 7.62 (s, 1H), 7.58 (d, 1H), 7.41 (d, 1H), 7.31 (d, 1H), 7.73-7.60 (m, 7H), 7.10-7.03 (m, 5H), 7.00 (d, 1H), 6.96-6.83 (m, 6H), 6.79 (t, 1H).

Synthesis Example 10

Synthesis of Compound 79

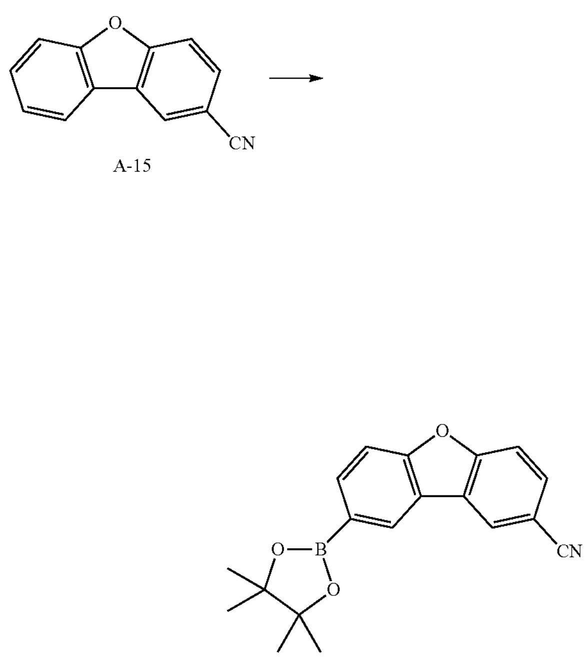

1) Synthesis of Intermediate A-15

3.14 g (yield: 46%) of Intermediate A-15 was obtained in the same manner as used to synthesize Intermediate A-3 in Synthesis Example 1, except that 2,8-dibromo-dibenzofuran was used instead of Intermediate A-2. The obtained compound was identified by LC-MS. $C_{13}H_6BrNO$: M+272.1.

2) Synthesis of Intermediate I-16

2.98 g (yield: 81%) of Intermediate A-16 was obtained in the same manner as used to synthesize Intermediate A-5 in Synthesis Example 1, except that Intermediate A-15 was used instead of Intermediate A-4. The obtained compound was identified by LC-MS. $C_{19}H_{18}B_{N}O$: M+319.2.

3) Synthesis of Intermediate C-3

Intermediate C-3 was obtained in the same manner as used to synthesize Intermediate A-6 in Synthesis Example 1, except that 2-bromonaphthalene was used instead of bromophenyl.

4) Synthesis of Compound 79

3.58 g (yield: 73%) of Compound 79 was obtained in the same manner as used to synthesize Compound 2 in Synthesis Example 1, except that Intermediates C-3 and A-16 were used instead of Intermediates A-5 and A-6, respectively. The obtained compound was identified by MS/FAB and $^1H$ NMR.

$C_{47}H_{28}N2$ cal. 545.6, found 545.6

$^1H$ NMR (400 MHz, $CDCl_3$) δ8.11 (s, 1H), 7.98 (m, 3H), 7.88 (d, 1H), 7.84 (d, 1H), 7.64 (s, 1H), 7.50-7.38 (m, 9H), 7.31-7.20 (m, 5H), 7.25 (t, 2H).

Synthesis Example 11

Synthesis of Compound 100

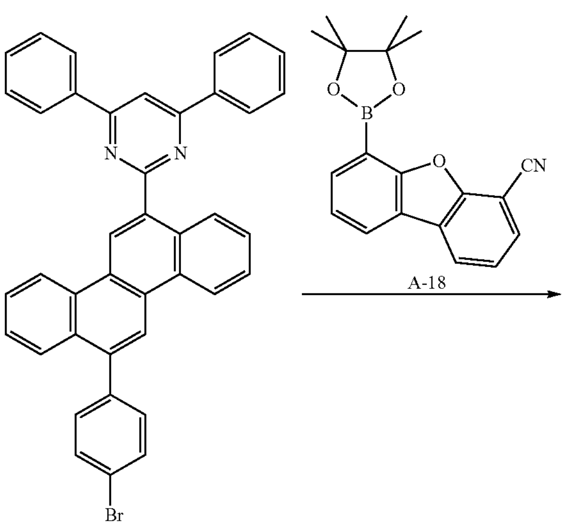

A-17

-continued

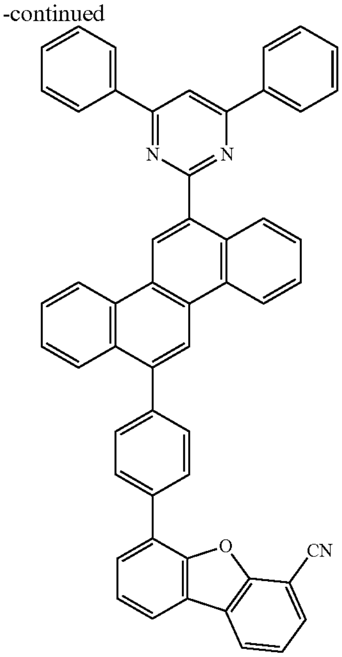

100

1) Synthesis of Intermediate A-17

2.89 g (yield: 71%) of Intermediate A-17 was obtained in the same manner as used to synthesize Intermediate A-7 in Synthesis Example 4, except that 4,6-diphenylpyrimidinylboronic acid was used instead of 4-bromophenylboronic acid. The obtained compound was identified by LC-MS. $C_{40}H_{25}BrN_2$: M+613.6.

2) Synthesis of Intermediate A-18

2.91 g (yield: 79%) of Intermediate A-18 was obtained in the same manner as used to synthesize Intermediates A-15 and A-16 in Synthesis Example 10 in this stated order, except that 4,6-dibromodibenzofuran was used instead of 2,8-dibromodibenzofuran in the synthesis of Intermediate A-15. The obtained compound was identified by LC-MS. $C_{19}H_{18}BNO_3$: M+319.2.

3) Synthesis of Compound 100

3.95 g (yield: 68%) of Compound 100 was obtained in the same manner as used to synthesize Compound 2 in Synthesis Example 1, except that Intermediates A-18 and A-17 were used instead of Intermediates A-5 and A-6, respectively. The obtained compound was identified by MS/FAB and $^1H$ NMR.

$C_{53}H_{31}N_3O$ cal. 725.9, found 725.9.

$^1H$ NMR (400 MHz, $CDCl_3$) δ8.36 (s, 1H), 8.23 (s, 1H), 7.89 (d, 1H), 7.69-7.57 (m, 7H), 7.45 (dd, 1H), 7.37 (s, 1H), 7.3 (d, 1H), 7.26-7.21 (m, 5H), 7.16-6.99 (m, 10H), 6.89 (m, 2H), 6.81 (t, 1H).

Synthesis Example 12

Synthesis of Compound 109

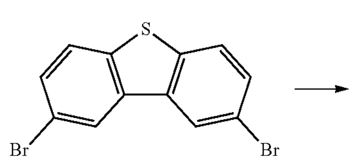

-continued

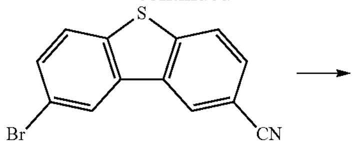

A-19

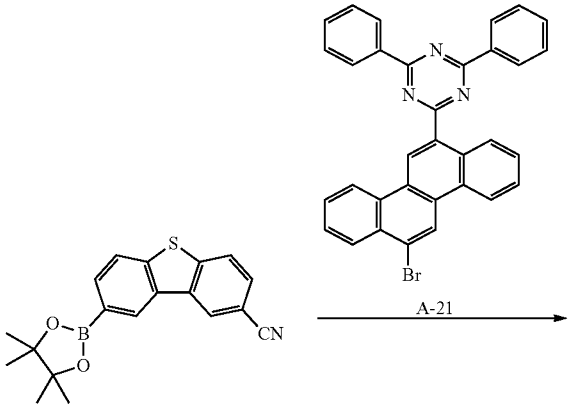

A-21

A-20

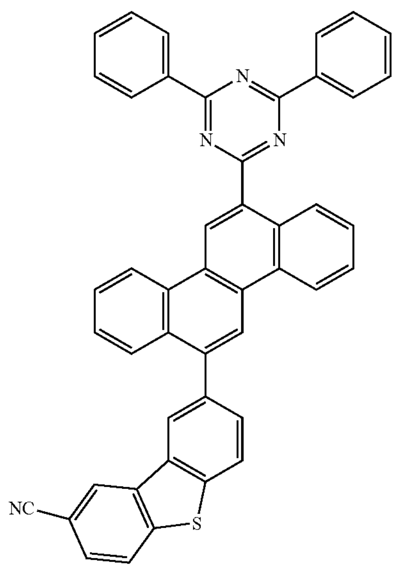

109

1) Synthesis of Intermediate A-19

3.27 g (yield: 53%) of Intermediate A-19 was obtained in the same manner as used to synthesize Intermediate A-15 in Synthesis Example 10, except that 2,8-dibromo-dibenzothiophene was used instead of 2,8-dibromodibenzofuran. The obtained compound was identified by LC-MS. $C_{16}H_6BrNS$: M+286.9.

2) Synthesis of Intermediate A-20

2.79 g (yield: 73%) of Intermediate A-20 was obtained in the same manner as used to synthesize Intermediate A-16 in Synthesis Example 10, except that Intermediate A-19 was used instead of Intermediate A-15. The obtained compound was identified by LC-MS. $C_{19}H_{18}BNO_2S$:M+335.1.

3) Synthesis of Intermediate C-4

Intermediate C-4 was obtained in the same manner as used to synthesize Intermediate A-6 in Synthesis Example 1, except that 4,6-diphenyl-1,3,5-triazinylboronic acid was used instead of phenylboronic acid.

4) Synthesis of Compound 109

3.83 g (yield: 69%) of Compound 109 was obtained in the same manner as used to synthesize Compound 2 in Synthesis Example 1, except that Intermediates A-20 and C-4 were used instead of Intermediates A5 and A-6, respectively. The obtained compound was identified by MS/FAB and $^1H$ NMR.

$C_{39}H_{21}NS$ cal. 666.8, found 666.8.

$^1H$ NMR (400 MHz, $CDCl_3$) δ8.37 (s, 1H), 8.34 (s, 1H), 8.05 (d, 1H), 7.92-7.89 (m, 5H), 7.82-7.79 (m, 2H), 7.65 (d, 1H), 7.47 (d, 1H), 7.39 (d, 1H), 7.36 (dd, 1H), 7.32-7.27 (m, 2H), 7.17-7.10 (m, 7H), 6.99-6.97 (m, 2H), 6.88 (t, 1H).

Synthesis Example 13

Synthesis of Compound 4

2.87 g (yield: 69%) of Compound 4 was obtained in the same manner as used to synthesize Compound 2 in Synthesis Example 1, except that Intermediate A-14 was used instead of Intermediate A-6. The obtained compound was identified by MS/FAB and $^1H$ NMR.

Synthesis Example 14

Synthesis of Compound 8

3.48 g (yield: 71%) of Compound 8 was obtained in the same manner as used to synthesize Compound 2 in Synthesis Example 1, except that Intermediate C-5 was used instead of Intermediate A-6. The obtained compound was identified by MS/FAB and $^1H$ NMR.

Synthesis Example 15

Synthesis of Compound 12

3.16 g (yield: 73%) of Compound 12 was obtained in the same manner as used to synthesize Compound 2 in Synthesis Example 1, except that Intermediate C-6 was used instead of Intermediate A-6. The obtained compound was identified by MS/FAB and $^1H$ NMR.

Synthesis Example 16

Synthesis of Compound 15

3.67 g (yield: 74%) of Compound 15 was obtained in the same manner as used to synthesize Compound 2 in Synthesis Example 1, except that Intermediate C-7 was used instead of Intermediate A-6. The obtained compound was identified by MS/FAB and $^1H$ NMR.

Synthesis Example 17

Synthesis of Compound 19

2.96 g (yield: 73%) of Compound 19 was obtained in the same manner as used to synthesize Compound 2 in Synthesis Example 1, except that Intermediate C-8 was used instead of Intermediate A-6. The obtained compound was identified by MS/FAB and $^1H$ NMR.

Synthesis Example 18

Synthesis of Compound 27

3.17 g (yield: 68%) of Compound 27 was obtained in the same manner as used to synthesize Compound 2 in Synthesis Example 1, except that Intermediate C-9 was used instead of Intermediate A-6. The obtained compound was identified by MS/FAB and $^1$H NMR.

Synthesis Example 19

Synthesis of Compound 34

3.34 g (yield: 76%) of Compound 34 was obtained in the same manner as used to synthesize Compound 2 in Synthesis Example 1, except that Intermediate C-10 was used instead of Intermediate A-6. The obtained compound was identified by MS/FAB and $^1$H NMR.

Synthesis Example 20

Synthesis of Compound 40

3.07 g (yield: 68%) of Compound 40 was obtained in the same manner as used to synthesize Compound 2 in Synthesis Example 1, except that Intermediates A-10 and C-11 were used instead of Intermediates A-5 and A-6, respectively. The obtained compound was identified by MS/FAB and $^1$H NMR.

Synthesis Example 21

Synthesis of Compound 45

3.43 g (yield: 74%) of Compound 45 was obtained in the same manner as used to synthesize Compound 2 in Synthesis Example 1, except that Intermediates A-10 and A-21 were used instead of Intermediate A-5 and A-6, respectively. The obtained compound was identified by MS/FAB and $^1$H NMR.

Synthesis Example 22

Synthesis of Compound 58

2.98 g (yield: 69%) of Compound 58 was obtained in the same manner as used to synthesize Compound 2 in Synthesis Example 1, except that Intermediates A-10 and C-12 were used instead of Intermediates A-5 and A-6, respectively. The obtained compound was identified by MS/FAB and $^1$H NMR.

Synthesis Example 23

Synthesis of Compound 68

3.16 g (yield: 70%) of Compound 68 was obtained in the same manner as used to synthesize Compound 2 in Synthesis Example 1, except that Intermediates A-10 and C-10 were used instead of Intermediates A-5 and A-6, respectively. The obtained compound was identified by MS/FAB and $^1$H NMR.

Synthesis Example 24

Synthesis of Compound 73

3.04 g (yield: 68%) of Compound 73 was obtained in the same manner as used to synthesize Compound 2 in Synthesis Example 1, except that Intermediates A-13 and A-7 were used instead of Intermediates A-5 and A-6, respectively. The obtained compound was identified by MS/FAB and $^1$H NMR.

Synthesis Example 25

Synthesis of Compound 75

3.44 g (yield: 73%) of Compound 75 was obtained in the same manner as used to synthesize Compound 2 in Synthesis Example 1, except that Intermediates A-16 and C-13 were used instead of Intermediates A-5 and A-6, respectively. The obtained compound was identified by MS/FAB and $^1$H NMR.

Synthesis Example 26

Synthesis of Compound 94

2.76 g (yield: 63%) of Compound 94 was obtained in the same manner as used to synthesize Compound 2 in Synthesis Example 1, except that Intermediates A-18 and A-14 were used instead of Intermediates A-5 and A-6, respectively. The obtained compound was identified by MS/FAB and $^1$H NMR.

Synthesis Example 27

Synthesis of Compound 102

3.31 g (yield: 73%) of Compound 102 was obtained in the same manner as used to synthesize Compound 2 in Synthesis Example 1, except that Intermediates A-20 and A-6 were used instead of Intermediates A-5 and A-6, respectively. The obtained compound was identified by MS/FAB and $^1$H NMR.

$^1$H NMR and MS/FAB results of synthesized compounds are shown in Table 1, below.

Synthesis methods for other compounds (e.g., than the compounds shown in Table 1) may be performed by referring to synthetic paths and source materials of Synthesis Examples 1 to 27.

TABLE 1

| | | MS/FAB | |
|---|---|---|---|
| Compound | 1H NMR (CDCl3, 400 MHz) | found | calc. |
| 4 | δ = 8.36 (s, 1H), 8.24 (s, 1H), 7.95-7.92 (m, 2H), 7.73-7.70 (m, 2H), 7.46 (d, 1H), 7.40 (dd, 2H), 7.29-7.19 (m, 7H), 7.16-7.11 (m, 5H), 7.08 (d, 1H), 7.01-6.89 (m, 1H), 7.05 (t, 1H) | 620.76 | 620.71 |
| 8 | δ = 8.30 (s, 1H), 8.17 (d, 1H), 8.01 (s, 1H), 7.91 (dd, 2H), 7.74 (d, 1H), 7.70 (d, 2H), 7.62 (d, 1H), 7.56 (d, 1H), 7.49-7.46 (m, 2H), 7.44 (d, 1H), 7.38 (d, 1H), 7.32 (d, 1H), 7.29-7.08 (m, 12H), 7.01-6.86 (m, 4H) | 697.84 | 697.69 |

TABLE 1-continued

| Compound | 1H NMR (CDCl3, 400 MHz) | MS/FAB found | MS/FAB calc. |
|---|---|---|---|
| 12 | δ = 8.05-7.98 (m, 3H), 7.82 (s, 1H), 7.75-7.70 (m, 2H), 7.61-7.55 (m, 4H), 7.48 (d, 1H), 7.39-7.29 (m, 8H), 7.23-7.19 (m, 4H), 7.10-7.03 (m, 2H), 7.15 (t, 1H) | 570.69 | 570.73 |
| 15 | δ = 8.11 (s, 1H), 7.96 (s, 1H), 7.84 (t, 2H), 7.65 (s, 1H), 7.59 (s, 1H), 7.47-7.44 (m, 2H), 7.37-7.20 (m, 12H), 7.16-7.12 (m, 5H), 7.10 (d, 1H), 7.04-6.93 (m, 5H), 6.87 (t, 1H) | 696.85 | 696.78 |
| 19 | δ = 8.16 (dd, 1H), 8.00 (s, 2H), 7.89 (d, 2H), 7.74 (dd, 1H), 7.69 (d, 1H), 7.62-7.60 (m, 2H), 7.56 (dd, 1H), 7.49-7.46 (m, 4H), 7.37-7.08 (m, 17H), 7.02-6.96 (m, 2H), 6.91 (t, 2H) | 773.94 | 773.85 |
| 27 | δ = 8.19 (d, 1H), 8.01 (d, 1H), 7.97 (s, 1H), 7.90-7.84 (m, 3H), 7.70 (s, 1H), 7.55-7.41 (m, 7H), 7.28-7.23 (m, 4H), 7.16-7.08 (m, 7H), 7.04-6.99 (m, 3H), 6.95 (t, 1H) | 647.78 | 647.74 |
| 34 | δ = 8.21 (s, 1H), 8.13 (s, 1H), 7.83 (d, 2H), 7.62 (s, 2H), 7.44-7.35 (m, 4H), 7.27-7.12 (m, 15H), 7.09 (d, 1H), 7.03-6.99 (m, 3H), 6.94 (t, 2H), 7.05-6.93 (m, 3H) | 746.91 | 746.83 |
| 40 | δ = 8.42 (s, 1H), 8.32 (s, 1H), 7.96 (s, 1H), 7.61-7.51 (m, 5H), 7.45-7.41 (m, 3H), 7.30-6.83 (m, 18H) | 647.78 | 647.66 |
| 45 | δ = 8.32 (s, 1H), 8.28 (s, 1H), 8.01 (d, 1H), 7.88-7.85 (m, 4H), 7.79 (d, 1H), 7.61 (d, 1H), 7.50 (d, 1H), 7.36-7.33 (m, 3H), 7.24 (m, 1H), 7.14-7.03 (m, 12H), 6.97-6.84 (m, 5H) | 725.86 | 725.67 |
| 58 | δ = 8.05-7.99 (m, 4H), 7.61-7.54 (m, 6H), 7.45 (dd, 1H), 7.40 (dd, 1H), 7.35-6.92 (m, 18H) | 646.79 | 646.84 |
| 68 | δ = 8.28 (s, 1H), 8.20 (s, 1H), 7.89 (d, 2H), 7.68 (d, 1H), 7.52-7.42 (m, 6H), 7.36 (dd, 1H), 7.31-7.16 (m, 13H), 7.14 (dd, 1H), 7.08-7.05 (m, 3H), 6.99 (t, 2H), 6.91-6.84 (m, 3H) | 746.91 | 746.79 |
| 73 | δ = 8.27 (s, 1H), 8.19 (m, 1H), 8.14 (d, 2H), 7.92 (d, 1H), 7.72-7.70 (m, 2H), 7.63-7.58 (m, 3H), 7.53-7.48 (m, 4H), 7.44-7.37 (m, 4H), 7.32-7.20 (m, 7H), 7.14-7.08 (m, 3H), 7.02 (t, 2H) | 646.79 | 646.68 |
| 75 | δ = 8.17 (s, 1H), 8.02 (d, 1H), 7.97 (s, 1H), 7.92 (s, 1H), 7.70 (d, 2H), 7.58-7.53 (m, 2H), 7.45-7.24 (m, 8H), 7.18 (t, 1H)) | 419.48 | 419.41 |
| 94 | δ = 8.29 (s, 1H), 8.15 (s, 1H), 7.83 (dd, 2H), 7.51 (dd, 1H), 7.46 (dd, 1H), 7.39-7.33 (m, 3H), 7.27-7.04 (m, 10H), 6.98-6.89 (m, 3H), 6.83 (t, 1H) | 545.64 | 545.52 |
| 102 | δ = 8.20 (d, 1H), 8.14 (s, 1H), 8.05-7.99 (m, 4H), 7.67 (d, 1H), 7.60-7.51 (m, 5H), 7.33-7.28 (m, 4H), 7.17-7.09 (m, 3H), 6.99 (t, 1H), 6.94 (t, 1H) | 511.64 | 511.58 |

Example 1

An ITO glass substrate (a product of Corning Co., Ltd) including an 15 Ω/cm$^2$ ITO layer (1,200 Å thickness) was cut to a size of 50 mm×50 mm×0.7 mm, sonicated by using isopropyl alcohol and pure water each for 5 minutes, and cleaned by the exposure to ultraviolet rays for 30 minutes and then to ozone. Then, the ITO glass substrate was mounted on a vacuum deposition apparatus.

2-TNATA was deposited on the ITO layer acting as an anode to form a hole injection layer having a thickness of 600 Å, NPB was deposited on the hole injection layer to form a hole transport layer having a thickness of 300 Å, and then, ADN (host) and DPAVBi (dopant) were co-deposited at a weight ratio of 98:2 on the hole transport layer to form an emission layer having a thickness of 300 Å.

Thereafter, Compound 2 was deposited on the emission layer to form an electron transport layer having a thickness of 300 Å, LiF was deposited on the electron transport layer to form an electron injection layer having a thickness of 10 Å, and Al was deposited on the electron injection layer to form a cathode having a thickness of 3,000 Å, thereby completing the manufacture of an organic light-emitting device.

Example 2

An organic light-emitting device was manufactured in the same manner as in Example 1, except that in forming an electron transport layer, Compound 5 was used instead of Compound 2.

Example 3

An organic light-emitting device was manufactured in the same manner as in Example 1, except that in forming an electron transport layer, Compound 10 was used instead of Compound 2.

Example 4

An organic light-emitting device was manufactured in the same manner as in Example 1, except that in forming an electron transport layer, Compound 13 was used instead of Compound 2.

Example 5

An organic light-emitting device was manufactured in the same manner as in Example 1, except that in forming an electron transport layer, Compound 17 was used instead of Compound 2.

Example 6

An organic light-emitting device was manufactured in the same manner as in Example 1, except that in forming an electron transport layer, Compound 36 was used instead of Compound 2.

Example 7

An organic light-emitting device was manufactured in the same manner as in Example 1, except that in forming an electron transport layer, Compound 41 was used instead of Compound 2.

Example 8

An organic light-emitting device was manufactured in the same manner as in Example 1, except that in forming an electron transport layer, Compound 67 was used instead of Compound 2.

Example 9

An organic light-emitting device was manufactured in the same manner as in Example 1, except that in forming an electron transport layer, Compound 71 was used instead of Compound 2.

Example 10

An organic light-emitting device was manufactured in the same manner as in Example 1, except that in forming an electron transport layer, Compound 79 was used instead of Compound 2.

Example 11

An organic light-emitting device was manufactured in the same manner as in Example 1, except that in forming an electron transport layer, Compound 100 was used instead of Compound 2.

Example 12

An organic light-emitting device was manufactured in the same manner as in Example 1, except that in forming an electron transport layer, Compound 109 was used instead of Compound 2.

Comparative Example 1

An organic light-emitting device was manufactured in the same manner as in Example 1, except that in forming an electron transport layer, $Alq_3$ was used instead of Compound 2.

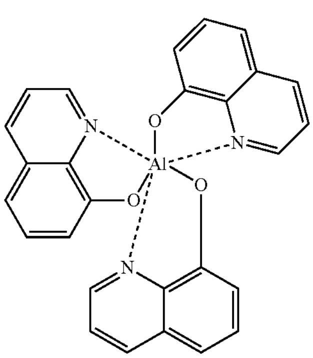

Alq3

Comparative Example 2

An organic light-emitting device was manufactured in the same manner as in Example 1, except that in forming an electron transport layer, Compound A was used instead of Compound 2.

<Compound A>

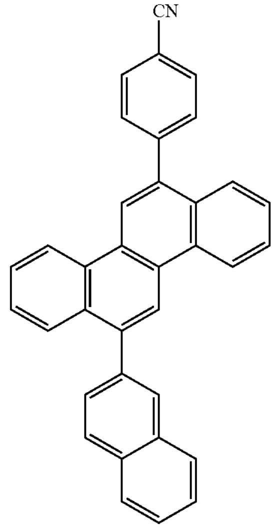

Comparative Example 3

An organic light-emitting device was manufactured in the same manner as in Example 1, except that in forming an electron transport layer, Compound B was used instead of Compound 2.

<Compound B>

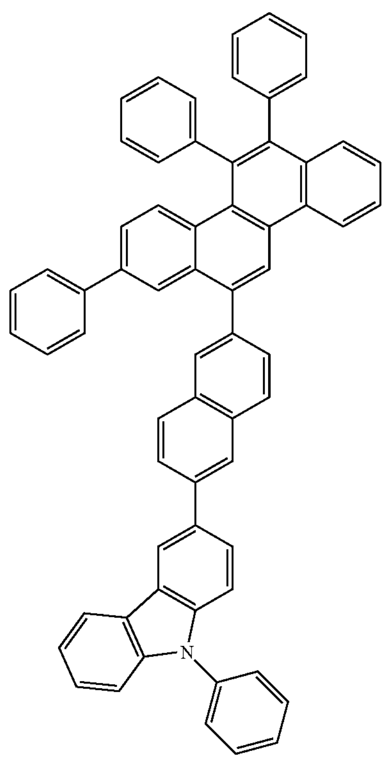

Evaluation Example 1

The driving voltage, current density, brightness, efficiency, and half-lifespan of the organic light-emitting devices manufactured according to Examples 1 to 12, and Comparative Examples 1 to 3 were measured by using a Kethley SMU 236 and a brightness photometer PR650, and results thereof are shown to Table 2, below. The half-lifespan is a period of time that is taken until the brightness of the organic light-emitting device reduces down to 50% of the initial brightness.

TABLE 2

| | Electron transport layer | Driving voltage (V) | Current Density ($mA/cm^2$) | Brightness ($cd/m^2$) | Efficiency (cd/A) | Emission color | Half lifespan (hr @ 100 $mA/cm^2$) |
|---|---|---|---|---|---|---|---|
| Example 1 | Compound 2 | 5.27 | 50 | 3285 | 6.57 | Blue | 524 |
| Example 2 | Compound 5 | 5.46 | 50 | 3165 | 6.33 | Blue | 489 |
| Example 3 | Compound 10 | 5.13 | 50 | 3390 | 6.78 | Blue | 427 |
| Example 4 | Compound 13 | 5.36 | 50 | 3310 | 6.62 | Blue | 463 |
| Example 5 | Compound 17 | 5.05 | 50 | 3505 | 7.01 | Blue | 308 |
| Example 6 | Compound 36 | 5.30 | 50 | 3405 | 6.81 | Blue | 467 |
| Example 7 | Compound 41 | 4.95 | 50 | 3560 | 7.12 | Blue | 280 |
| Example 8 | Compound 67 | 5.47 | 50 | 3435 | 6.87 | Blue | 454 |
| Example 9 | Compound 71 | 5.43 | 50 | 3490 | 6.98 | Blue | 479 |
| Example 10 | Compound 79 | 5.39 | 50 | 3140 | 6.28 | Blue | 435 |
| Example 11 | Compound 100 | 5.34 | 50 | 3410 | 6.82 | Blue | 336 |
| Example 12 | Compound 109 | 5.12 | 50 | 3465 | 6.93 | Blue | 348 |
| Comparative Example 1 | $Alq_3$ | 7.28 | 50 | 2160 | 4.32 | Blue | 145 |
| Comparative Example 2 | Compound A | 5.45 | 50 | 2680 | 5.36 | Blue | 449 |
| Comparative Example 3 | Compound B | 5.96 | 50 | 2990 | 5.98 | Blue | 328 |

From Table 1, it may be seen that the driving voltage, current density, brightness, efficiency, and half-lifespan of the organic light-emitting devices manufactured according to Examples 1 to 12 were higher than the driving voltage, current density, brightness, efficiency, and half-lifespan of the organic light-emitting devices manufactured according to Comparative Examples 1 to 3, e.g., Comparative Examples 1 and 3.

As described above, an organic light -emitting device including a condensed cyclic compound according to an embodiment may have a low driving voltage, high efficiency, high brightness, and long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described on connection with other embodiments unless otherwise specifically indicated. Accordingly, it will be understood by those of skill in the art that various changes in form and details may be made without departing from the spirit and scope of the present invention as set forth in the following claims.

What is claimed is:

1. A condensed cyclic compound represented by Formula 1:

<Formula 1>

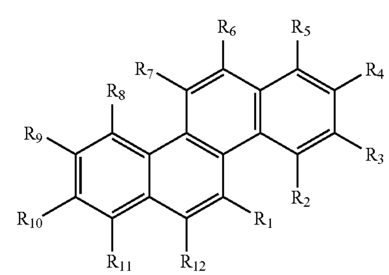

wherein, in Formula 1, $R_6$ to $R_{12}$ are each independently selected from a group represented by Formula 2, below, a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic hetero-condensed polycyclic group, the group represented by Formula 2 being different from the substituted monovalent non-aromatic hetero-condensed polycyclic group, —N($Q_1$)($Q_2$), —Si($Q_3$)($Q_4$)($Q_5$), and —B($Q_6$)($Q_7$), provided that at least one of $R_6$ to $R_{12}$ is a group represented by Formula 2, in which * represents a binding site;

<Formula 2>

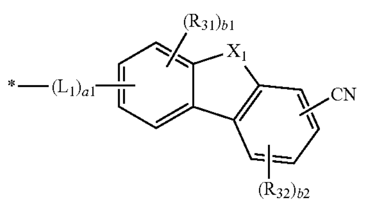

wherein in Formulae 1 and 2, $X_1$ is N($R_{21}$), O, or S;

each $L_1$ is independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, a substituted or unsubstituted $C_2$-$C_{60}$ heteroarylene group, a substituted or unsubstituted divalent non-aromatic condensed polycyclic group, and a substituted or unsubstituted divalent non-aromatic hetero-condensed polycyclic group;

a1 is selected from 0, 1, 2, and 3;

b1 and b2 are each independently selected from 0, 1, 2, and 3;

$R_1$ to $R_5$ and $R_8$ to $R_{11}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group a substituted or unsubstituted $C_3$-$C_{10}$ cycloalkenyl group, a substituted or unsubstituted $C_2$-$C_{10}$ heterocycloalkenyl group, —N($Q_1$)($Q_2$), —Si($Q_3$)($Q_4$)($Q_5$), and —B($Q_6$)($Q_7$), in which * represents a binding site;

$R_7$ is hydrogen;

at least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted divalent non-aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_2$-$C_{60}$ heteroaryl group, the substituted monovalent non-aromatic condensed polycyclic group, and the substituted monovalent non-aromatic hetero-condensed polycyclic group is selected from:

a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic hetero-condensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —N($Q_{21}$)($Q_{22}$), —Si($Q_{23}$)($Q_{24}$)($Q_{25}$), and —B($Q_{26}$)( $Q_{27}$); and —N($Q_{31}$)($Q_{32}$), —Si($Q_{33}$)($Q_{34}$)($Q_{35}$), and —B($Q_{36}$)($Q_{37}$); and $R_{21}$, $R_{31}$ $R_{32}$, $Q_1$ to $Q_7$, $Q_{11}$ to $Q_{17}$, $Q_{21}$ to $Q_{27}$, and $Q_{31}$ to $Q_{37}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_2$-$C_{60}$ heteroaryl group, a monovalent non-aromatic condensed polycyclic group, and a monovalent non-aromatic hetero-condensed polycyclic group.

2. The condensed cyclic compound as claimed in claim 1, wherein each $L_1$ is independently selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzooxazolylene group, an isobenzooxazolylene group, a triazolylene group, a tetrazolylene group. an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group and an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spiro- fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group and an imidazopyrimidinylene group, each substituted with at least one selected from a deuterium, —F, —Cl, —Br —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a cyclopentyl group a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazolpyridinyl group and an imidazopyridinylene group.

3. The condensed cyclic compound as claimed in claim 1, wherein each $L_1$ is independently a group represented by one of Formulae 3-1 to 3-32, below:

Formula 3-1

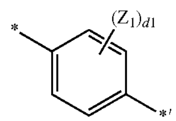

Formula 3-2

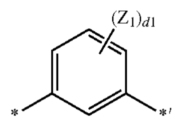

Formula 3-3

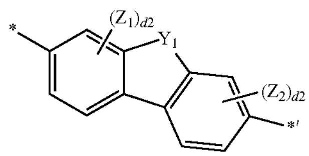

Formula 3-4

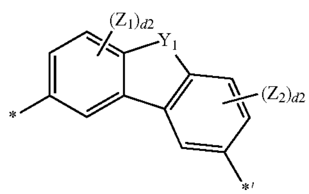

Formula 3-5

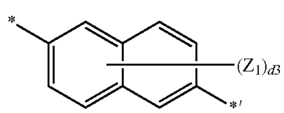

Formula 3-6

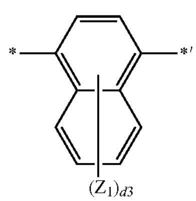

Formula 3-7

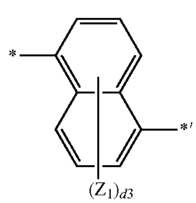

Formula 3-8

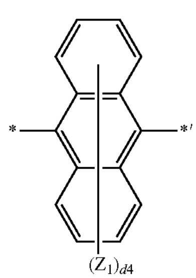

-continued

Formula 3-9

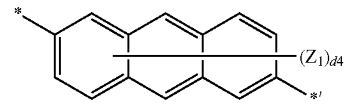

Formula 3-10

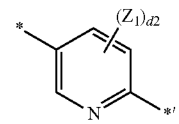

Formula 3-11

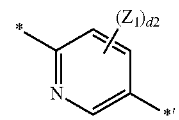

Formula 3-12

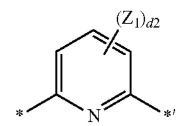

Formula 3-13

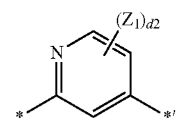

Formula 3-14

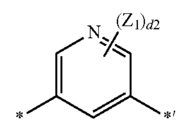

Formula 3-15

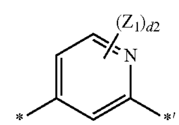

Formula 3-16

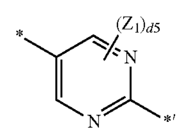

Formula 3-17

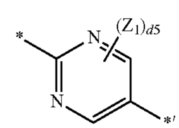

Formula 3-18

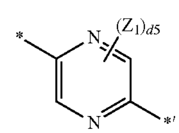

Formula 3-19

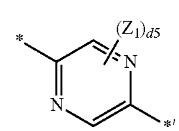

Formula 3-20

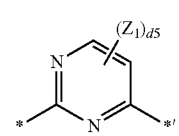

-continued

Formula 3-21

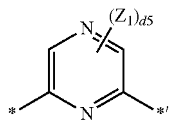

Formula 3-22

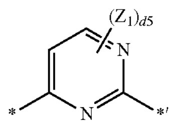

Formula 3-23

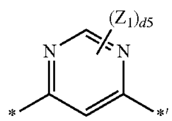

Formula 3-24

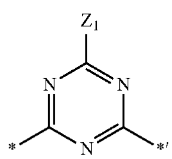

Formula 3-25

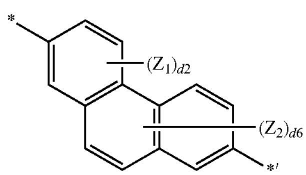

Formula 3-26

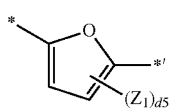

Formula 3-27

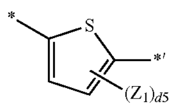

Formula 3-28

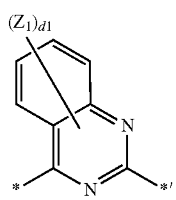

Formula 3-29

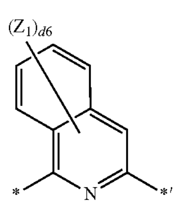

Formula 3-30

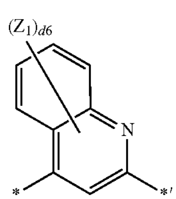

-continued

Formula 3-31

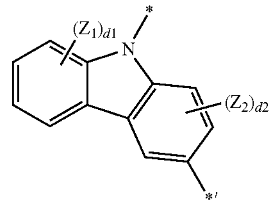

Formula 3-32

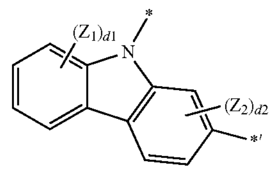

wherein in Formulae 3-1 to 3-32, $Y_1$ is O, S, $C(Z_3)(Z_4)$, $N(Z_5)$, or $Si(Z_6)(Z_7)$;

$Z_1$ to $Z_7$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a Spiro- fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, d1 is selected from an integer of 1 to 4;

d2 is selected from an integer of 1 to 3;

d3 is selected from an integer of 1 to 6;

d4 is selected from an integer of 1 to 8;

d5 is selected from 1 or 2;

d6 is selected from an integer of 1 to 5, and

* and *' represent binding sites.

4. The condensed cyclic compound as claimed in claim 1, wherein each $L_1$ is independently a group represented by one of Formulae 4-1 to 4-23 below, in which * and *' represent binding sites:

Formula 4-1

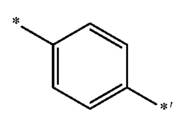

Formula 4-2

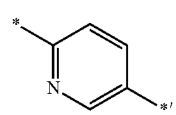

Formula 4-3

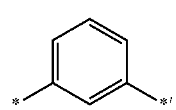

Formula 4-4

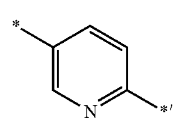

-continued
Formula 4-5
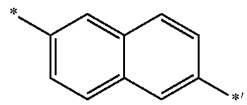
Formula 4-6
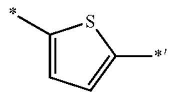
Formula 4-7
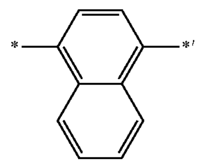
Formula 4-8
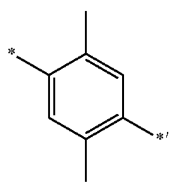
Formula 4-9
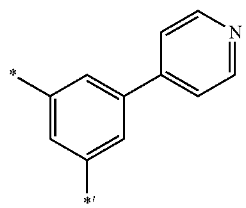
Formula 4-10
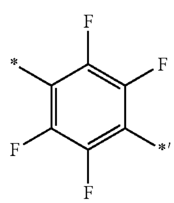
Formula 4-11
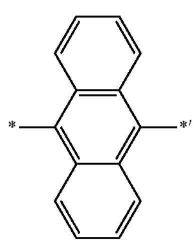
Formula 4-12
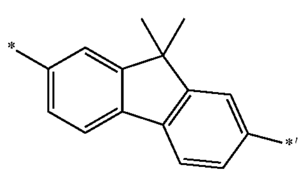
Formula 4-13
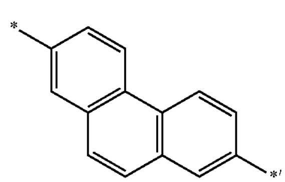
-continued
Formula 4-14
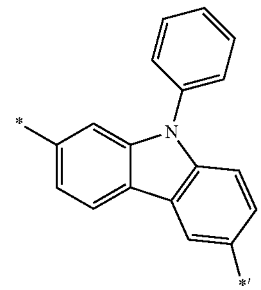
Formula 4-15
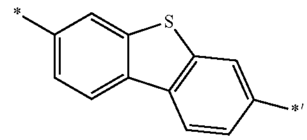
Formula 4-16
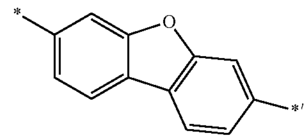
Formula 4-17
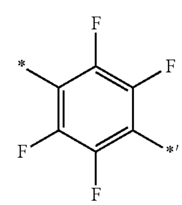
Formula 4-18
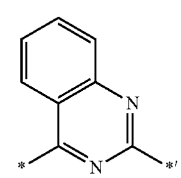
Formula 4-19
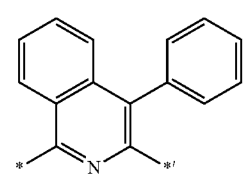
Formula 4-20
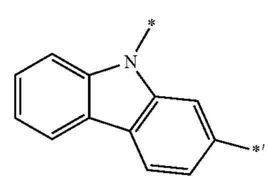
Formula 4-21
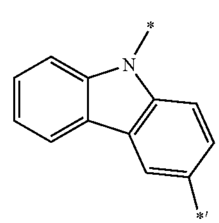

-continued

Formula 4-22

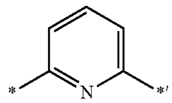

Formula 4-23

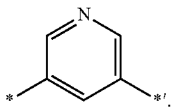

5. The condensed cyclic compound as claimed in claim 1, wherein a1 in Formula 2 is 0 or 1.

6. The condensed cyclic compound as claimed in claim 1, wherein in Formula 2, $X_1$ is $N(R_{21})$; and $R_{21}$ is selected from:

a phenyl group, a pentalenyl group, an indenyl group, a naphthyl group, an azulenyl group, a heptalenyl group, an indacenyl group, an acenaphthyl group, a fluorenyl group, a Spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazolpyridinyl group and an imidazopyrimidinyl group; and a phenyl group, a pentalenyl group, an indenyl group, a naphthyl group, an azulenyl group, a heptalenyl group, an indacenyl group, an acenaphthyl group, a fluorenyl group, a Spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazolpyridinyl group and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a cyclopentyl group a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazolpyridinyl group, and an imidazopyrimidinyl group.

7. The condensed cyclic compound as claimed in claim 1, wherein $X_1$ is $N(R_{21})$; and $R_{21}$ is selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

8. The condensed cyclic compound as claimed in claim 1, wherein:

$R_6$ and $R_{12}$ are each independently selected from:

a group represented by Formula 2, a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and $Si(Q_3)(Q_4)(Q_5)$, in which $Q_3$ to $Q_5$ are each independently selected from a $C_1$-$C_{20}$ alkyl group, a $C_1$-$C_{20}$ alkoxy group, a phenyl group, and a naphthyl group; and at least one of $R_6$ and $R_{12}$ is a group represented by Formula 2.

9. The condensed cyclic compound as claimed in claim 1, wherein, in Formula 1, $R_{12}$ is a group represented by Formula 2.

10. The condensed cyclic compound as claimed in claim 1, wherein, in Formulae 1 and 2:

$X_1$ is $N(R_{21})$; and $R_{21}$ is selected from Formulae 5-1 to 5-35 below, in which * represents a binding site;

$R_6$ and $R_{12}$ are each independently selected from a group represented by Formula 2, a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, and a group represented by one of Formulae 5-1 to 5-35 below, wherein at least one of $R_6$ and $R_{12}$ is a group represented by Formula 2; and $R_{31}$ and $R_{32}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, and a group represented by one of Formulae 5-1 to 5-35 below:

Formula 5-1

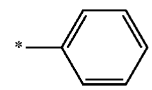

Formula 5-2

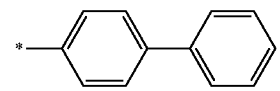

Formula 5-3

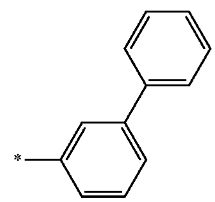

Formula 5-4

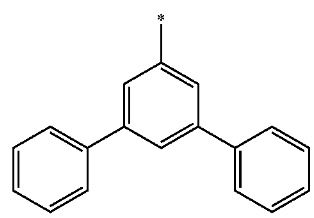

Formula 5-5

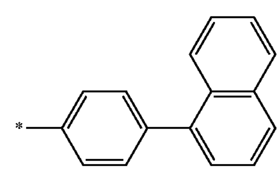

Formula 5-6

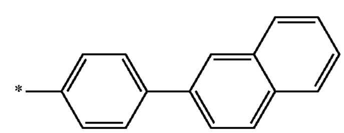

Formula 5-7

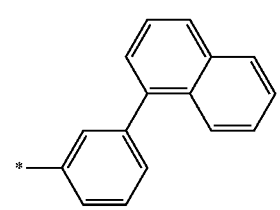

Formula 5-8

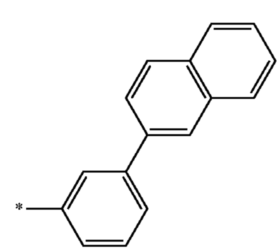

-continued
Formula 5-9
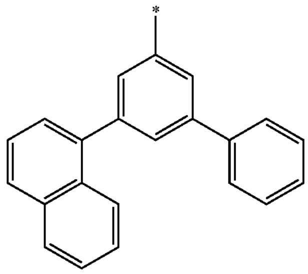
Formula 5-10
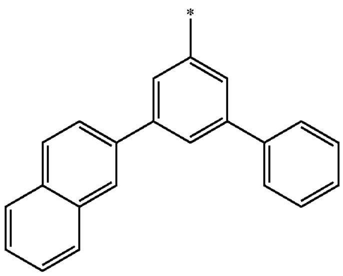
Formula 5-11
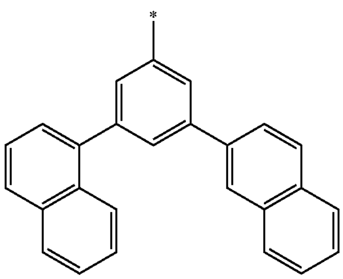
Formula 5-12
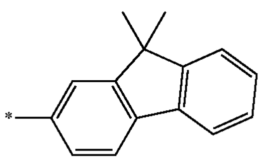
Formula 5-13
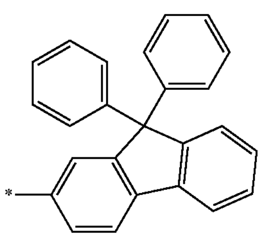
Formula 5-14
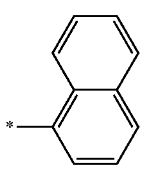
Formula 5-15
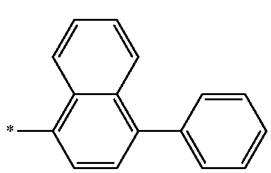
-continued
Formula 5-16
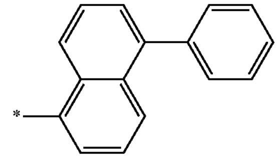
Formula 5-17
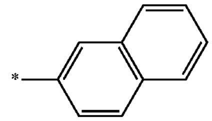
Formula 5-18
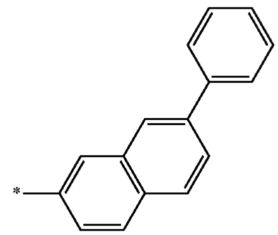
Formula 5-19
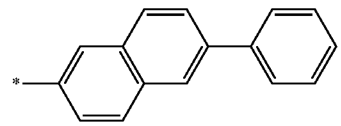
Formula 5-20
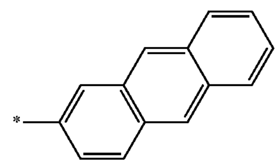
Formula 5-21
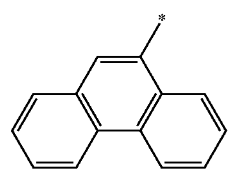
Formula 5-22
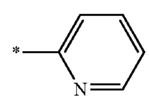
Formula 5-23
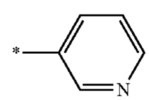
Formula 5-24
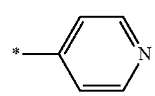
Formula 5-25
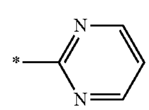
Formula 5-26
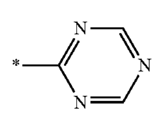

-continued
Formula 5-27
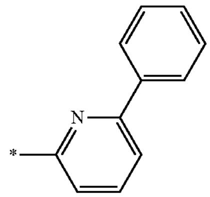
Formula 5-28
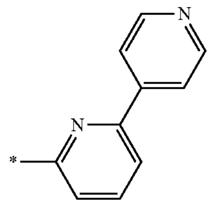
Formula 5-29
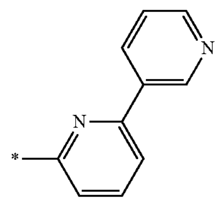
Formula 5-30
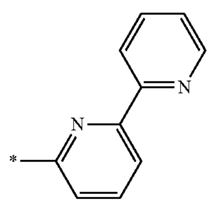
Formula 5-31
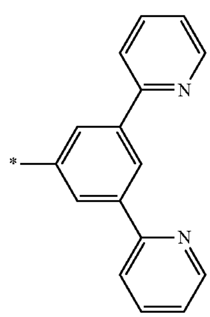
Formula 5-32
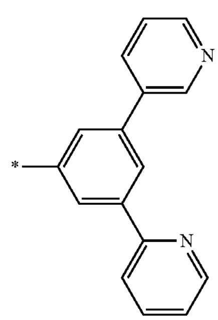
-continued
Formula 5-33
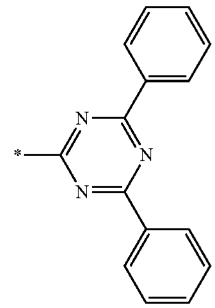
Formula 5-34
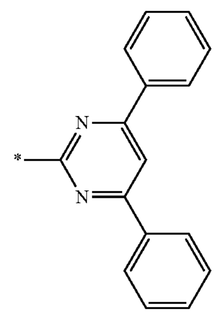
Formula 5-35
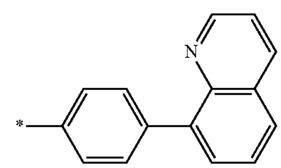
11. The condensed cyclic compound as claimed in claim 1, wherein the condensed cyclic compound represented by Formula 1 is represented by any one of Formulae 1-1 to 1-12 below:
<Formula 1-1>
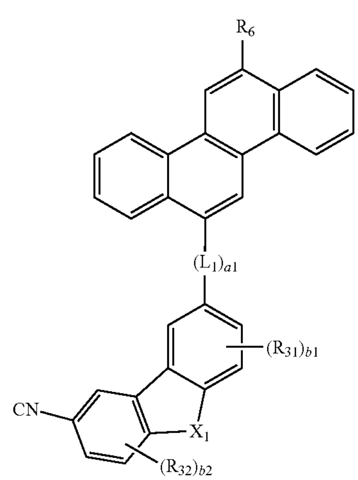

-continued
<Formula 1-2>
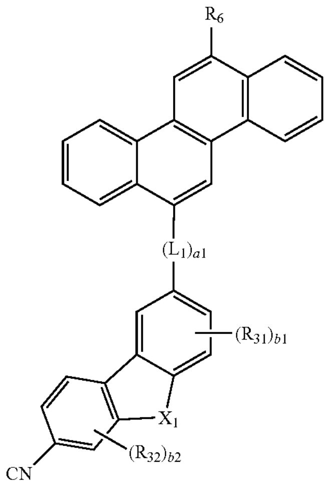
<Formula 1-3>
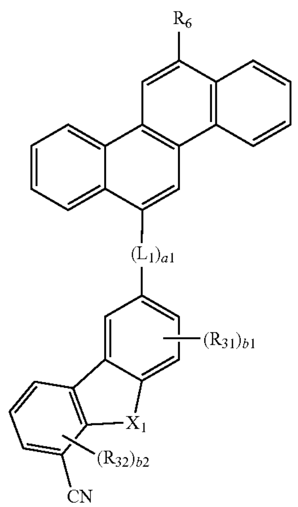
<Formula 1-4>
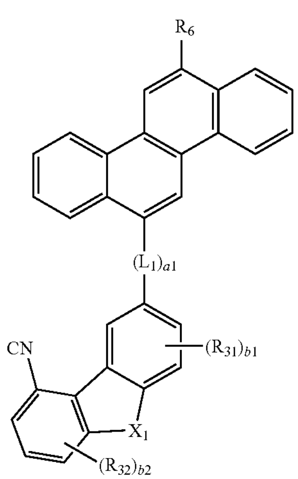
-continued
<Formula 1-5>
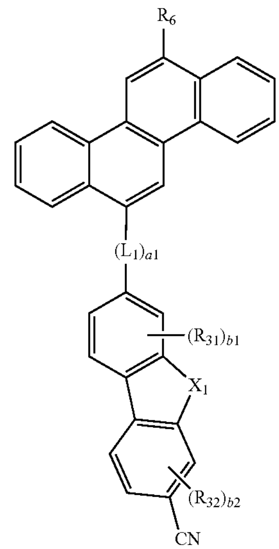
<Formula 1-6>
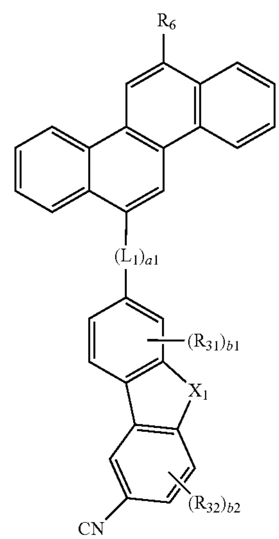
<Formula 1-7>
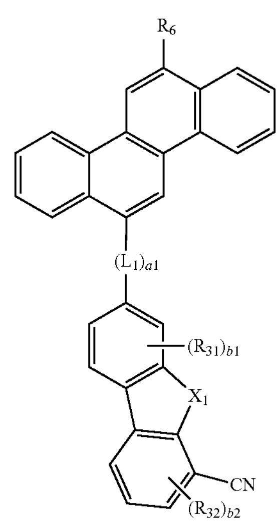

-continued

<Formula 1-8>

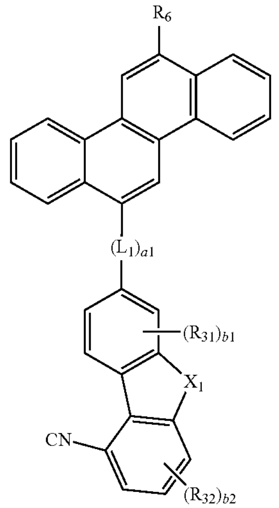

<Formula 1-9>

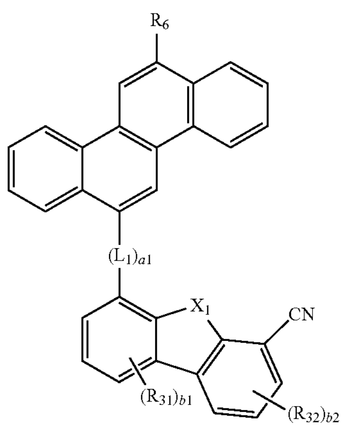

<Formula 1-10>

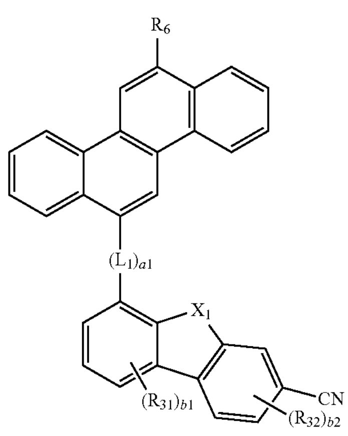

-continued

<Formula 1-11>

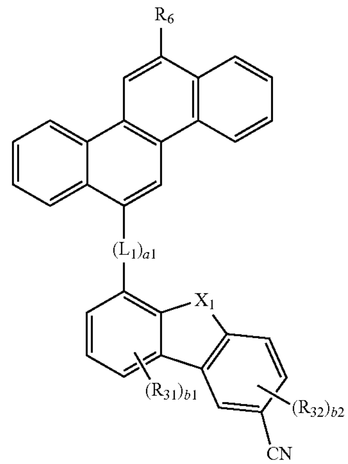

<Formula 1-12>

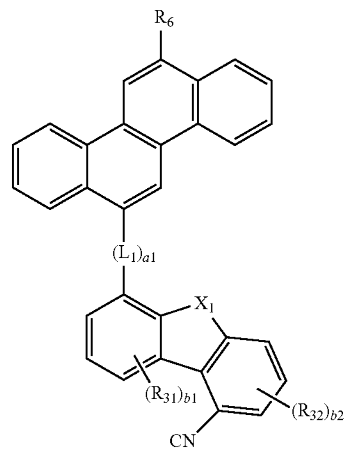

wherein, $X_1$, $L_1$, a1, $R_6$, $R_{31}$, $R_{32}$, and b1 and b2 in Formulae 1-1 to 1-12 are the same as those defined with respect to Formula 1.

12. The condensed cyclic compound as claimed in claim 11, wherein, in Formulae 1-1 to 1-12, a1 is 0 or 1, and $L_1$ is a group represented by one of Formulae 4-1 to 4-23 below, in which * and *' represent binding sites:

Formula 4-1

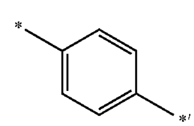

Formula 4-2

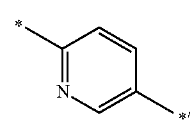

Formula 4-3

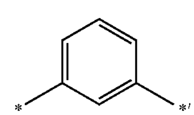

-continued
Formula 4-4
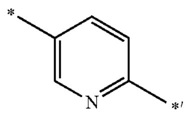
Formula 4-5
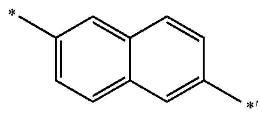
Formula 4-6
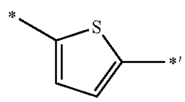
Formula 4-7
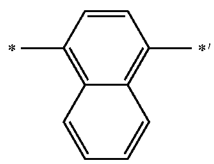
Formula 4-8
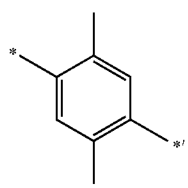
Formula 4-9
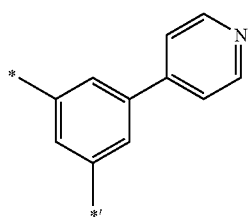
Formula 4-10
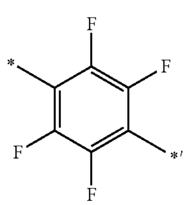
Formula 4-11
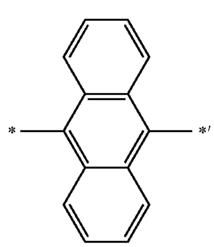
Formula 4-12
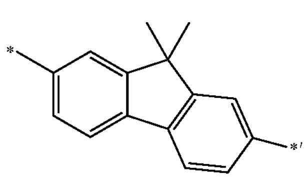
-continued
Formula 4-13
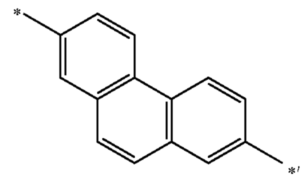
Formula 4-14
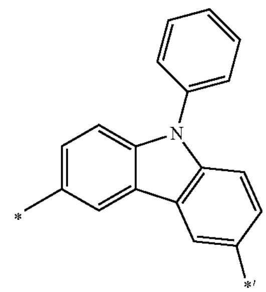
Formula 4-15
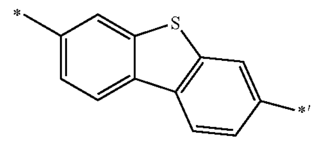
Formula 4-16
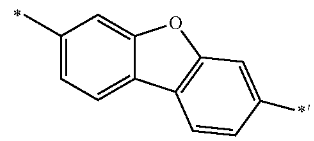
Formula 4-17
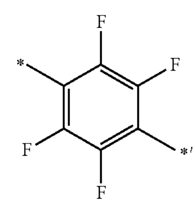
Formula 4-18
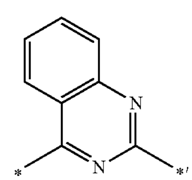
Formula 4-19
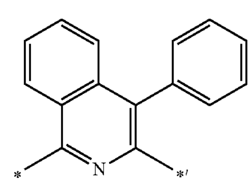
Formula 4-20
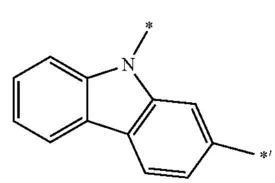

-continued

Formula 4-21

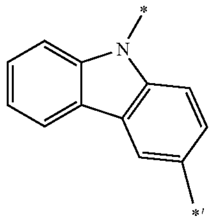

Formula 4-22

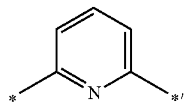

Formula 4-23

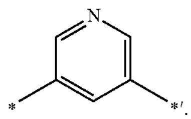

13. The condensed cyclic compound as claimed in claim 11, wherein, in Formulae 1-1 to 1-12:

$X_1$ is $N(R_{21})$;

$R_{21}$ is a group selected from Formulae 5-1 to 5-35, below, in which * represents a binding site; and $R_6$, $R_{31}$, and $R_{32}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, and Formulae 5-1 to 5-35 below:

Formula 5-1

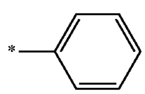

Formula 5-2

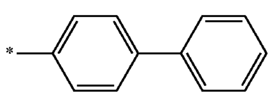

Formula 5-3

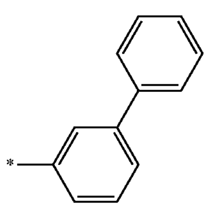

Formula 5-4

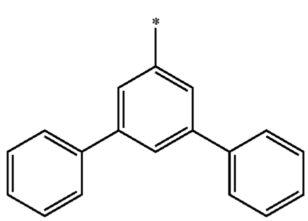

-continued

Formula 5-5

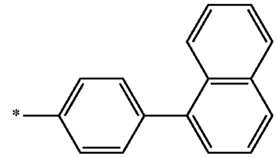

Formula 5-6

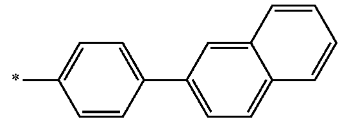

Formula 5-7

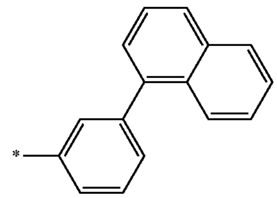

Formula 5-8

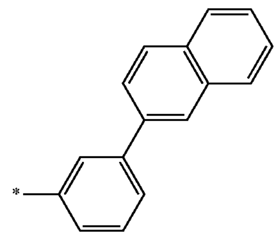

Formula 5-9

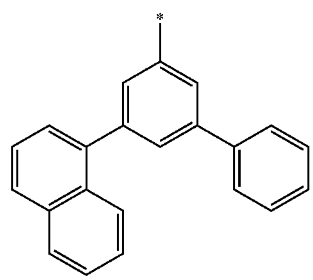

Formula 5-10

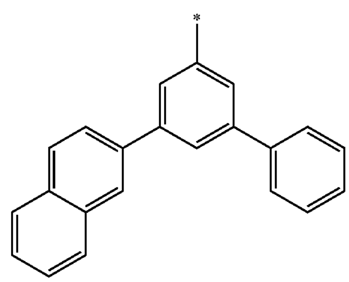

Formula 5-11

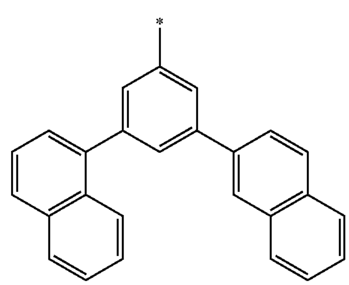

-continued
Formula 5-12
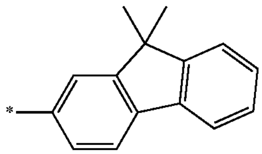
Formula 5-13
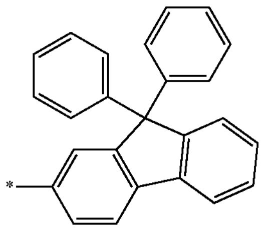
Formula 5-14
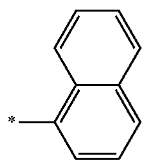
Formula 5-15
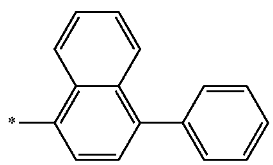
Formula 5-16
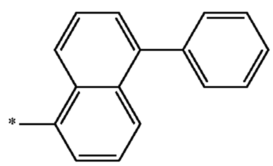
Formula 5-17
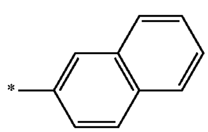
Formula 5-18
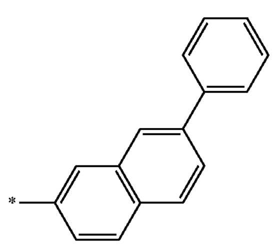
Formula 5-19
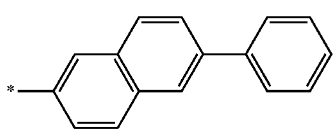
Formula 5-20
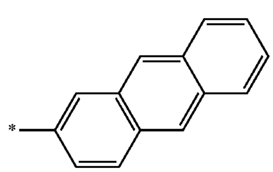
-continued
Formula 5-21
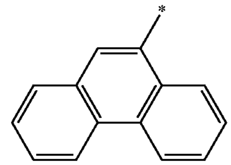
Formula 5-22
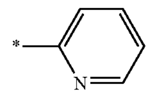
Formula 5-23
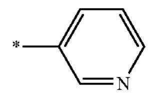
Formula 5-24
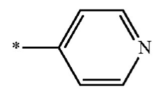
Formula 5-25
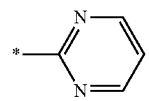
Formula 5-26
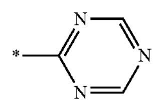
Formula 5-27
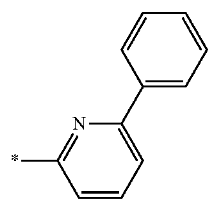
Formula 5-28
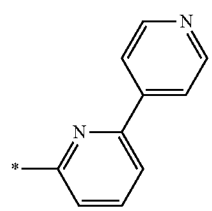
Formula 5-29
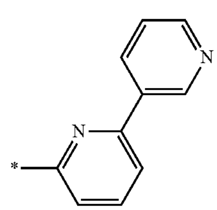
Formula 5-30
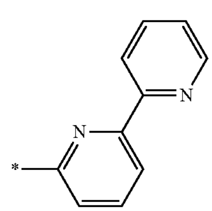

-continued
Formula 5-31
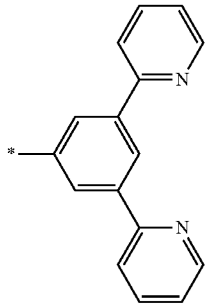
Formula 5-32
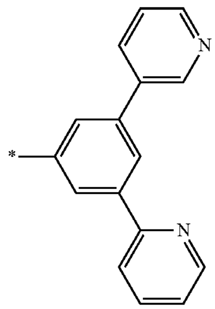
Formula 5-33
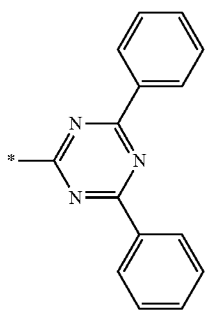
Formula 5-34
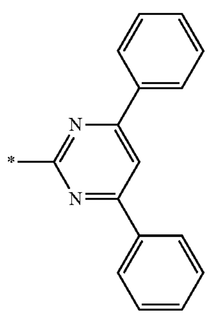
Formula 5-35
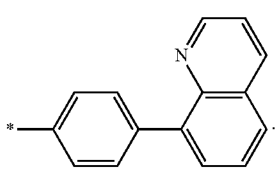
14. The condensed cyclic compound as claimed in claim 11, wherein the condensed cyclic compound represented by Formula 1 is represented by any one of Formulae 1-1, 1-5, 1-6, and 1-9.
15. The condensed cyclic compound as claimed in claim 1, wherein the condensed cyclic compound represented by Formula 1 is one of Compounds 1 to 116 below:
1
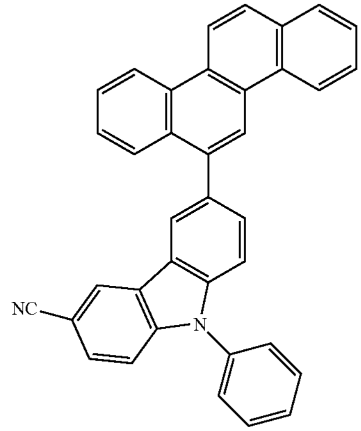
2
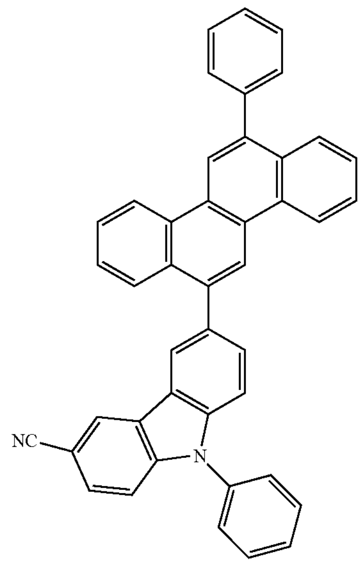
3
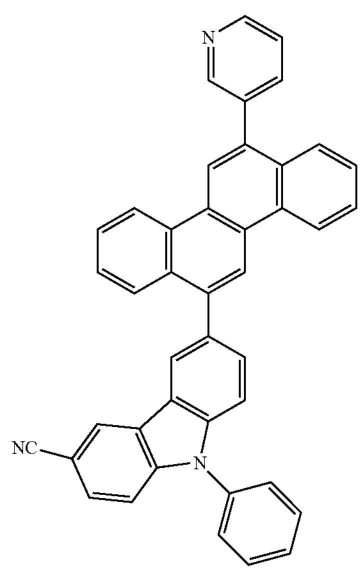

-continued
4
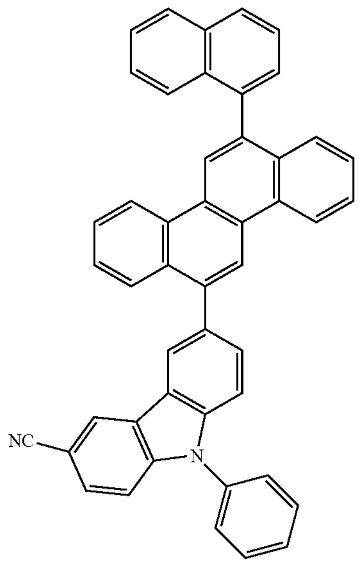
5
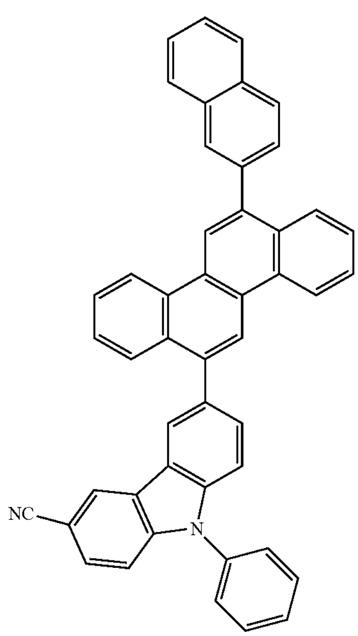
-continued
6
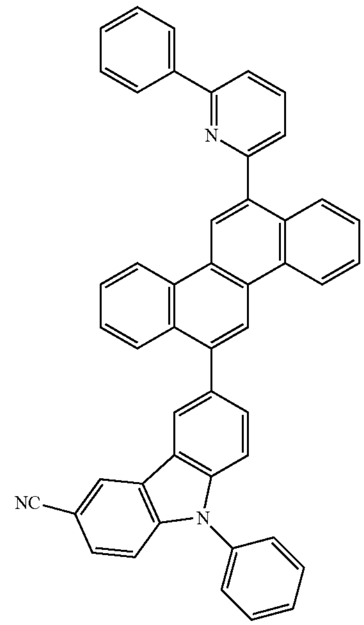
7
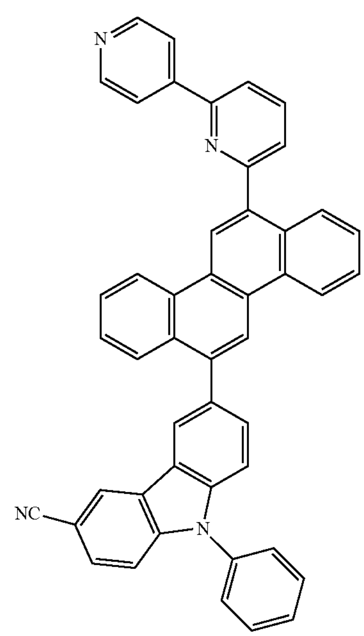

-continued
8
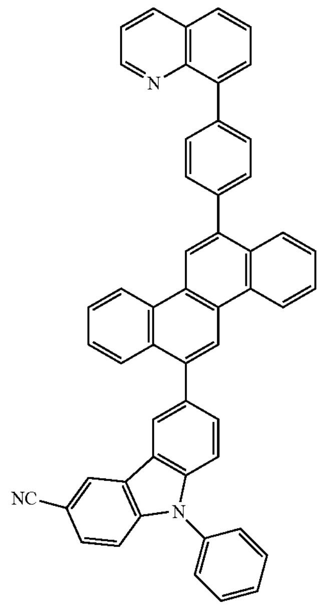
9
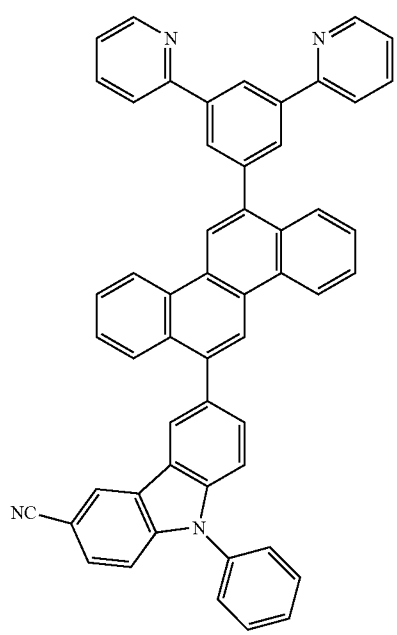
-continued
10
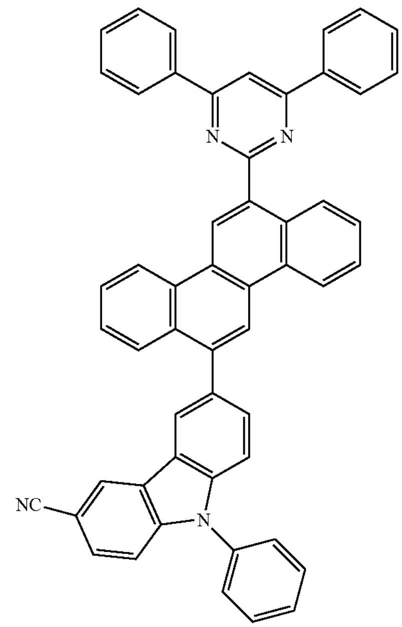
11
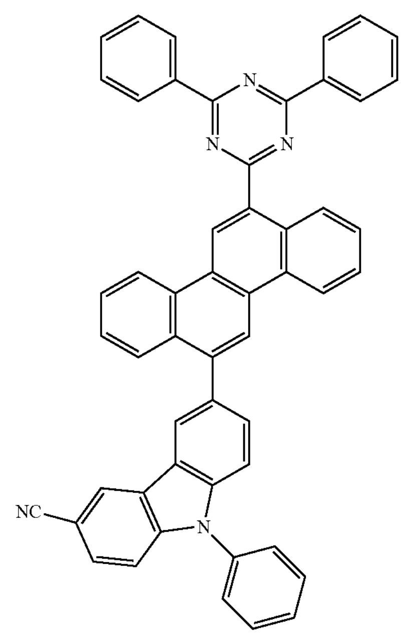

-continued
12
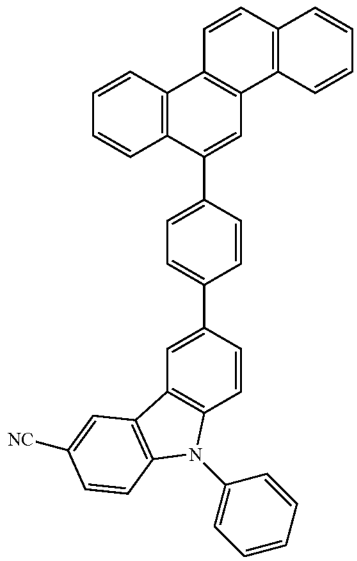
13
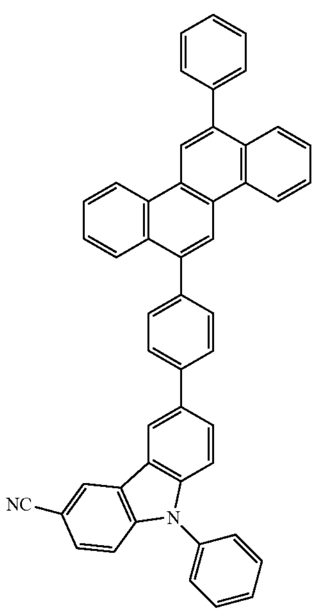
-continued
14
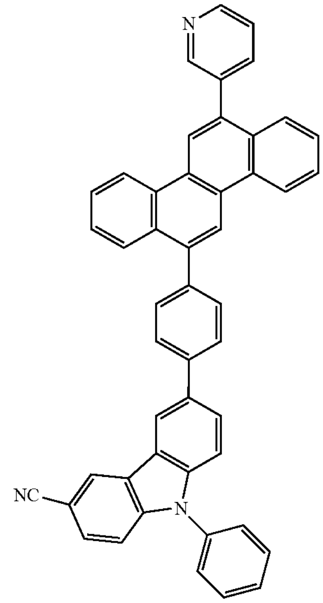
15
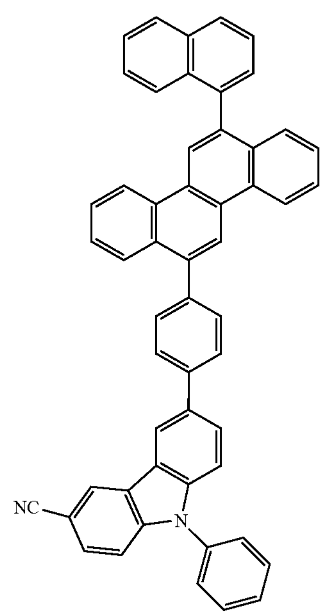

-continued
16
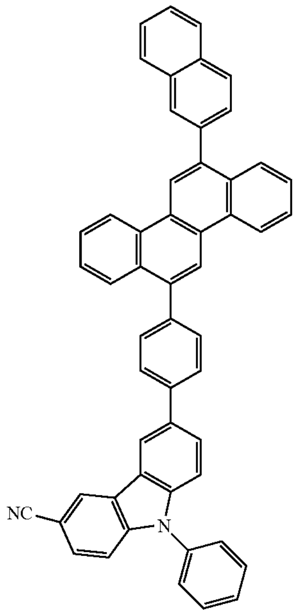
17
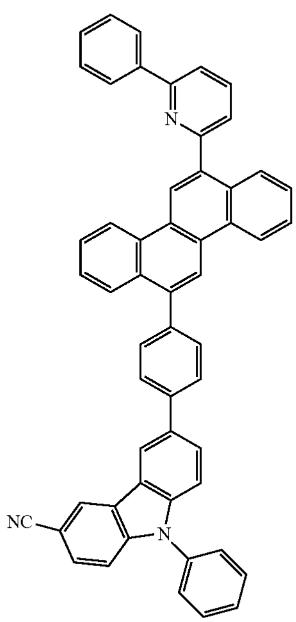
-continued
18
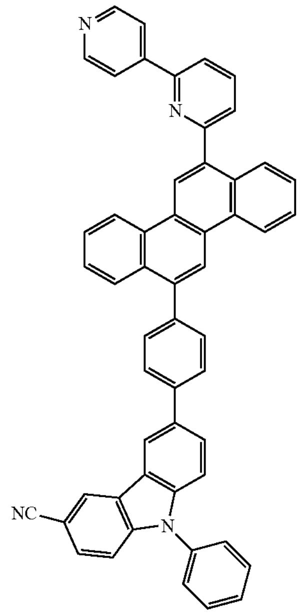
19
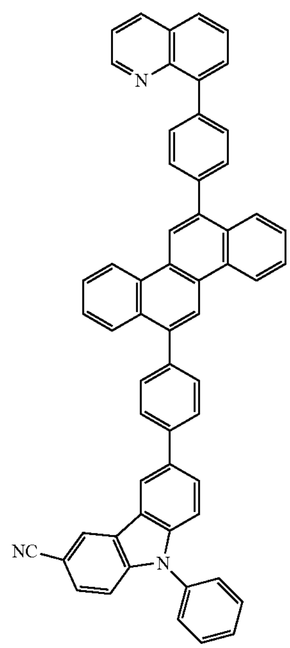

-continued
20
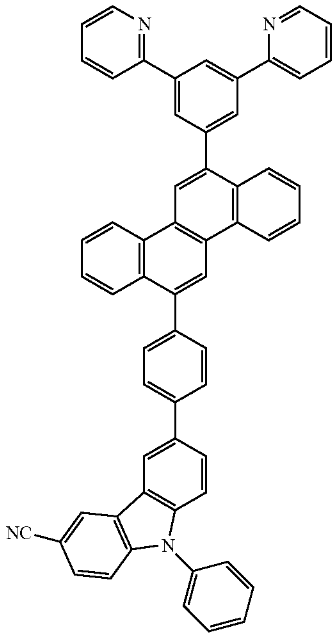
21
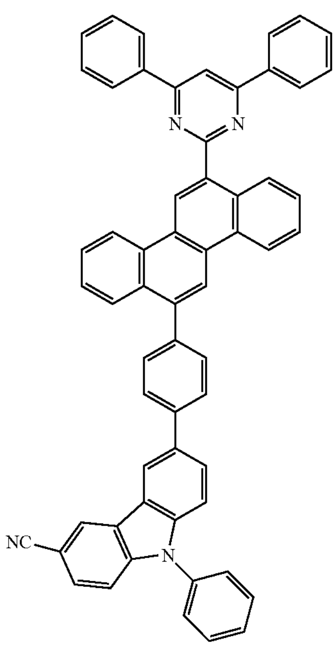
-continued
22
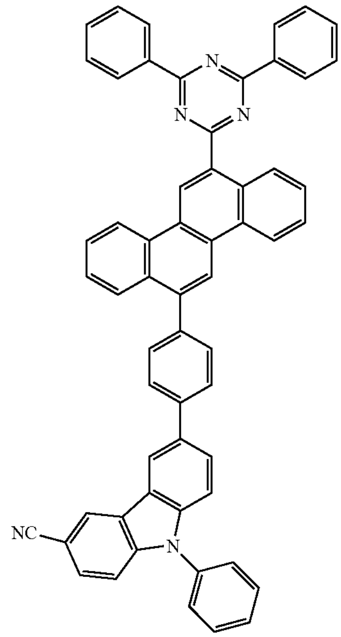
23
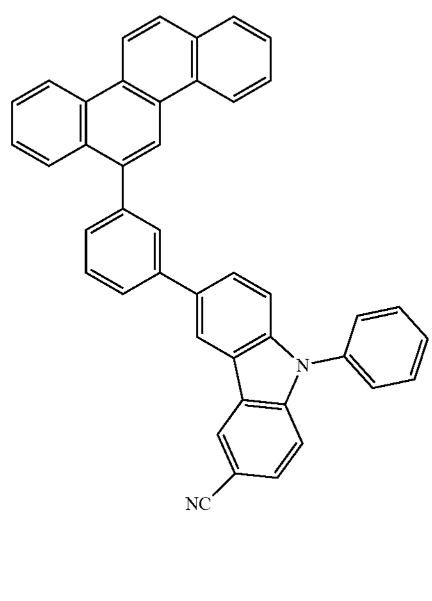

-continued
24
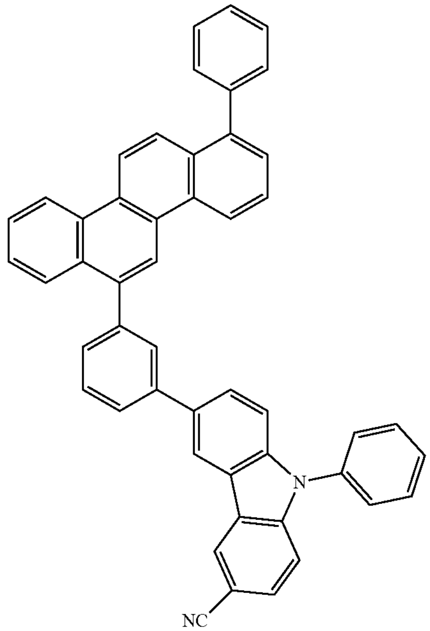
25
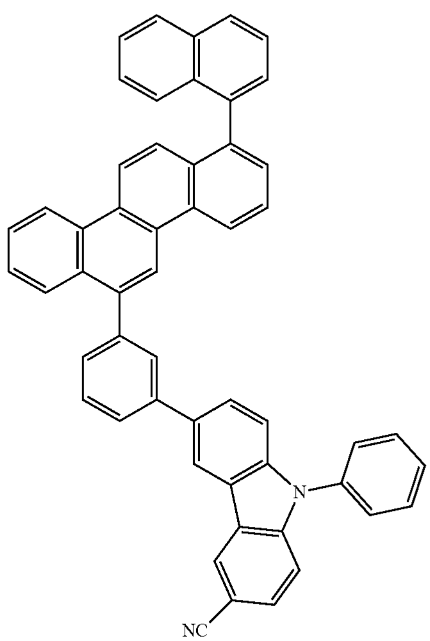
-continued
26
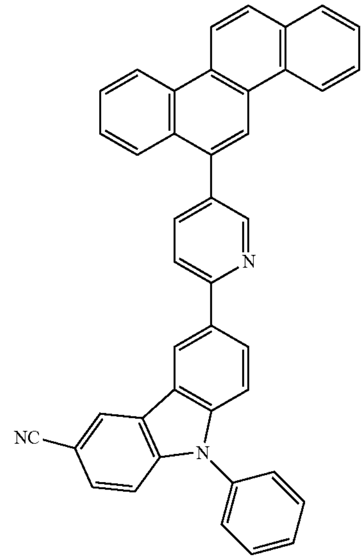
27
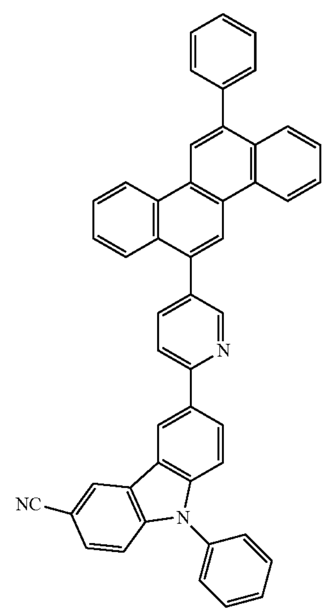

28
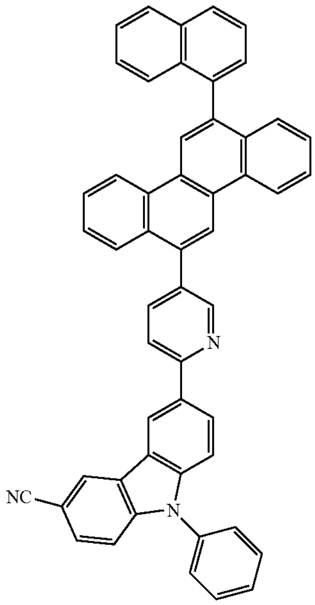
29
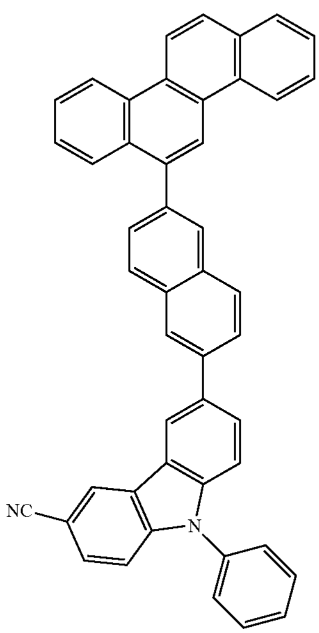
30
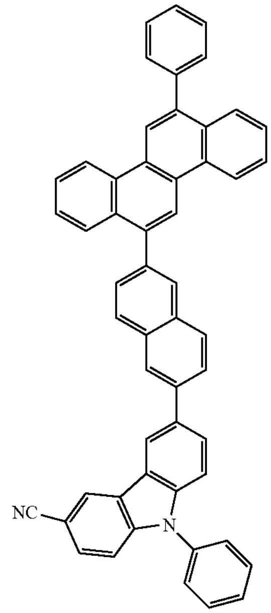
31
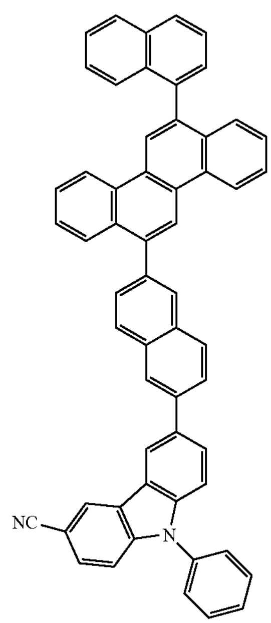

-continued
32
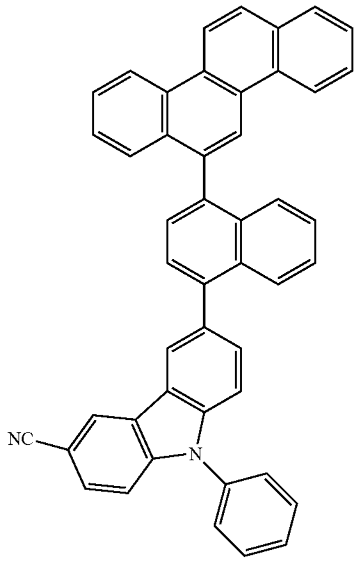
33
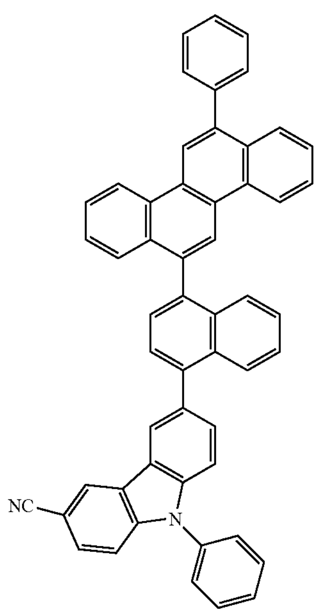
-continued
34
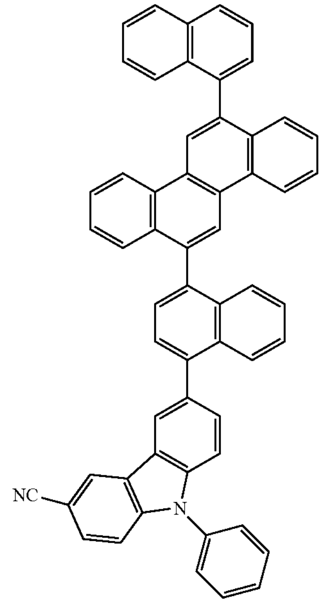
35
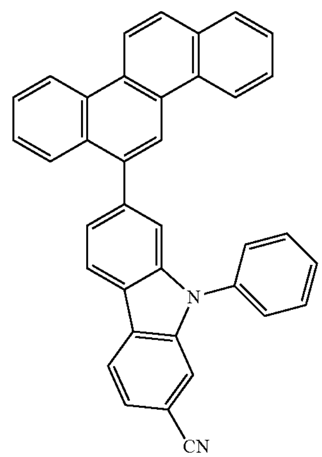
36
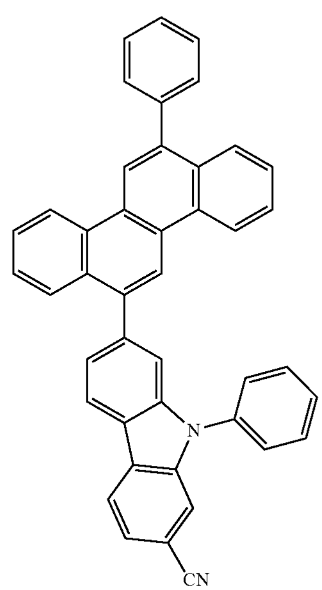

-continued
37
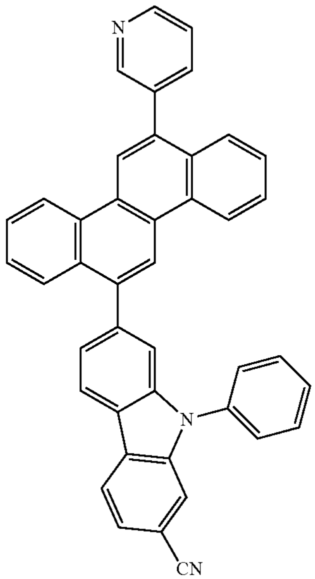
39
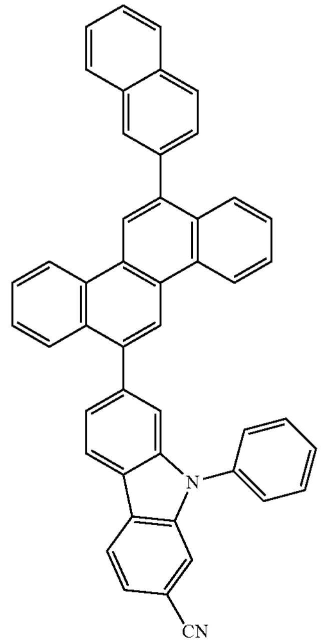
38
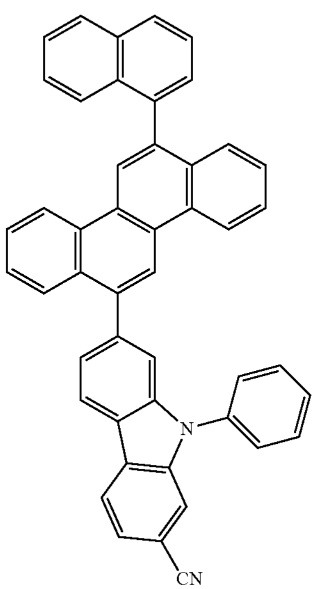
40
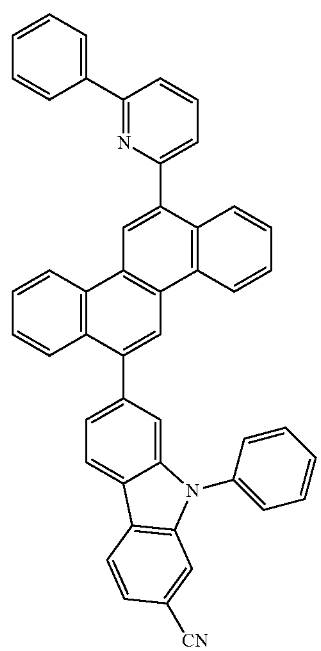

-continued
41
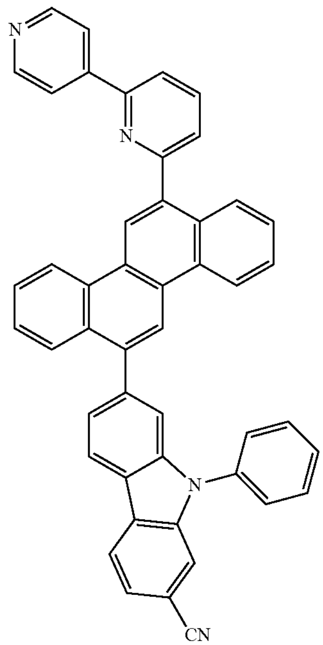
42
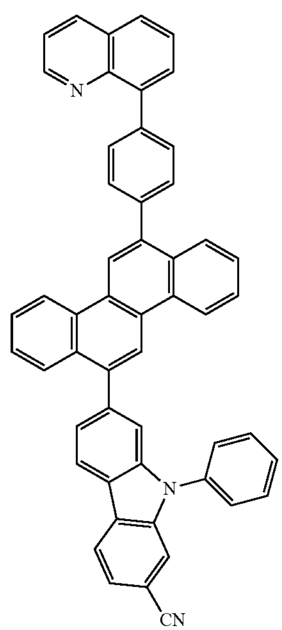
-continued
43
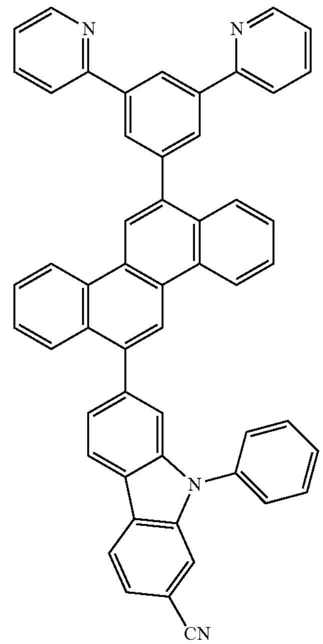
44
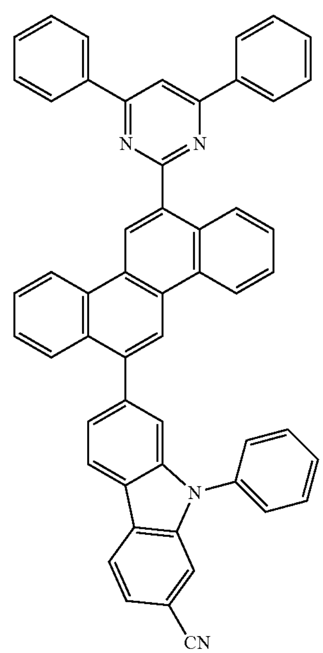

-continued
45
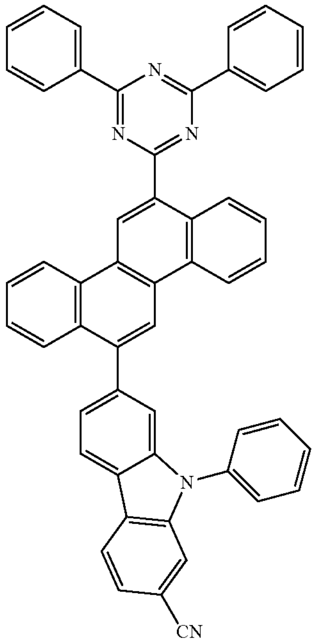
46
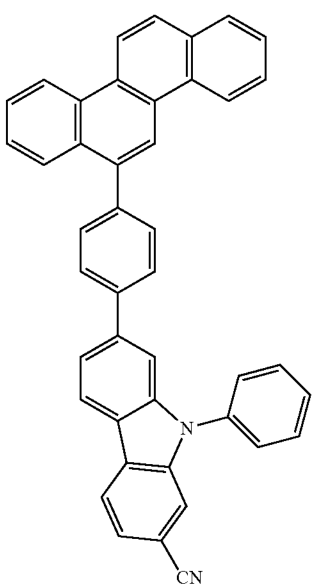
-continued
47
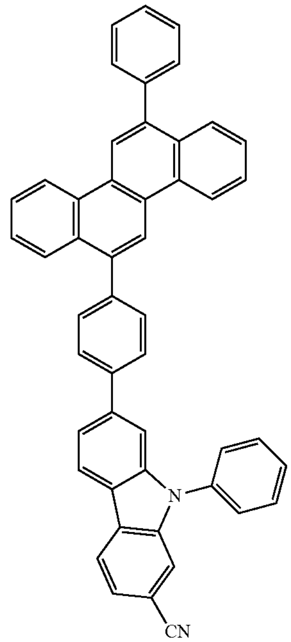
48
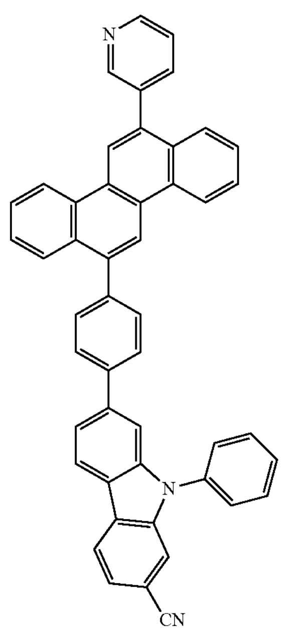

-continued
49
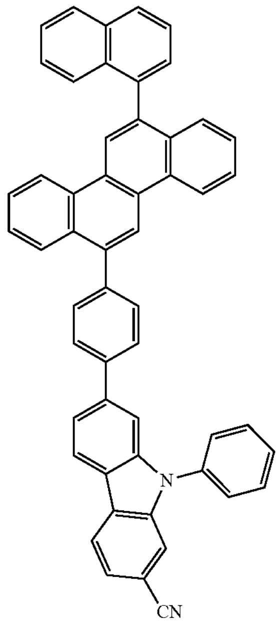
50
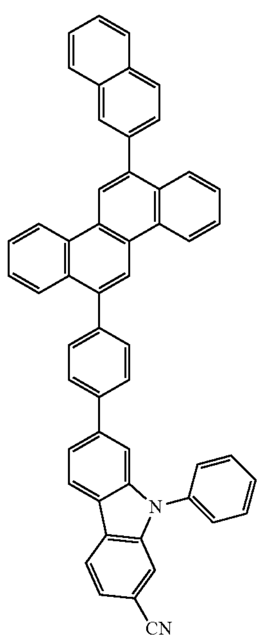
-continued
51
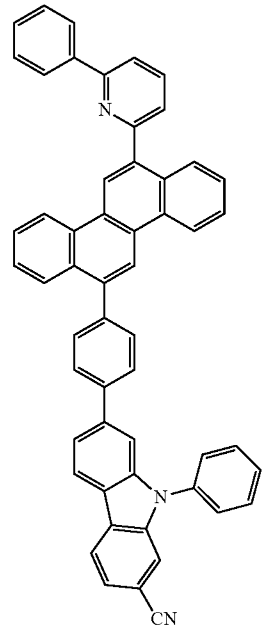
52
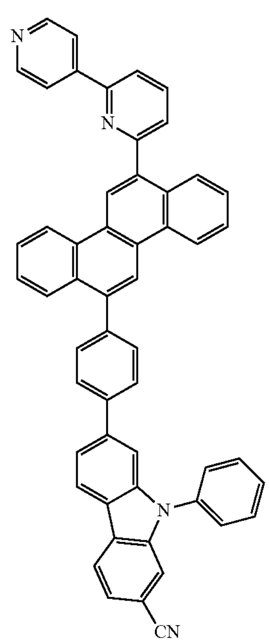

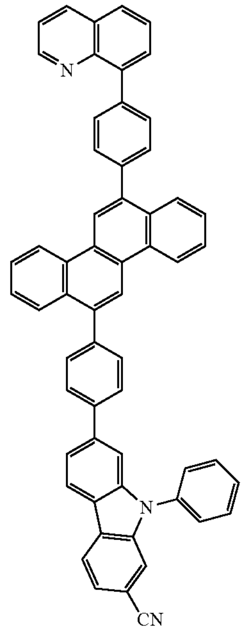
53
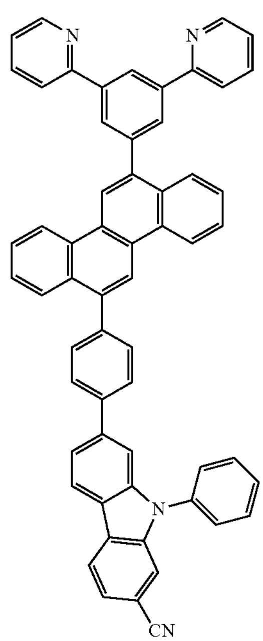
54
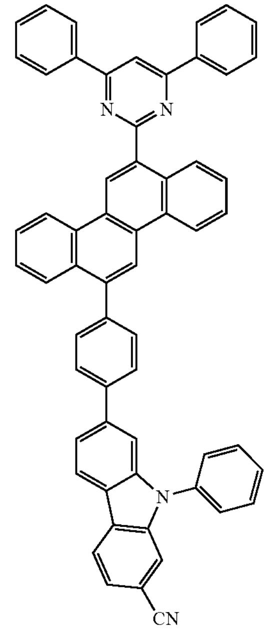
55
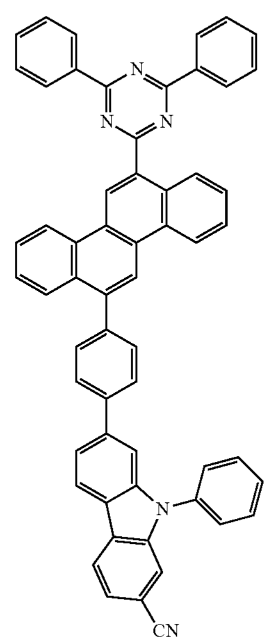
56

-continued
57
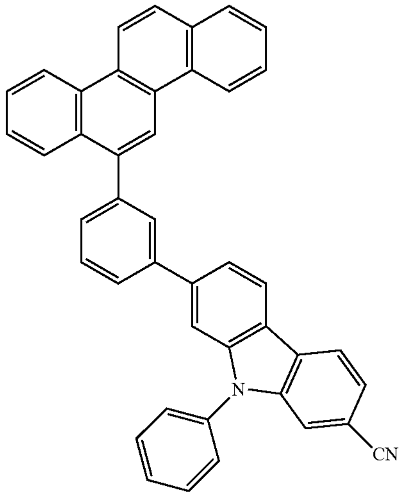
58
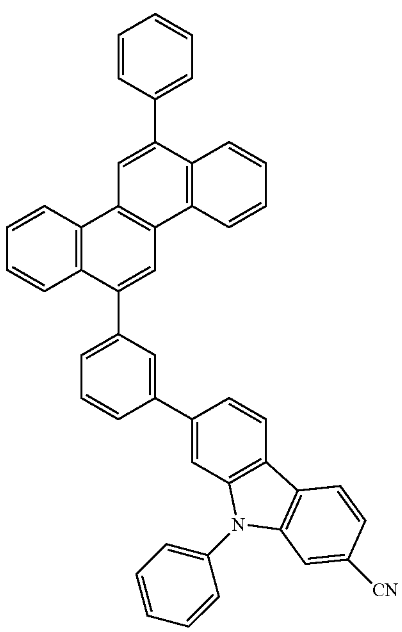
-continued
59
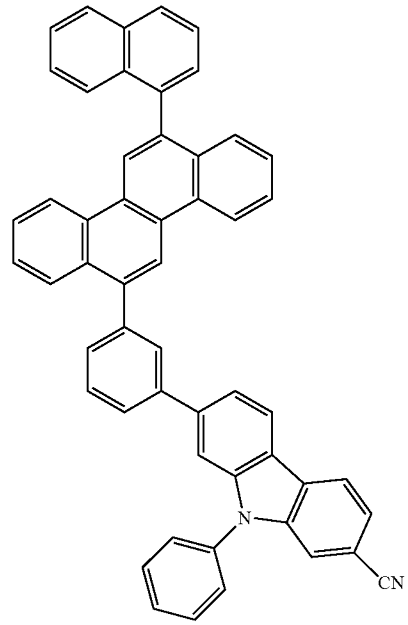
60
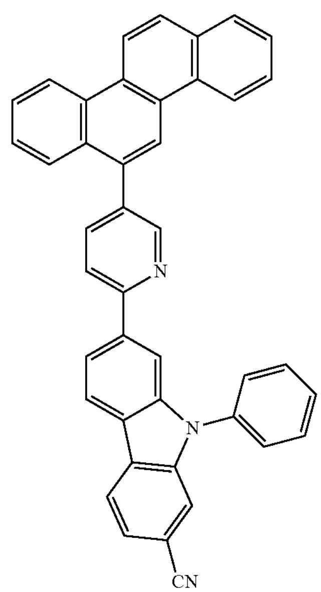

-continued
61
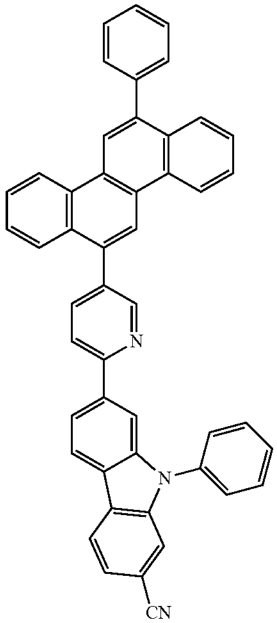
63
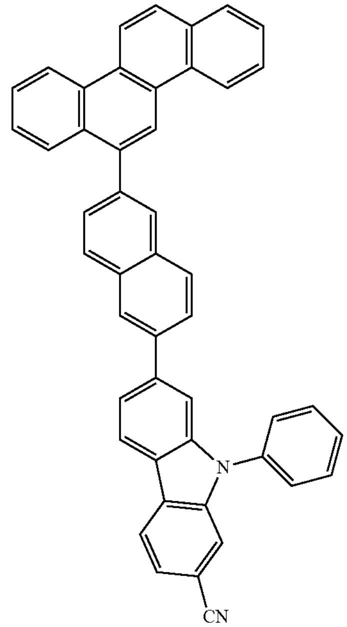
62
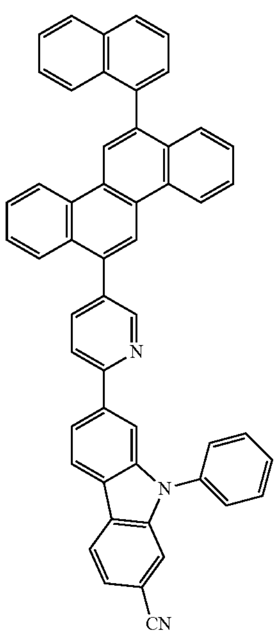
64
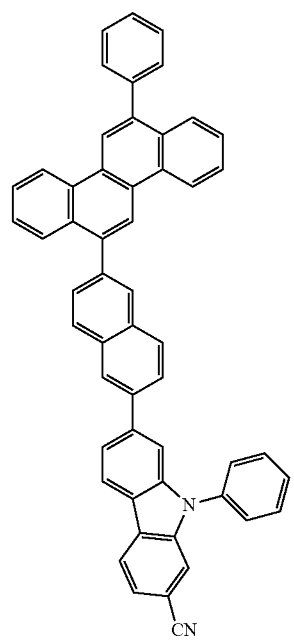

-continued
65
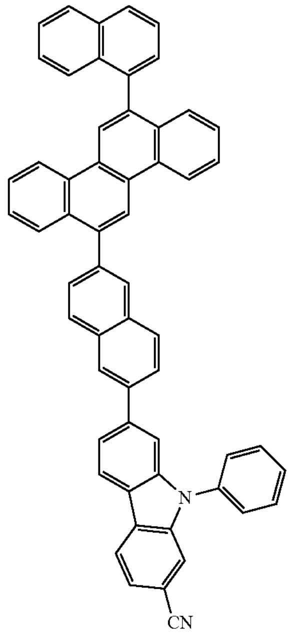
66
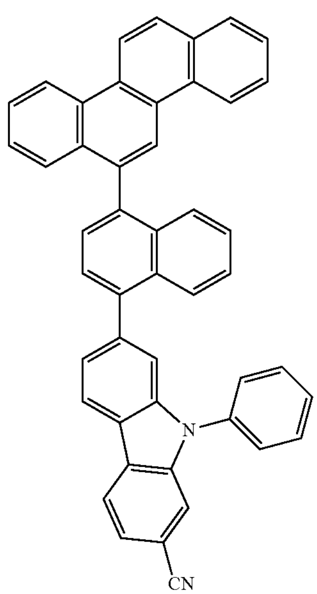
-continued
67
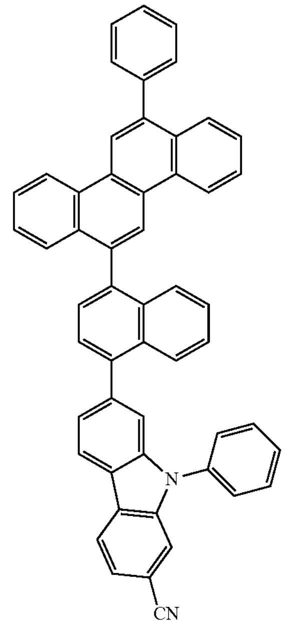
68
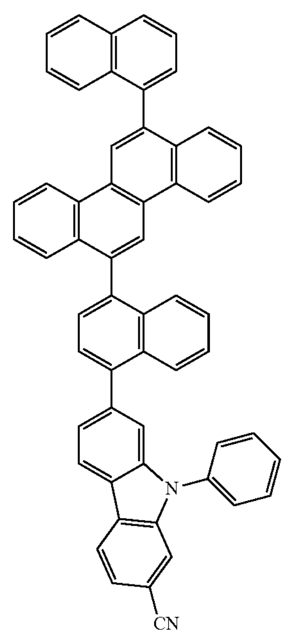

-continued
69
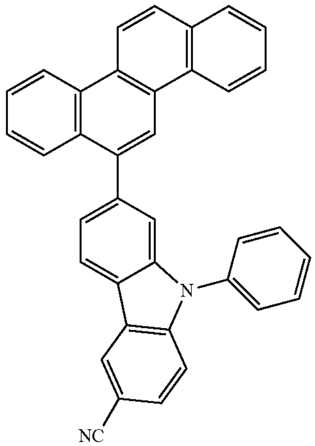
70
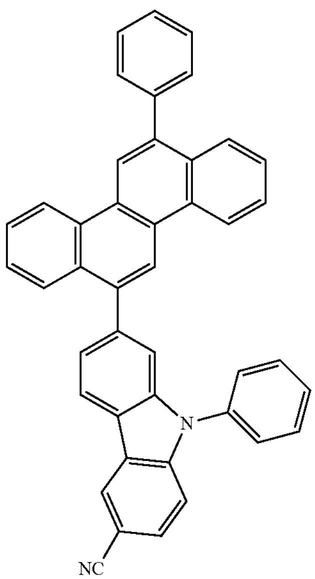
71
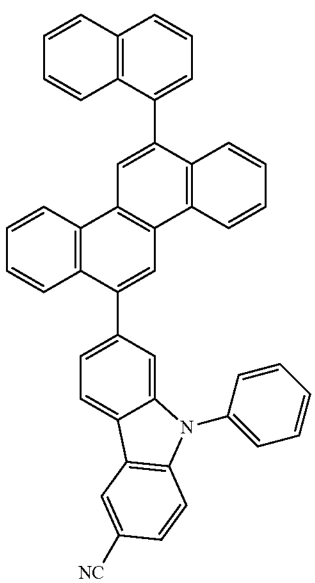
-continued
72
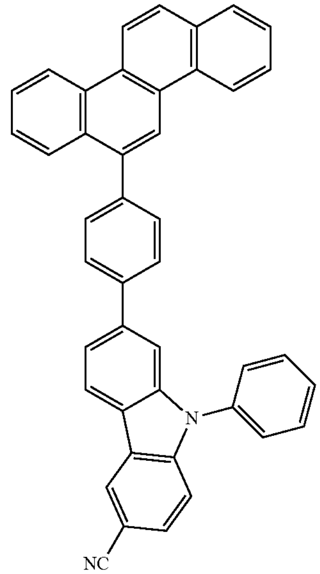
73
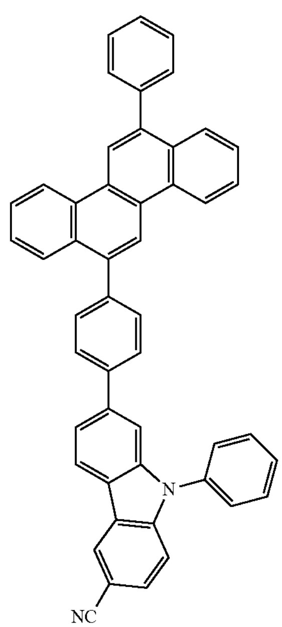

-continued
74
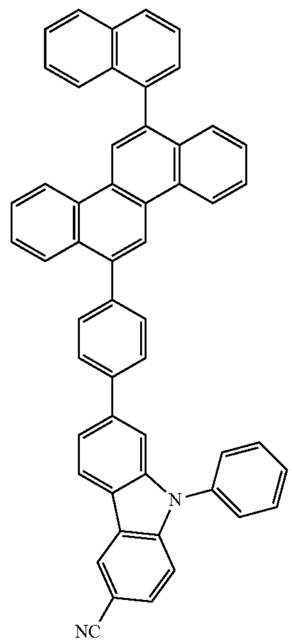
75
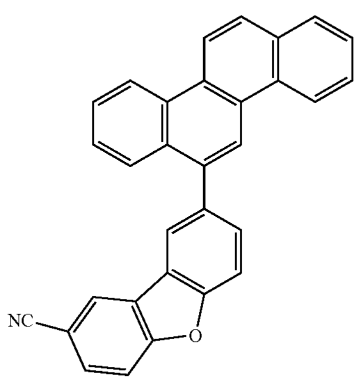
76
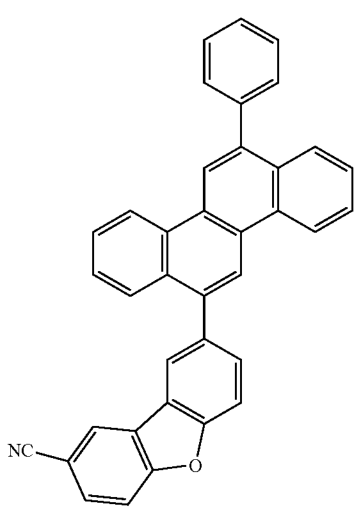
-continued
77
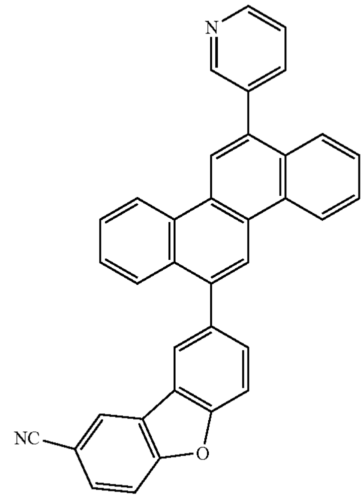
78
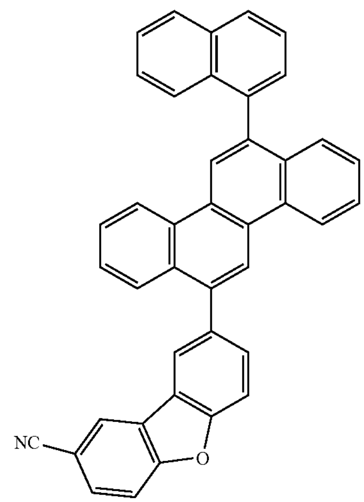
79
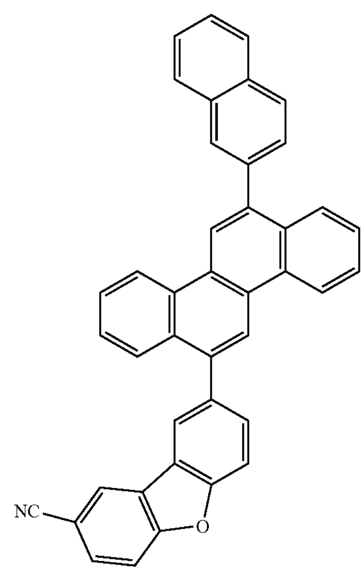

-continued
80
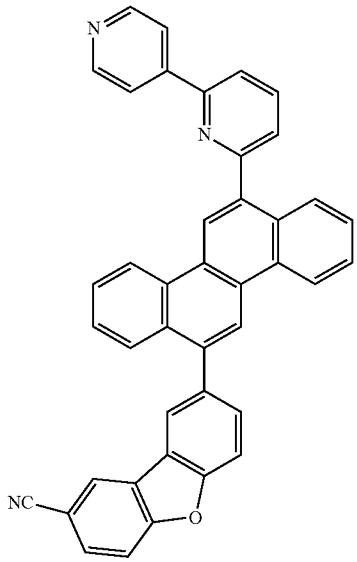
81
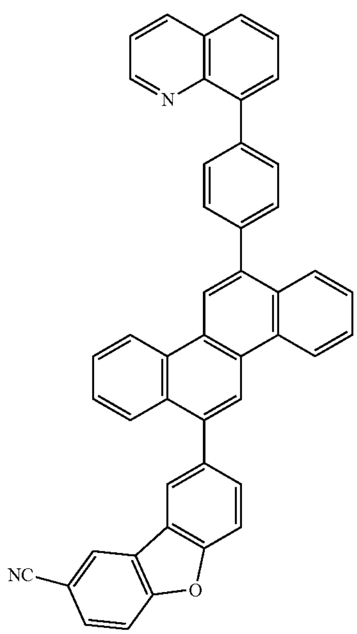
-continued
82
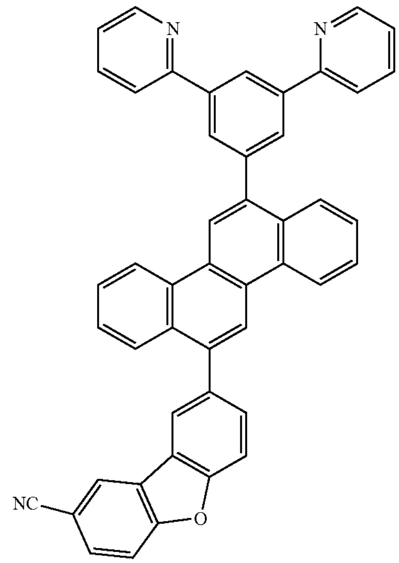
83
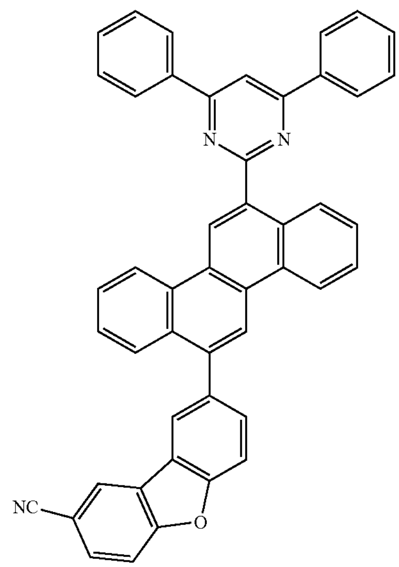
84
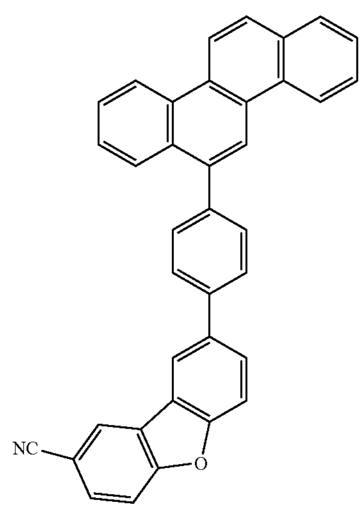

-continued
85
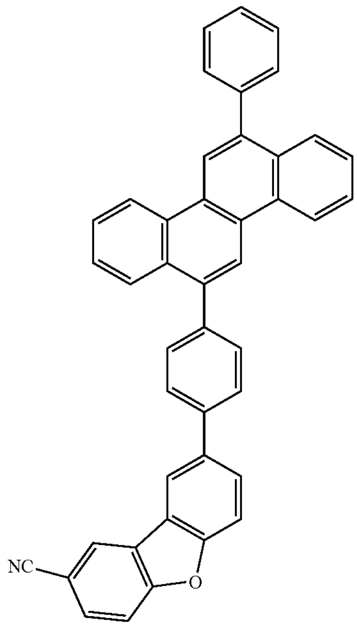
86
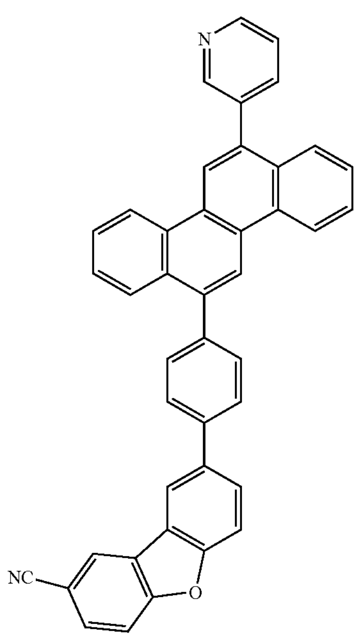
-continued
87
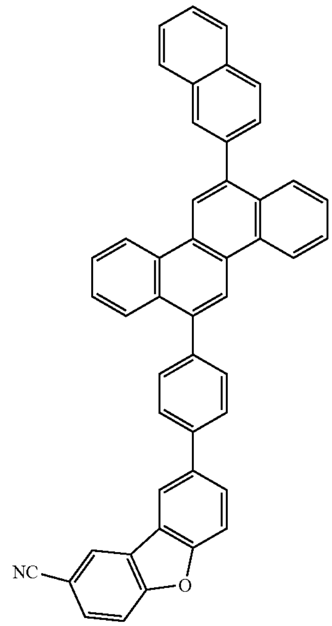
88
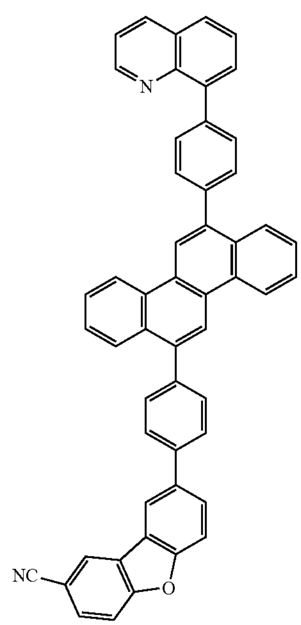

-continued
89
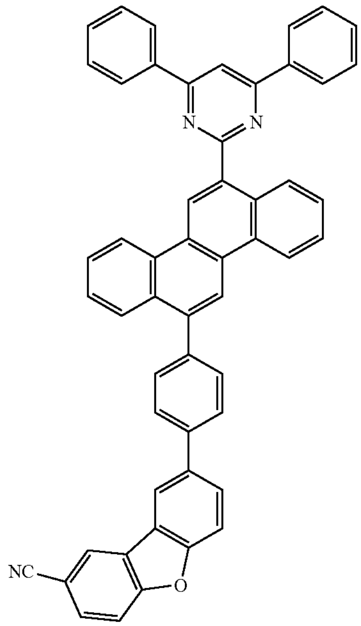
90
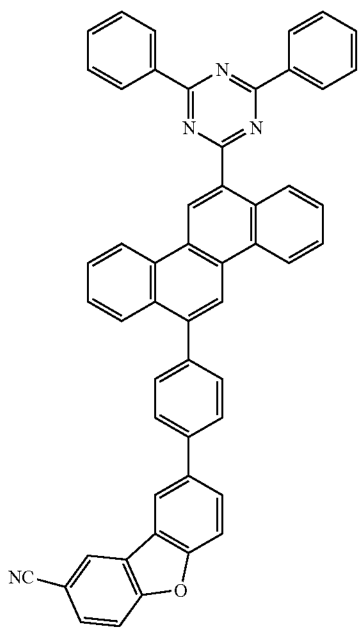
91
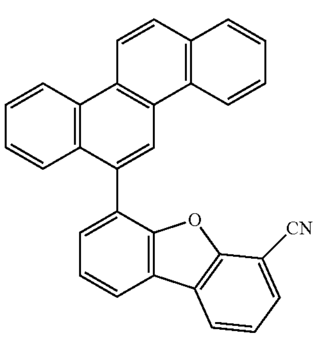
-continued
92
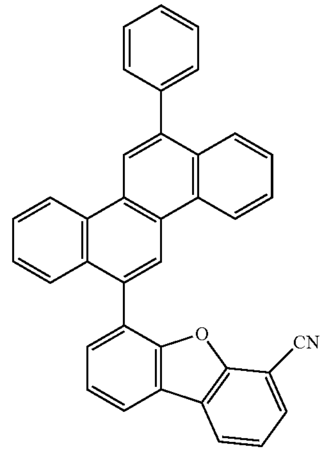
93
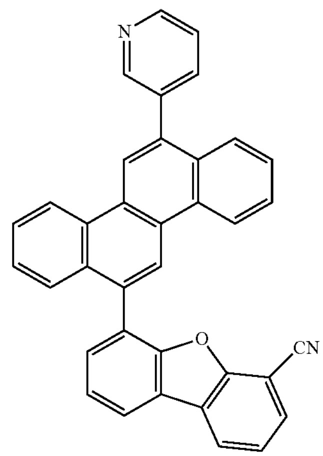
94
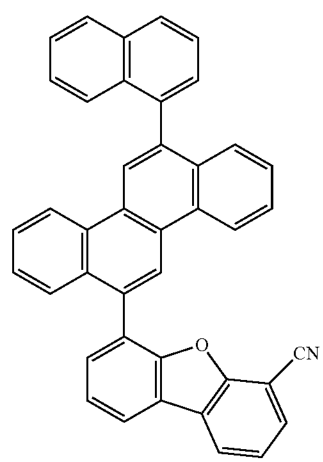

95
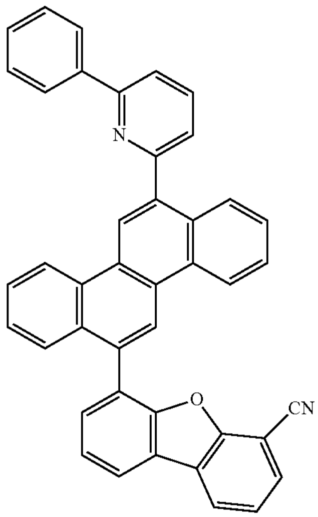
96
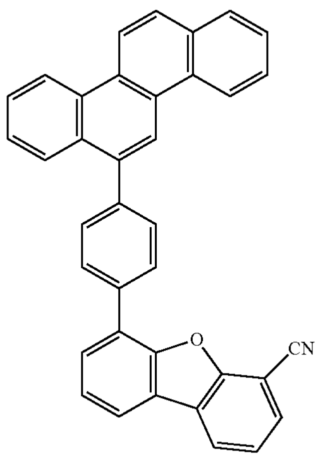
97
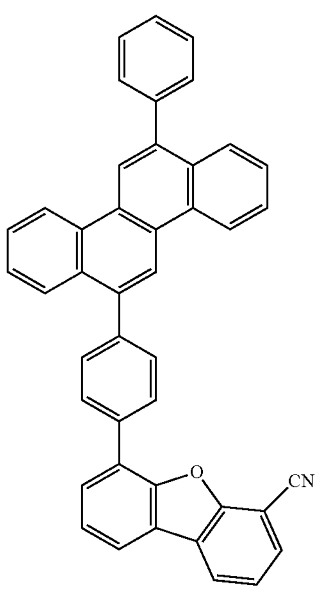
98
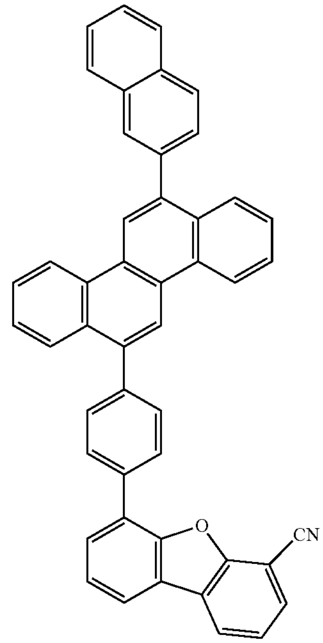
99
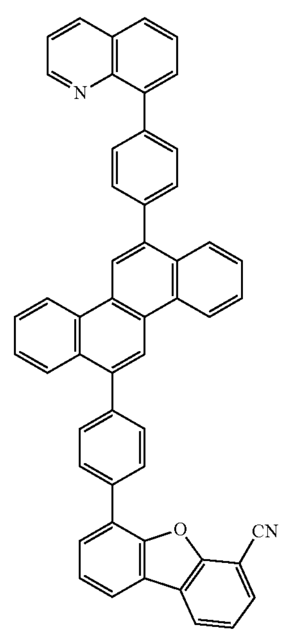

-continued
100
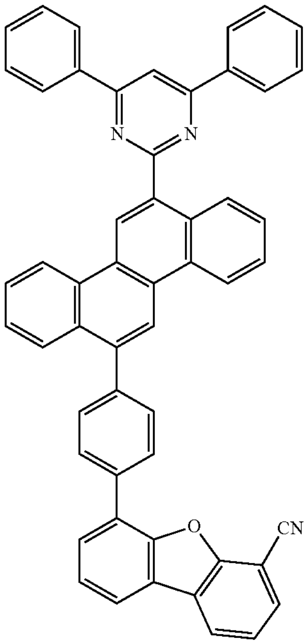
101
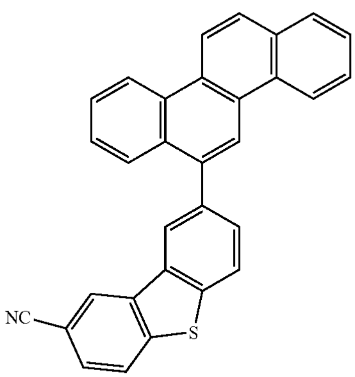
102
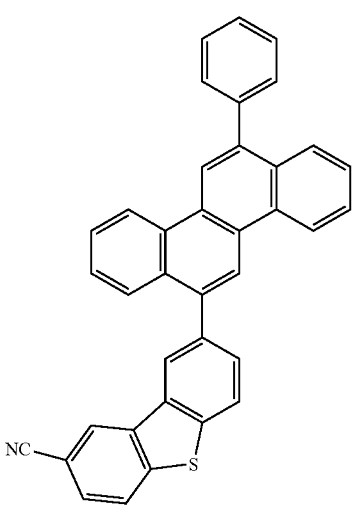
-continued
103
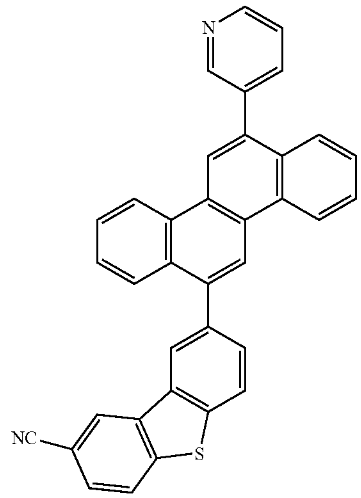
104
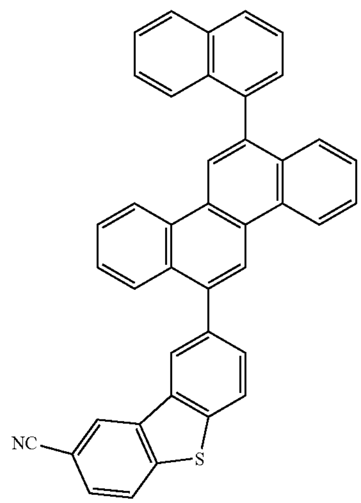
105
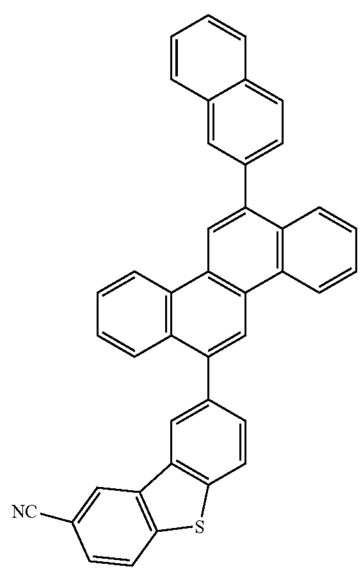

-continued
106
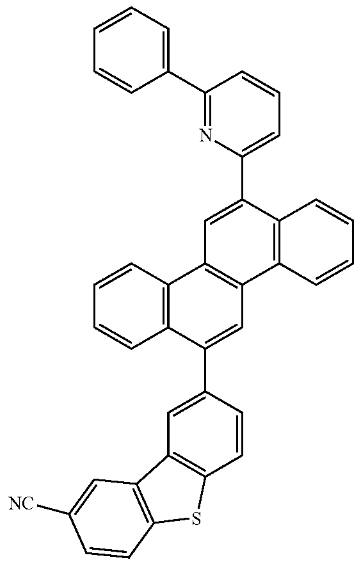
107
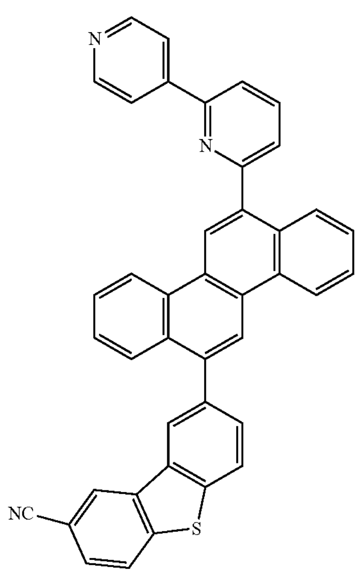
-continued
108
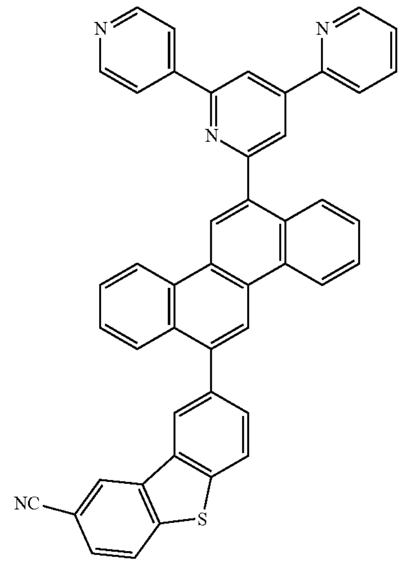
109
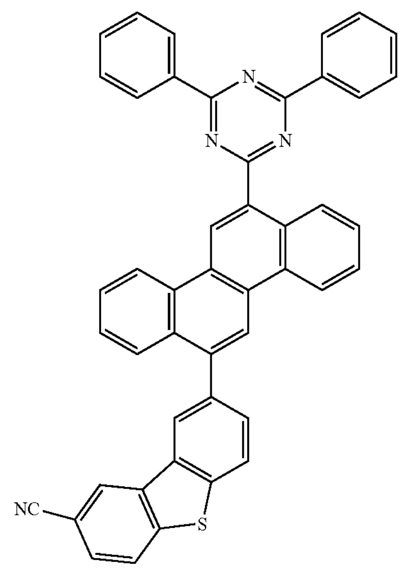
110
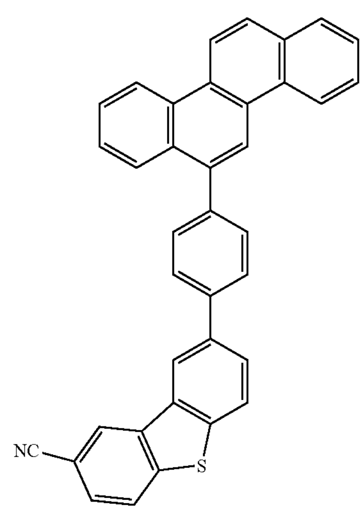

-continued
111
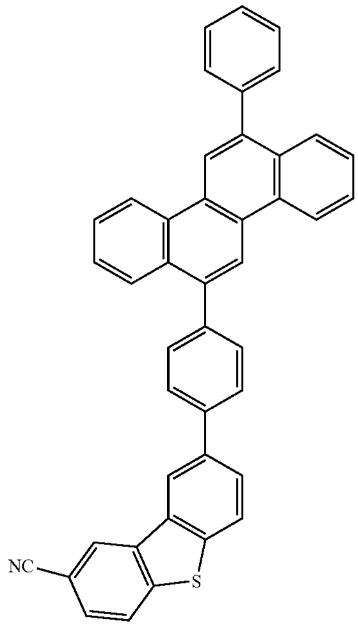
112
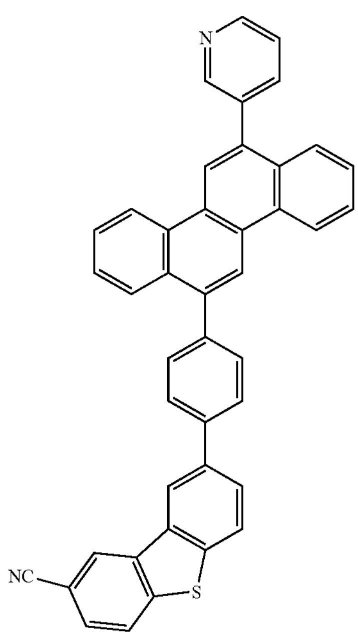
-continued
113
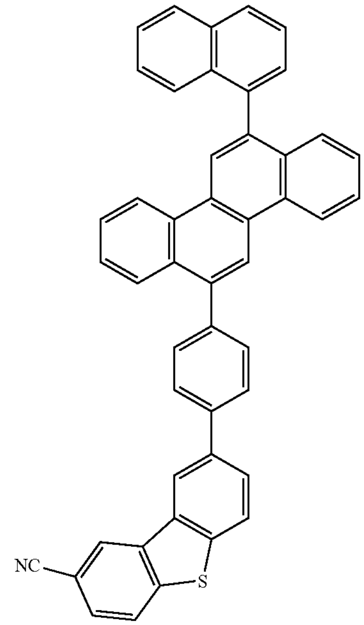
114
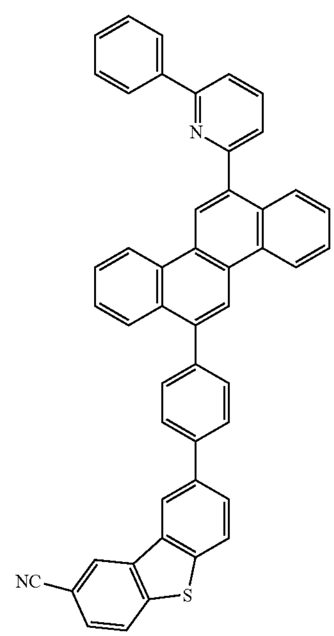

-continued

115

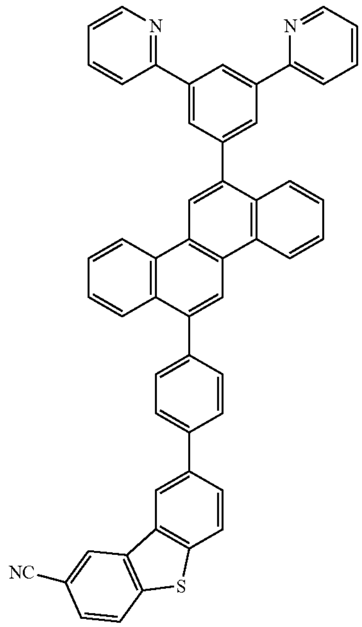

116

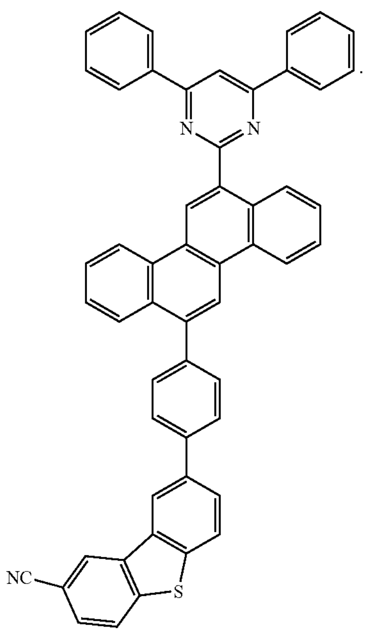

16. An organic light-emitting device: comprising:

a first electrode;

a second electrode facing the first electrode; and an organic layer that between the first and second electrodes, wherein:

the organic layer includes an emission layer, and the organic layer includes at least one condensed cyclic compound as claimed in claim 1.

17. The organic light-emitting device as claimed in claim 16, wherein the organic layer further includes:

a hole transport region between the first electrode and the emission layer, the hole transport region including at least one of a hole injection layer, a hole transport layer, a buffer layer, or an electron blocking layer, and an electron transport region between the emission layer and the second electrode, the electron transport region including at least one of a hole blocking layer, an electron transport layer, or an electron injection layer.

18. The organic light-emitting device as claimed in claim 17, wherein the electron transport region includes the at least one condensed cyclic compound represented by Formula 1.

19. The organic light-emitting device as claimed in claim 18, wherein the electron transport region includes the electron transport layer, the electron transport layer including the at least one condensed cyclic compound represented by Formula 1.

20. The organic light-emitting device as claimed in claim 17, wherein the hole transport region includes at least one of a compound represented by Formulae 201A and 202A below:

<Formula 201A>

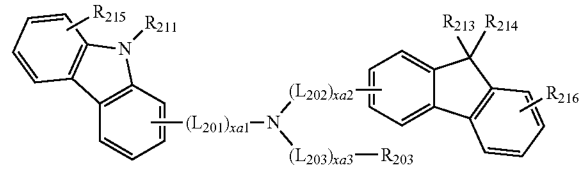

<Formula 202A>

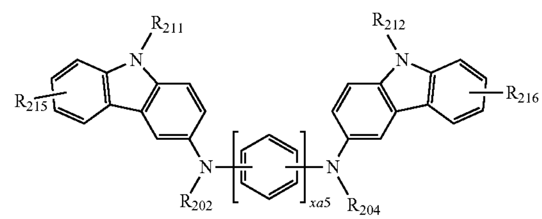

wherein in Formulae 201A and 202A, $L_{201}$ to $L_{203}$ are each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 are each independently 0 or 1;

$R_{203}$, $R_{211}$, and $R_{212}$ are each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ are each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and $R_{215}$ and $R_{216}$ are each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a Spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 is 1 or 2.

* * * * *